(12) United States Patent
Yamaguchi et al.

(10) Patent No.: US 10,136,570 B2
(45) Date of Patent: Nov. 20, 2018

(54) MOUNTED SUBSTRATE, MOUNTED-SUBSTRATE PRODUCTION METHOD, AND MOUNTED-SUBSTRATE PRODUCTION DEVICE

(71) Applicant: Sharp Kabushiki Kaisha, Osaka (JP)

(72) Inventors: Katsuhiro Yamaguchi, Osaka (JP); Nobuhiro Nakata, Osaka (JP); Yukinori Masuda, Osaka (JP); Tomoki Takahara, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 15/314,914

(22) PCT Filed: May 22, 2015

(86) PCT No.: PCT/JP2015/064699
§ 371 (c)(1),
(2) Date: Nov. 29, 2016

(87) PCT Pub. No.: WO2015/182496
PCT Pub. Date: Dec. 3, 2015

(65) Prior Publication Data
US 2017/0196133 A1    Jul. 6, 2017

(30) Foreign Application Priority Data
May 30, 2014    (JP) .................. 2014-113226

(51) Int. Cl.
*H05K 1/11*    (2006.01)
*H05K 13/04*    (2006.01)
(Continued)

(52) U.S. Cl.
CPC ..... *H05K 13/0469* (2013.01); *G02F 1/13454* (2013.01); *H01L 24/03* (2013.01);
(Continued)

(58) Field of Classification Search
CPC . H05K 13/0469; G02F 1/13454; H01L 24/03; H01L 24/29; H01L 24/75
(Continued)

(56) References Cited

U.S. PATENT DOCUMENTS

2007/0171354 A1    7/2007    Yuge
2012/0327319 A1*   12/2012   Saitoh ............... G02F 1/1345
                                                        349/33
2015/0279792 A1    10/2015   Matsui et al.

FOREIGN PATENT DOCUMENTS

| JP | 05-144878 A | 6/1993 |
|---|---|---|
| JP | 4997584 B2 | 8/2012 |
| WO | 2014/057908 A1 | 4/2014 |

OTHER PUBLICATIONS

Machine Translation of Japanese Patent Publication No. 05-144878 (Okusa Takashi, Nov. 6, 1993).*

* cited by examiner

*Primary Examiner* — Tremesha S Willis
(74) *Attorney, Agent, or Firm* — Chen Yoshimura LLP

(57) ABSTRACT

An array substrate includes a driver, a glass substrate having a driver mounting section where the driver is mounted, an anisotropic conductive material that is interposed between the driver and driver mounting section so as to electrically connect both and that at least includes a binder made of a thermosetting resin and conductive particles in the binder, and a heat supply part provided on at least the driver mounting section of the glass substrate for supplying heat to the anisotropic conductive material.

12 Claims, 26 Drawing Sheets

(51) Int. Cl.
*H01L 23/00* (2006.01)
*H05K 3/00* (2006.01)
*G02F 1/1345* (2006.01)

(52) U.S. Cl.
CPC .............. H01L 24/29 (2013.01); H01L 24/75 (2013.01); H01L 24/81 (2013.01); H01L 24/83 (2013.01); H01L 24/92 (2013.01); H05K 1/111 (2013.01); H05K 3/0055 (2013.01); *H01L 24/13* (2013.01); *H01L 24/14* (2013.01); *H01L 24/16* (2013.01); *H01L 24/27* (2013.01); *H01L 24/32* (2013.01); *H01L 2224/13144* (2013.01); *H01L 2224/1403* (2013.01); *H01L 2224/16227* (2013.01); *H01L 2224/27334* (2013.01); *H01L 2224/2929* (2013.01); *H01L 2224/2939* (2013.01); *H01L 2224/2949* (2013.01); *H01L 2224/29294* (2013.01); *H01L 2224/29355* (2013.01); *H01L 2224/29444* (2013.01); *H01L 2224/32225* (2013.01); *H01L 2224/73204* (2013.01); *H01L 2224/7525* (2013.01); *H01L 2224/75252* (2013.01); *H01L 2224/75301* (2013.01); *H01L 2224/75312* (2013.01); *H01L 2224/75744* (2013.01); *H01L 2224/75981* (2013.01); *H01L 2224/75985* (2013.01); *H01L 2224/81048* (2013.01); *H01L 2224/81191* (2013.01); *H01L 2224/81203* (2013.01); *H01L 2224/81204* (2013.01); *H01L 2224/81234* (2013.01); *H01L 2224/81424* (2013.01); *H01L 2224/81447* (2013.01); *H01L 2224/81466* (2013.01); *H01L 2224/81903* (2013.01); *H01L 2224/83048* (2013.01); *H01L 2224/83192* (2013.01); *H01L 2224/83203* (2013.01); *H01L 2224/83204* (2013.01); *H01L 2224/83234* (2013.01); *H01L 2224/83851* (2013.01); *H01L 2224/83862* (2013.01); *H01L 2224/9211* (2013.01); *H01L 2924/10161* (2013.01); *H01L 2924/10162* (2013.01); *H01L 2924/1579* (2013.01); *H01L 2924/15788* (2013.01)

(58) Field of Classification Search
USPC .......................... 174/255, 250, 251, 256–261
See application file for complete search history.

FIG. 15

MOUNTED SUBSTRATE, MOUNTED-SUBSTRATE PRODUCTION METHOD, AND MOUNTED-SUBSTRATE PRODUCTION DEVICE

TECHNICAL FIELD

The present invention relates to a mounting substrate, a method of manufacturing a mounting substrate, and a mounting substrate manufacturing device.

BACKGROUND ART

Display devices equipped with display panels such as a liquid crystal display panel are used in portable electronic devices such as mobile phones, smartphones, and notebook computers. These types of display devices each have a display panel that has a display unit for performing display, and a driver that drives the display panel by supplying output signals to the display unit that have been generated by processing input signals from a signal supply source. In display devices that are categorized as small-to-medium size, such as those above, it is preferable that the method of mounting the driver involve COG (chip on glass) mounting technology for directly mounting the driver on the area outside the display area of the display panel. One known example of this type of display device is that disclosed in Patent Document 1 below.

In Patent Document 1, a heat dissipating pattern made of a material having superior thermal conductivity as compared to glass substrates that form a portion of a liquid crystal panel, which is the display device, is formed near the driver, and this heat dissipating pattern inhibits adverse effects caused by heat generation of the driver, such as characteristic degradation of the liquid crystal panel following uneven heat distribution in the liquid crystal panel.

RELATED ART DOCUMENT

Patent Document

Patent Document 1: Japanese Patent No. 4997584

Problems to be Solved by the Invention

However, the driver is mounted between the glass substrates via an anisotropic conductive material composed of conductive particles that are dispersion compounded in a binder made of a thermosetting resin. When mounting this driver, a driver mounting device pressurizes the driver while heating the driver. However, in conventional mounting by driver mounting devices, the pressurizing and heating of the driver were performed at the same time, which risks pressurizing force being applied to the conductive particles before the binder of the anisotropic conductive material is hardened, and which thus could cause connection defects. If the binder is rapidly heated in order to avoid this problem, there is a risk that performance could be degraded due to overheating of the peripheral members of the liquid crystal panel around the driver (such as the polarizing plates).

SUMMARY OF THE INVENTION

The present invention was made in view of the above-mentioned situation and aims at improving a connection state between a component and a component mounting area and at inhibiting performance degradation caused by heat.

Means for Solving the Problems

A mounting substrate of the present invention includes a component; a substrate having a component mounting section where the component is mounted; an anisotropic conductive material interposed between and electrically connecting the component and the component mounting section of the substrate, the anisotropic conductive material including at least a binder made of a thermosetting resin and conductive particles contained in the binder; and a heat supply pattern made of a heat conductive material and provided on the substrate in at least the component mounting section of the substrate, the heat supply pattern supplying heat to the anisotropic conductive material.

With this configuration, during mounting of the component on the component mounting section of the substrate, the anisotropic conductive material is interposed between the component mounting section and the component, and in this state the binder of the anisotropic conductive material is thermoset and pressure is applied to the component. This mounts the component on the component mounting section and electrically connects both via the anisotropic conductive material.

The component mounting section has the heat supply part for supplying heat to the anisotropic conductive material, and thus there is a higher degree of freedom regarding the timing at which heat is supplied to the anisotropic conductive material as compared to conventional cases in which heat is supplied to the anisotropic conductive material and pressure is applied to the component at the same time. Accordingly, during mounting of the component, it is possible to facilitate thermosetting of the binder by the heat supply part supplying heat to the anisotropic conductive material prior to pressure being applied to the component, for example. Due to this, during pressurizing of the component, the binder has already been hardened to a certain extent, and the pressure exerted on the conductive particles can also be received by the binder, thus preventing the pressure from being concentrated only on the conductive particles, and thereby forming a favorable connection between the component and the component mounting section via the conductive particles. Moreover, a higher degree of freedom regarding the timing at which heat is supplied to the anisotropic conductive material makes it unnecessary to rapidly supply heat in order to harden the binder, which makes the substrate less susceptible to being overheated and inhibits the occurrence of performance degradation caused by such heat.

The following configurations are preferred aspects of the mounting substrate of the present invention.

(1) The heat supply pattern includes: a heated section heated from outside and provided on a component non-overlapping section of the substrate not overlapping the component in a plan view; and a heat transfer section transferring heat from the heated section to the anisotropic conductive material and provided on at least the component mounting section of the substrate, which is a portion of the substrate overlapping the component in a plan view. With this configuration, when the heated section is heated from outside, the heat is transferred to the anisotropic conductive material via the heat transfer section, thereby facilitating thermosetting of the binder. The heated section being disposed in the component non-overlapping section of the substrate not overlapping the component in a plan view makes it harder for the component to block the input of heat from outside. By the heat transfer section being disposed at least on the component mounting section, which is a portion of the substrate overlapping the component in a plan view, it is possible to efficiently supply heat to the anisotropic conductive material.

(2) The heat transfer section of the heat supply pattern extends across the component mounting section, whereas the heated section of the heat supply pattern is provided in a pair respectively continuing from both ends of the heat transfer section in an extension direction of the heat transfer section. With this configuration, by heating the respective pair of heated sections continuing from both ends of the heat transfer section that goes across the component mounting section, heat is transferred towards the center of the heat transfer section from both ends of the heat transfer section in the extension direction thereof. This makes the supply of heat to the anisotropic conductive material less susceptible to being uneven in the extension direction of the heat transfer section, which in turn makes connection defects less susceptible to occurring between the component and the component mounting section.

(3) An optical member is attached to the substrate along the surface of the substrate and adjacent to the component mounting section in a direction orthogonal to an extension direction of the heat transfer section extending across the component mounting section of the substrate, and the heat transfer section of the heat supply pattern is drawn out from the component mounting section towards the component non-overlapping section opposite to the optical member in the direction orthogonal to the extension direction of the heat transfer section, whereas the heated section of the heat supply pattern continues from a drawn-out end of the heat transfer section and is arranged on a side on the driver non-overlapping section opposite to the optical member with respect to the driver mounting section in the direction orthogonal to the extension direction. With this configuration, the heated section continues from the drawn-out end of the heat transfer section that is drawn out from the component mounting section and is arranged on the component non-overlapping section on a side of the component mounting section opposite to the optical member in the direction orthogonal to the extension direction of the heat transfer section that goes across the surface of the substrate and across the component mounting section; thus, there can be a sufficient distance ensured between the heated section and the optical member, and this makes heat from the heated section that has been heated less susceptible to being transferred to the optical member via the substrate. Accordingly, the optical performance of the optical member is not susceptible to degradation caused by the heat for thermosetting the binder of the anisotropic conductive material.

(4) The heat supply pattern includes: a voltage receiving pattern receiving a voltage from outside and provided on a component non-overlapping section of the substrate not overlapping the component in a plan view; and a heat generating pattern generating heat based on the voltage received by the voltage receiving pattern and provided on at least the component mounting section of the substrate, which is a portion of the substrate overlapping the component in a plan view. With this configuration, when the voltage receiving part receives a voltage, heat is generated by the heat generating part, and thus this heat can be used for thermosetting of the binder of the anisotropic conductive material.

(5) The component mounting section includes a first terminal group including a plurality of first terminals arranged side-by-side, and a second terminal group including a plurality of second terminals arranged side-by-side parallel to an arrangement direction of the plurality of first terminals and having a total area greater than a total area of the first terminal group, and the heat supply pattern includes at least a pattern closer to the second terminal group than the first terminal group. In the second terminal group, which has a larger total area than the first terminal group, there is a large amount of the binder of the anisotropic conductive material interposed between the plurality of second terminals and component, and thus there tends to be a greater amount of heat required to harden the binder as compared to the first terminal group side. In this regard, as described above, the heat supply part includes at least the units closer to the second terminal group than the first terminal group, which further facilitates favorable thermosetting of the binder of the anisotropic conductive material near the second terminal group. This allows favorable thermosetting of the binder interposed between the plurality of second terminals and the component, which makes it possible to have a good connection between the second terminal group and the component.

(6) The heated supply pattern at least includes an inner heat supply pattern that passes between the second terminal group and the first terminal group on an inner side of the second terminal group, and an outer heat supply pattern that sandwiches the second terminal group on an outer side of the second terminal group with the inner heat supply pattern. With this configuration, the second terminal group is sandwiched between the inner heat supply part on the inner side of the second terminal group and the outer heat supply part on the outer side of the second terminal group, and thus thermosetting of the binder of the anisotropic conductive material is even more favorably facilitated near the second terminal group. This allows favorable thermosetting of the binder interposed between the plurality of second terminals and the component, which makes it possible to have a more favorable connection between the second terminal group and the component.

(7) The first terminal group is an input terminal group receiving input signals for the component, whereas the second terminal group is an output terminal group receiving output signals from the component. With this configuration, the total area of the output terminal group is greater than the total area of the input terminal group, which is suitable for outputting more output signals. When the mounting substrate is used in a display device, for example, this is suitable for making the display device high definition.

(8) The component mounting section includes input terminals receiving input signals for the component, and output terminals separated from the input terminals and receiving output signals from the component, and the heat supply pattern passes between at least the input terminals and the output terminals on the component mounted section. With this configuration, the binder of the anisotropic conductive material interposed between the input terminals and the component and the binder interposed between the output terminals and the component can be favorably thermoset with the heat supplied from the heat supply part. This allows a favorable connection to the component for both the input terminals and the output terminals.

(9) The component mounting section includes input terminals receiving input signals for the component, and output terminals separated from the input terminals and receiving output signals from the component, and the heat supply pattern at least includes an input terminal-side heat supply pattern disposed relatively near the input terminals, and an output terminal-side heat supply pattern disposed relatively near the output terminals. With this configuration, the input terminal-side heat supply part and the output terminal-side heat supply part at least included in the heat supply part make it possible to supply heat to the area of the anisotropic conductive material near the input terminals and the area of the anisotropic conductive material near the output terminals at different times. This makes it possible to thermoset the binder of the anisotropic conductive material interposed between the input terminals and the component and the binder interposed between the output terminals and the component each at suitable times, which allows for favorable connections to the component for both the input terminals and the output terminals.

(10) The heat supply pattern is made of a material having a higher thermal conductivity than a thermal conductivity of the substrate. With this configuration, it is possible for the heat supply part made of the material having a higher thermal conductivity than that of the substrate to efficiently supply heat to the anisotropic conductive material, which allows for more favorable facilitation of the thermosetting of the binder.

(11) The component mounting section includes input terminals receiving input signals for the component, and output terminals receiving output signals from the component, and the heat supply pattern is made of a same material as the input terminals and the output terminals. With this configuration, during the manufacturing of the mounting substrate, the heat supply part can be provided in the step in which the input terminals and output terminals are provided on the substrate. There are no special steps required to provide the heat supply part, and thus it is possible to reduce manufacturing costs.

Next, in order to solve the above-mentioned problems, a method of manufacturing a mounting substrate of the present invention includes: providing a heat supply pattern on a substrate in at least a component mounting section of the substrate where a component is mounted, the substrate having a heat supply pattern made of a heat conductive material thereon in at least the component mounting section of the substrate; applying on the component mounted section an anisotropic conductive material that includes at least a binder made of a thermosetting resin and conductive particles contained in the binder; positioning the component in the component mounting section of the substrate; thereafter, supplying heat to the heat supply pattern of the substrate so as to supply the heat to the anisotropic conductive material; and applying pressure to the component via the substrate to fix the component on the component mounting section of the substrate via the anisotropic conductive material.

With this method of manufacturing the mounting substrate, the heat supply part installation step provides the heat supply part on at least the component mounting section of the substrate where the driver component is mounted, and the anisotropic conductive material arrangement step provides the anisotropic conductive material on the component mounting section. Then, when the component has been arranged on the component mounting section via the component arrangement step, heat is supplied to the heating unit in the heat supply step. The heat supply step is independent of the pressurizing step for applying pressure to the component via the substrate, and thus there is a high degree of freedom regarding the timing at which heat is supplied to the anisotropic conductive material. Accordingly, it is possible to facilitate thermosetting of the binder such as by performing the heat supply step before the pressurizing step, for example. Due to this, during pressurizing, the binder has already been hardened to a certain extent, and the pressure exerted on the conductive particles can also be received by the binder, thus preventing the pressure from being concentrated only on the conductive particles, and thereby forming a favorable connection between component and the component mounting section via the conductive particles. Moreover, a higher degree of freedom regarding the timing at which heat is supplied to the anisotropic conductive material makes it unnecessary to rapidly supply heat in order to harden the binder, which makes the substrate less susceptible to being overheated and inhibits the occurrence of performance degradation caused by such heat.

Next, in order to solve the above-mentioned problems, a first mounting substrate manufacturing device of the present invention includes: a substrate support section supporting from below, a component mounting section of a substrate where a component is mounted, the substrate having a heat supply pattern made of a heat conductive material on a top surface thereof in at least the component mounting section of the substrate; a pressurizing unit arranged on a side of the substrate opposite to the substrate support section and applying pressure to the component that is placed on an anisotropic conductive material that includes at least a binder made of a thermosetting resin and conductive particles contained in the binder and that is disposed between the component and the substrate; and a heating activation unit that contacts and heats the heat supply pattern so as to supply heat to the anisotropic conductive material.

With this manufacturing device for the mounting substrate, when the component is to be mounted on the component mounting section of the substrate, the substrate support unit supports the component mounting section of the substrate where the component is mounted, and in this state the heating unit heats the heat supply part in order to thermoset the binder of the anisotropic conductive material and the pressurizing unit applies pressure to the component interposed between the component mounting section and the pressurizing unit. This mounts the component on the component mounting section and electrically connects both via the anisotropic conductive material.

The heating unit that heats the heat supply part is provided separately from the substrate support unit and the pressurizing unit, and thus there is a greater degree of freedom regarding the timing at which heat is supplied to the anisotropic conductive material as compared to conventional cases where heat is supplied to the anisotropic conductive material and pressure is applied to the component at the same time. Accordingly, during mounting of the component, it is possible to facilitate thermosetting of the binder by the heating unit heating the heat supply part so as to supply heat to the anisotropic conductive material prior to pressure being applied to the component by the pressurizing unit, for example. Due to this, during pressurizing of the component by the pressurizing unit, the binder has already been hardened to a certain extent, and the pressure exerted on the conductive particles can also be received by the binder, thus preventing the pressure from being concentrated only on the conductive particles, and thereby forming a favorable connection between component and the component mounting section via the conductive particles. Moreover, a higher degree of freedom regarding the timing at which heat is supplied to the anisotropic conductive material makes it unnecessary to rapidly supply heat in order to harden the binder, which makes the substrate less susceptible to being overheated and inhibits the occurrence of performance degradation caused by such heat.

Furthermore, to solve the above-mentioned problems, a second mounting substrate manufacturing device of the present invention includes: a substrate support section supporting a component mounting section of a substrate where a component is mounted; a pressurizing unit arranged on a side of the substrate opposite to the substrate support section and applying pressure to the component on an anisotropic conductive material that includes at least a binder made of a thermosetting resin and conductive particles contained in the binder and that is disposed between the component and the substrate; and a voltage receiving unit provided on at least the component mounting section of the substrate that heats a heat supply part so as to supply heat to the anisotropic conductive material.

With this manufacturing device for the mounting substrate, when the component is to be mounted on the component mounting section of the substrate, the substrate support unit supports the component mounting section of the substrate where the component is mounted, and in this state the voltage receiving part inputs voltage to the heat supply part in order to transfer heat to the binder of the anisotropic conductive material from the heat supply part so as to facilitate thermosetting of the binder, and the pressurizing unit applies pressure to the component interposed between the component mounting section and the pressurizing unit. This mounts the component on the component mounting section and electrically connects both via the anisotropic conductive material.

The voltage receiving part that inputs voltage to the heat supply part is provided separately from the substrate support unit and the pressurizing unit, and thus there is a greater degree of freedom regarding the timing at which heat is supplied to the anisotropic conductive material as compared to conventional cases where heat is supplied to the anisotropic conductive material and pressure is applied to the component at the same time. Accordingly, during mounting of the component, it is possible to facilitate thermosetting of the binder by the voltage receiving part inputting voltage and by supplying heat to the anisotropic conductive material prior to pressure being applied to the component by the pressurizing unit, for example. Due to this, during pressurizing of the component by the pressurizing unit, the binder has already been hardened to a certain extent, and the pressure exerted on the conductive particles can also be received by the binder, thus preventing the pressure from being concentrated only on the conductive particles, and thereby forming a favorable connection between component and the component mounting section via the conductive particles. Moreover, a higher degree of freedom regarding the timing at which heat is supplied to the anisotropic conductive material makes it unnecessary to rapidly supply heat in order to harden the binder, which makes the substrate less susceptible to being overheated and inhibits the occurrence of performance degradation caused by such heat.

Effects of the Invention

The present invention makes it possible to improve the connection state between components and the component mounting area and at inhibiting performance degradation caused by heat.

BRIEF DESCRIPTION OF THE DRAWINGS

FIG. 15 is a plan view of a mounting region of a driver and a flexible substrate on an array substrate according to Embodiment 2 of the present invention.

DETAILED DESCRIPTION OF EMBODIMENTS

Embodiment 1

Embodiment 1 of the present invention will be described with reference to FIGS. 1 to 14. In the present embodiment, an array substrate (mounting substrate) 11b included on a liquid crystal panel (display panel) 11 that forms a component of the liquid crystal display device 10, a method of manufacturing the array substrate 11b, and a driver mounting device (manufacturing device) 40 used for manufacturing the array substrate 11b will be illustratively explained. The drawings indicate an X axis, a Y axis, and a Z axis in a portion of the drawings, and each of the axes indicates the same direction in the respective drawings. Furthermore, the vertical direction is based on FIGS. 2, 3, 5, 7, etc. and the top of a drawing is the front side and the bottom of a drawing is the back side.

Figure 1:
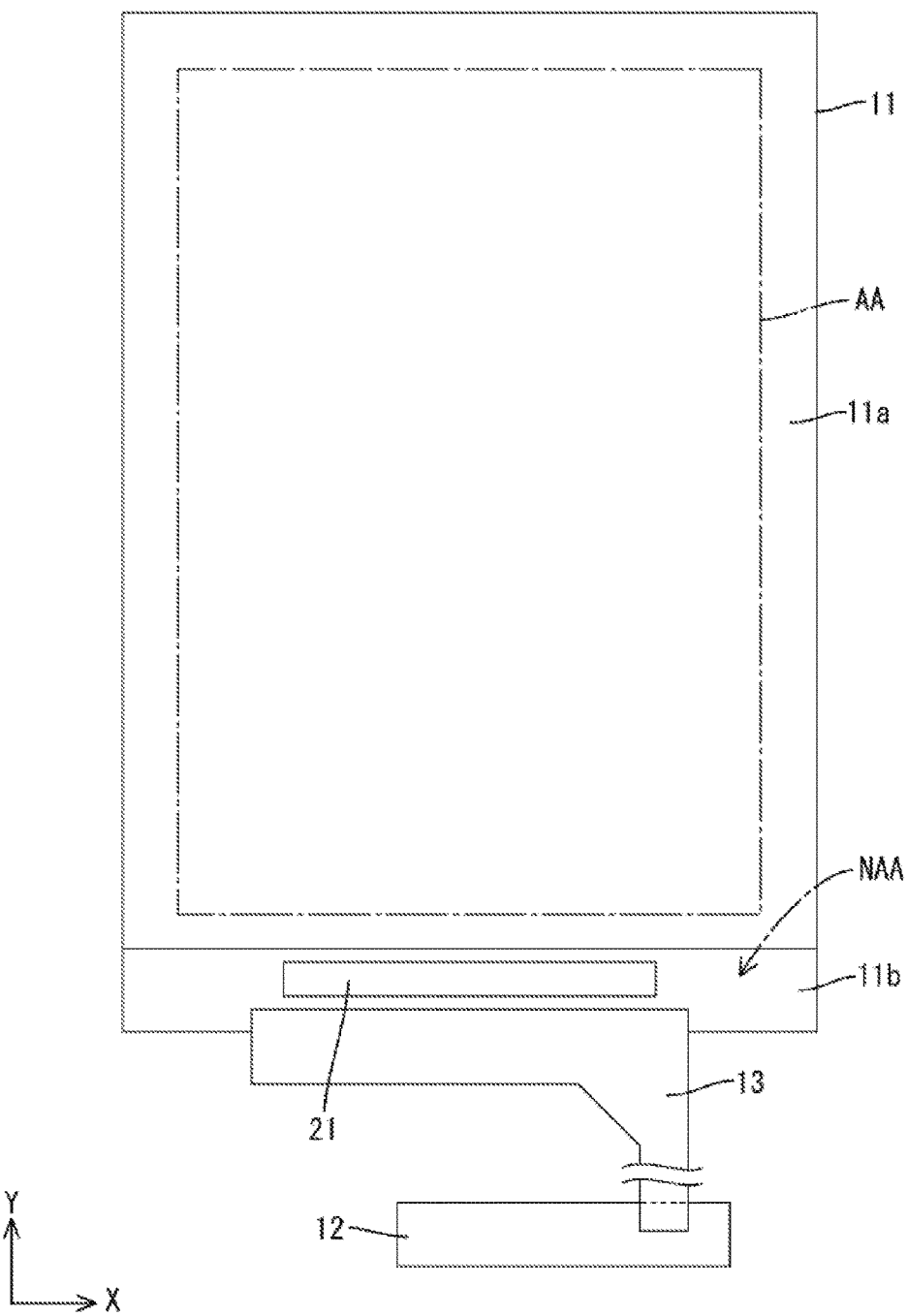
FIG. 1 is a schematic plan view of a connection configuration of a liquid crystal panel having a driver mounted thereon and a flexible substrate and control circuit substrate according to Embodiment 1 of the present invention.
Figure 2:
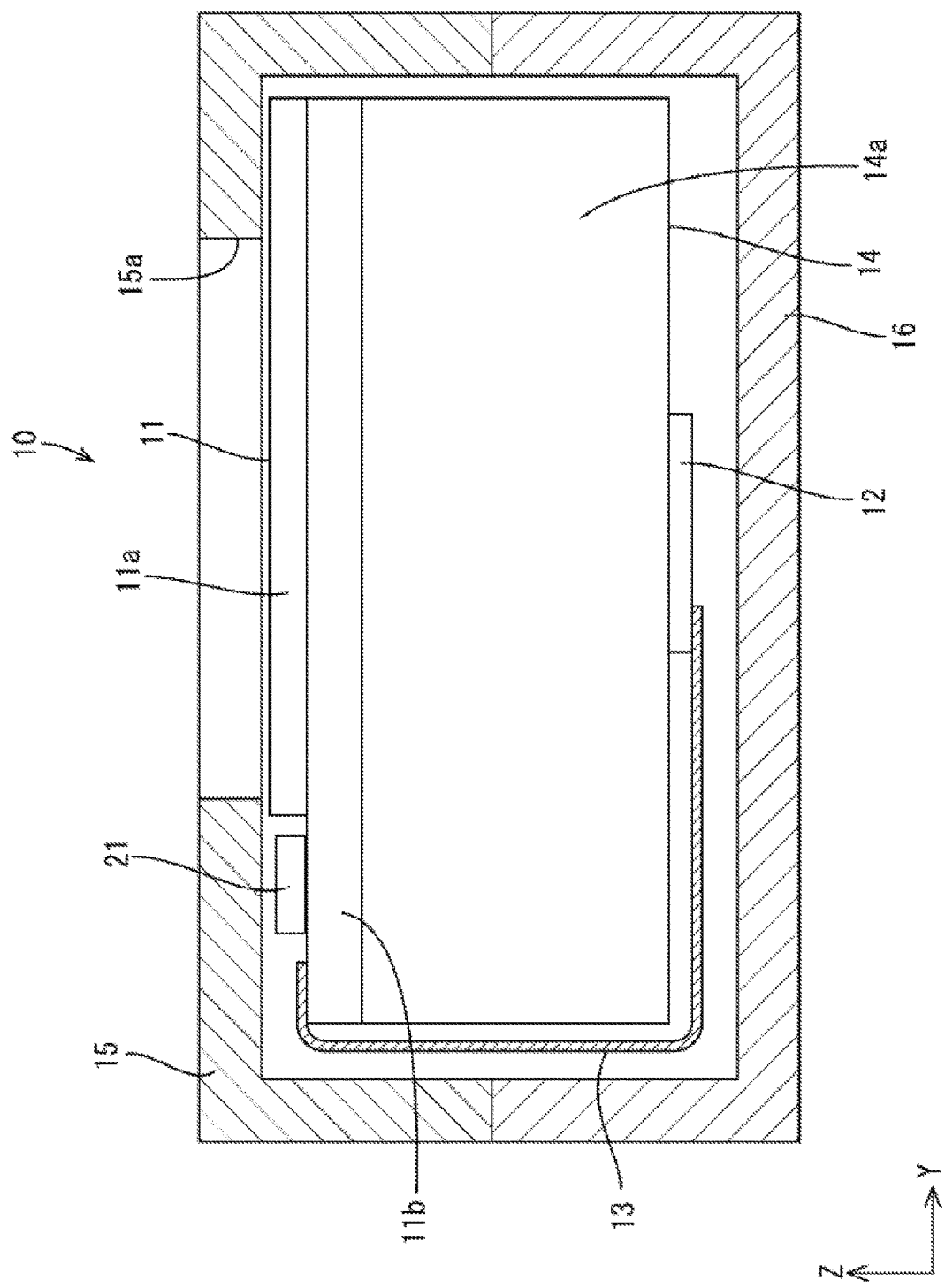
FIG. 2 is a schematic cross-sectional view that shows a cross-sectional configuration along a lengthwise direction of the liquid crystal display device.

As shown in FIGS. 1 and 2, a liquid crystal display device 10 includes the liquid crystal panel 11, a driver (component) 21 that is mounted on the liquid crystal panel 11 and that drives the liquid crystal panel 11, a control circuit board (external signal supply source) 12 that supplies various types of input signals supplied from outside to the driver 21, a flexible substrate (external connection component) 13 that electrically connects the liquid crystal panel 11 to the external control circuit board 12, and a backlight device (illumination device) 14 that supplies light for display to the liquid crystal panel 11. The liquid crystal display device 10 also includes front and back exterior members 15 and 16 for housing and holding the liquid crystal panel 11 and the backlight device 14, which are attached to each other, and the front exterior member 15 has an opening 15a for making the image displayed on the liquid crystal panel 11 visible from outside. The liquid crystal display device 10 according to the present embodiment can be used in various electronic devices (not shown) such as portable information devices (including electronic books and PDAs), mobile telephones (including smartphones), notebook computers (including tablet PCs and the like), digital photo frames, portable gaming devices, electronic ink technology, and the like. Thus, the screen size of the display of the liquid crystal panel 11 included in the liquid crystal display device 10 is approximately a few inches to 10 inches, for example, or in other words, small- to mid-sized in general.

First, the backlight device 14 will be briefly explained. As shown in FIG. 2, the backlight device 14 has a substantially box-shaped chassis 14a with an opening in the front (facing the liquid crystal panel 11), light sources (not shown) such as cold cathode fluorescent tubes, LEDs, or organic EL arranged in the chassis 14a, and optical members (not shown) arranged so as to cover the opening of the chassis 14a. The optical member functions to convert light from the light sources into planar light.

Next, the liquid crystal panel 11 will be described. As shown in FIG. 1, the liquid crystal panel 11 has a vertically-long quadrilateral (rectangular) shape as a whole, and the display area (active area) AA is disposed at a location near one edge in the lengthwise direction of the panel (the top in FIG. 1), and the drivers 2 and the flexible substrate 13 are disposed at a location near the other edge in the lengthwise direction of the panel (the bottom in FIG. 1). The area outside the display area AA on the liquid crystal panel 11 is the non-display area (non-active area) NAA where images are not displayed, and a portion of this non-display area NAA serves as the mounting region of the driver 21 and flexible substrate 13. The widthwise direction of the liquid crystal panel 11 matches the X-axis direction in the respective drawings, and the lengthwise direction matches the Y-axis direction in the respective drawings. In FIG. 1, the frame-shaped dashed line that is slightly smaller than a CF substrate 11a represents the outer shape of the display area AA, and the region outside this dashed line is the non-display area NAA.

Figure 3:
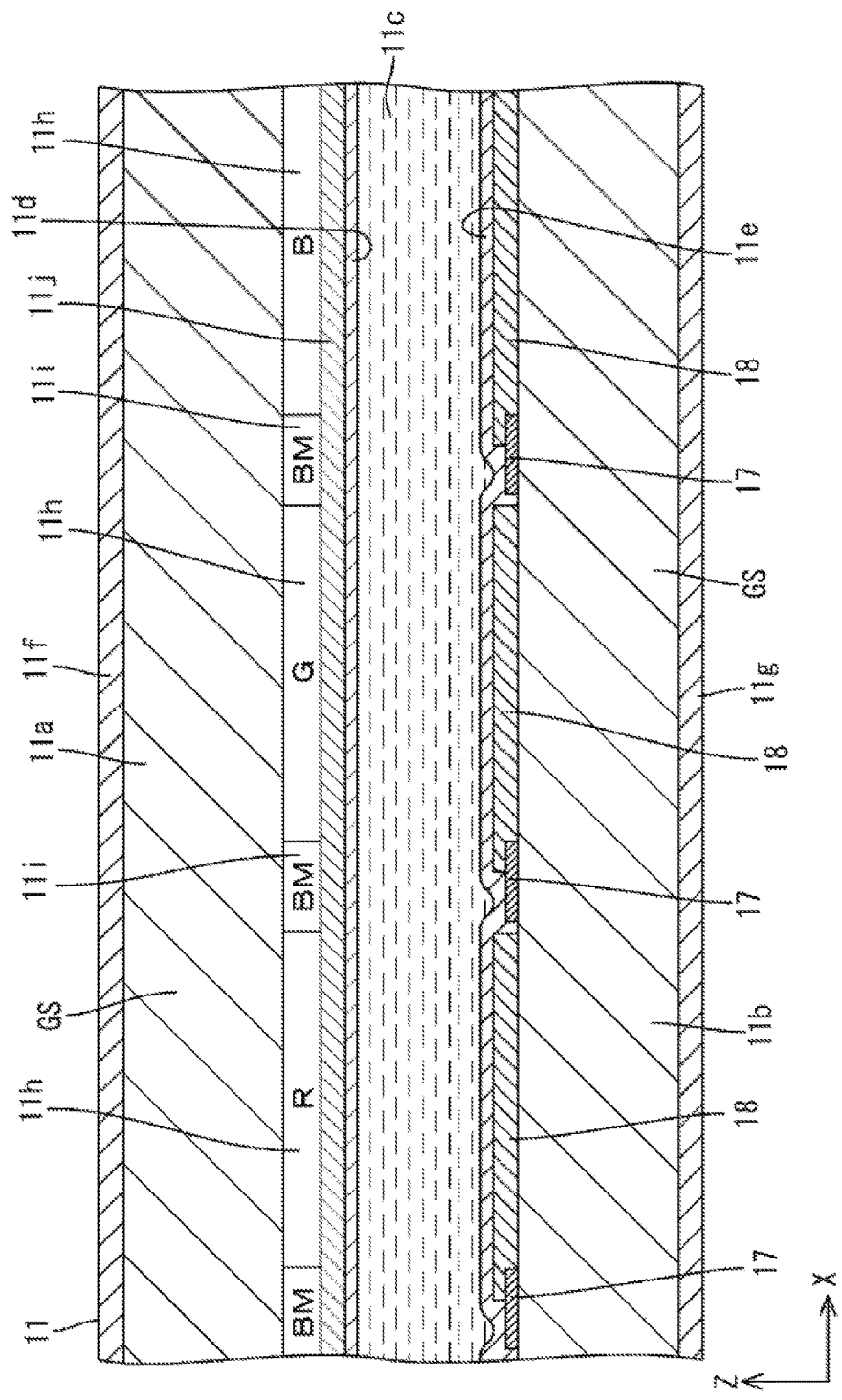
FIG. 3 is a schematic cross-sectional view that shows a cross-sectional configuration of the liquid crystal panel.

As shown in FIG. 3, the liquid crystal panel 11 includes a pair of transparent substrates 11a and 11b, and a liquid crystal layer 11c that is sandwiched between these two substrates 11a and 11b and that contains liquid crystal molecules, which is a substance whose optical characteristics change following application of an electric field thereto, and the two substrates 11a and 11b are bonded together by a sealant (not shown) with a gap the same thickness as the liquid crystal layer 11c maintained therebetween. Both substrates 11a and 11b are each substantially transparent (superiorly translucence) glass substrates GS made of non-alkali glass, quartz glass, or the like, and a known photolithography method is used to layer a plurality of films on each glass substrate GS. Of the two substrates 11a and 11b, the one on the front side (front surface side) is the CF substrate (opposite substrate) 11a, and the other on the back side (rear surface side) is the array substrate (mounting substrate, device substrate, active matrix substrate) 11b. As shown in FIGS. 1 and 2, of these substrates, the CF substrate 11a has generally the same width dimensions as the array substrate 11b, but smaller length dimensions than the array substrate 11b, and the CF substrate 11a is bonded to the array substrate 11b with one end in the lengthwise direction (the top in FIG. 1) aligning with the array substrate 11b. Accordingly, the other end of the array substrate 11 in the lengthwise direction (the bottom in FIG. 1) does not overlap the CF substrate 11a within a prescribed range, but rather has both front and back surfaces exposed to outside, and this is where the driver 21 and the flexible substrate 13 are mounted, as described later. The glass substrate GS forming the array substrate 11b has a portion overlapping the CF substrate 11a in a plan view as a substrate main section GSm, and a portion not overlapping the CF substrate 11a in a plan view and lateral to the substrate main section GSm as a substrate side section GSs. Polarizing plates 11f and 11g (optical members) are bonded to the respective outer surface sides of both substrates 11a and 11b. The back polarizing plate 11g attached to the outer surface of the array substrate 11b is wholly disposed on the substrate main section GSm, and disposed so as to be adjacent to the substrate side section GSs in the Y-axis direction. Furthermore, the front polarizing plate 11f attached to the outer surface of the CF substrate 11a has a similar placement to the back polarizing plate 11g. In addition, alignment films 11d and 11e for aligning the liquid crystal molecules included in the liquid crystal layer 11c are respectively formed on the inner surface sides of the two substrate 11a and 11b.

Next, the configurations inside the display area AA on the array substrate 11b and the CF substrate 11a will be briefly described. As shown in FIG. 3, a large number of TFTs (thin film transistors) 17, which are switching devices, and pixel electrodes are arranged in a matrix on the inner surface side of the array substrate 11b (the surface facing the liquid crystal layer 11c and the CF substrate 11a), and gate wiring lines and source wiring lines (neither shown) are arranged in a grid-like pattern so as to surround these TFTs 17 and pixel electrodes 18. In other words, the TFTs 17 and pixel electrodes 18 are arranged parallel to one another in a matrix at intersections of the gate wiring lines and source wiring lines having the grid-like pattern. The gate wiring lines and the source wiring lines are respectively connected to gate electrodes and source electrodes of the TFTs 17, and the pixel electrodes 18 are respectively connected to the drain electrodes of the TFTs 17. The pixel electrodes 18 have a vertically-long quadrilateral (rectangular) shape in a plan view and are made of a transparent electrode material such as ITO (indium tin oxide) or ZnO (zinc oxide). It is also possible to provide capacitance wiring lines (not shown) on the array substrate 11b that are parallel to the gate wiring lines and that go across the pixel electrodes 18.

As shown in FIG. 3, a large number of color filters 11h are arranged parallel to one another in a matrix on the CF substrate 11a such that a colored portion thereof such as R (red), G (green), or B (blue) overlaps the respective pixel electrodes 18 on the array substrate 11b in a plan view. A substantially grid-shaped light-shielding layer (black matrix) 11i for preventing colors from mixing is formed between the respective colored portions constituting the color filter 11h. This light-shielding layer 11i overlaps the gate wiring lines and the source wiring lines in a plan view. A uniformly planar opposite electrode 11j that faces the pixel electrodes 18 on the array substrate 11b is disposed on the surface of the color filer 11h and the light-shielding layer 11i. In the liquid crystal panel 11, one display pixel, which is a display unit of the liquid crystal panel 11, is formed of a group of three colored portions R (red), G (green), and B (blue), and three pixel electrodes 18 opposing these portions. A display pixel is made of a red pixel having an R colored portion, a green pixel having a G colored portion, and a blue pixel having a B colored portion. These respective pixels are repeatedly arranged next to one another along the row direction (X-axis direction) on the surface of the liquid crystal panel 11 to form a pixel group, and a large number of these pixel groups are arranged next to each other along the column direction (Y-axis direction).

Next, a member that connects to the liquid crystal panel 11 will be described. As shown in FIGS. 1 and 2, the control circuit substrate 12 is attached to the back surface of the chassis 14a of the backlight device 14 (the outer surface opposite to the liquid crystal panel 11) by screws or the like. This control circuit board 12 is a paper phenolic or glass epoxy resin substrate and has mounted thereon electronic components for supplying various types of input signals to the driver 21 and also has prescribed patterns of wiring lines (electric paths) formed thereon. One end of the flexible substrate 13 is electrically and mechanically connected to this control circuit board 12 via an anisotropic conductive material (not shown).

As shown in FIG. 2, the flexible substrate (FPC substrate) 13 includes a base material made of a composite resin material having insulating and flexible characteristics (a polyimide resin or the like, for example), and there are a large number of wiring patterns (not shown) on the base material, with one end in the lengthwise direction of the flexible substrate 13 connecting to the control circuit board 12 disposed on the back surface side of the chassis 14a and the other end connecting to the array substrate 11b of the liquid crystal panel 11, as described above; therefore, the flexible substrate 13 is bent in a cuff shape such that, inside the liquid crystal display device 10, the flexible substrate 13 has a substantially U-shaped cross section. The wiring patterns on both ends in the lengthwise direction of the flexible substrate 13 are exposed to the outside to form terminals (not shown), and these terminals are respectively electrically connected to the control circuit board 12 and the liquid crystal panel 11. This makes it possible for input signals supplied from the control circuit board 12 to be transmitted to the liquid crystal panel 11.

As shown in FIG. 1, the driver 21 is constituted by an LSI chip having a driver circuit therein, and operates on the basis of signals supplied from the control circuit board 12, which is the signal supply source, in order to generate output signals by processing input signals supplied from the control circuit substrate 12 as the signal supply source, and these output signals are output to the display area AA of the liquid crystal panel 11. This driver 21 has a horizontally-long quadrilateral shape in a plan view, or in other words, is long along the widthwise direction of the liquid crystal panel 11. The driver 21 is directly mounted, i.e., COG (chip on glass) mounted on the substrate side section GSs, which is the non-display area NAA of the array substrate 11b in the liquid crystal panel 11. The lengthwise direction (long direction) of the driver 21 matches the X-axis direction (the widthwise direction of the liquid crystal panel 11), and this widthwise direction (the direction orthogonal to the long direction) matches the Y-axis direction (the lengthwise direction of the liquid crystal panel 11).

Next, the connection configuration of the flexible substrate 13 and driver 21 to the non-display area NAA of the array substrate 11b will be described. As shown in FIG. 1, the driver 21 and one end of the flexible substrate 13 are mounted on the substrate side section GSs of the non-display area NAA on the array substrate 11b, which does not overlap the CF substrate 11a. The end of the flexible substrate 13 is disposed on the side of the substrate side section GSs opposite to the substrate main section GSm (display area AA) in the Y-axis direction, whereas the driver 21 is arranged on the side of the substrate side section GSs closer to the substrate main section GSm (display area AA) than the flexible substrate 13. In other words, the driver 21 is disposed in a position in the non-display area NAA that is sandwiched between the display area AA and the flexible substrate 13, whereas the flexible substrate 13 has the end thereof (the location of attachment to the liquid crystal panel 11) disposed on the side (the end of the array substrate 11b) opposite to the display area AA relative to the driver 21. The flexible substrate 13 has an end thereof attached to the center portion of the widthwise end of the array substrate 11b, and this attached end extends along this widthwise end (along the widthwise direction, X-axis direction) of the array substrate 11b. The dimensions of the end of the flexible substrate 13 attached to the array substrate 11b are smaller than the widthwise dimensions of the array substrate 11b. Meanwhile, the driver 21 is mounted in the center portion of the widthwise direction of the array substrate 11b on the substrate side section GSs with the lengthwise direction of the driver matching the widthwise direction (X-axis direction) of the array substrate 11b. The lengthwise dimensions of the driver 21 are smaller than the dimensions of the end of the flexible substrate 13 attached to the array substrate 11b.

Figure 4:
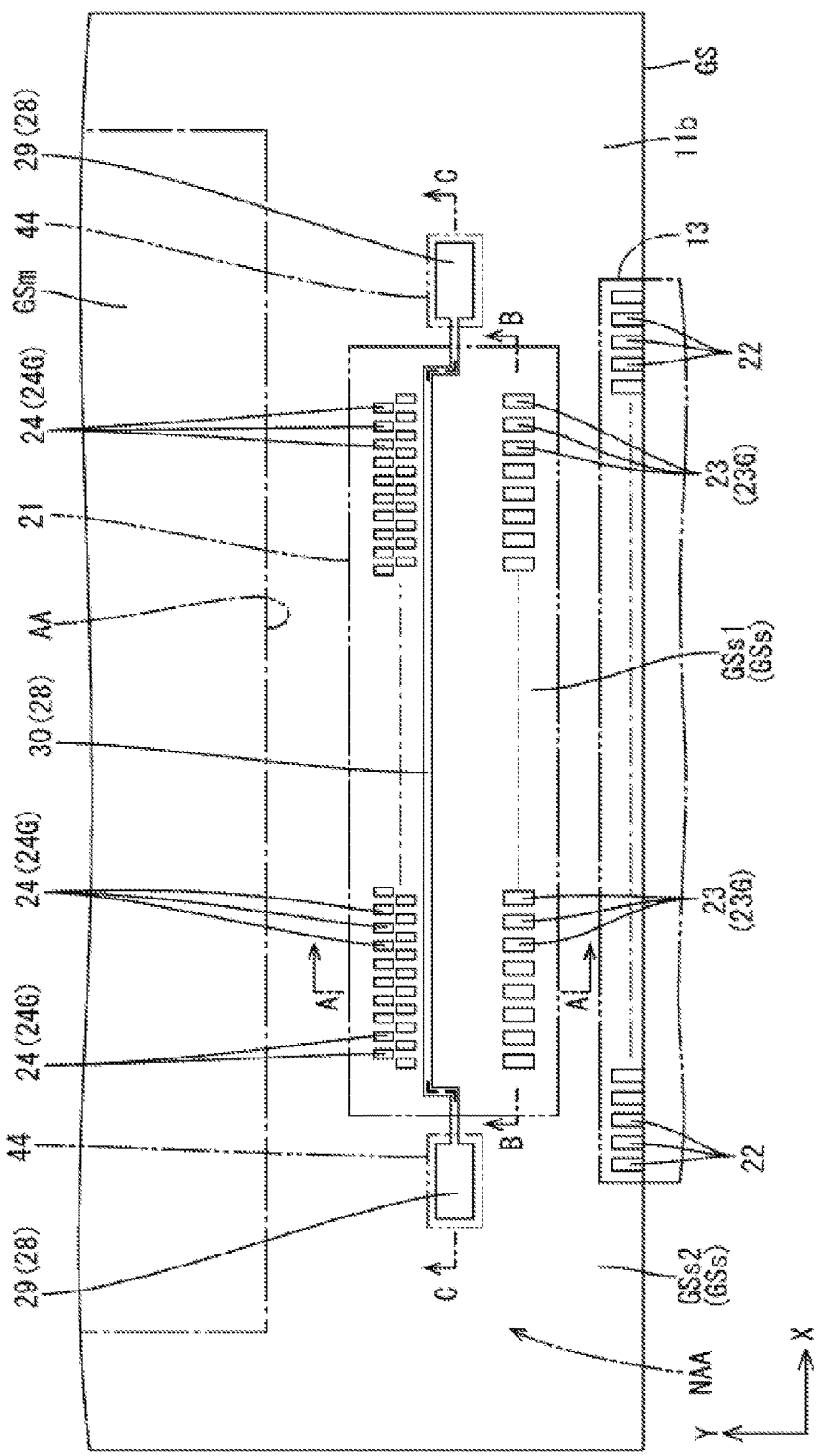
FIG. 4 is a close-up plan view of a mounting region of a driver and a flexible substrate on an array substrate forming a portion of the liquid crystal panel.

As shown in FIG. 4, external connection terminals 22 that receive the supply of input signals from the flexible substrate 13 are formed on the mounting region of the flexible substrate 13 on the substrate side section GSs of the array substrate 11b. Meanwhile, panel-side input terminals (input terminals, first terminals, substrate-side input terminals) 23 for supplying input signals to the driver 21, and panel-side output terminals (output terminals, second output terminals, substrate-side output terminals) 24 for receiving the output signals from the driver 21, are disposed in the mounting region of the driver 21 on the substrate side section GSs of the array substrate 11b (the driver mounting section GSs1, described later). Furthermore, of the substrate side section GSs, which is in the non-display area NAA, the external connection terminals 22 and panel-side input terminals 23 are electrically connected by relay wiring lines (not shown) formed across the space between the mounting region of the flexible substrate 13 and the mounting region of the driver 21 In contrast, driver-side input terminals (component-side input terminals) 25 that electrically connect to the panel-side input terminals 23, and driver-side output terminals (component-side output terminals) 26 that electrically connected to the panel-side output terminals 24, are disposed on the driver 21. In FIG. 4, the flexible substrate 13 and driver 21 are shown by a double-dashed line. In FIG. 4, the single dashed line represents the outer shape of the display area AA, and the region outside this single dashed line is the non-display area NAA.

Figure 5:
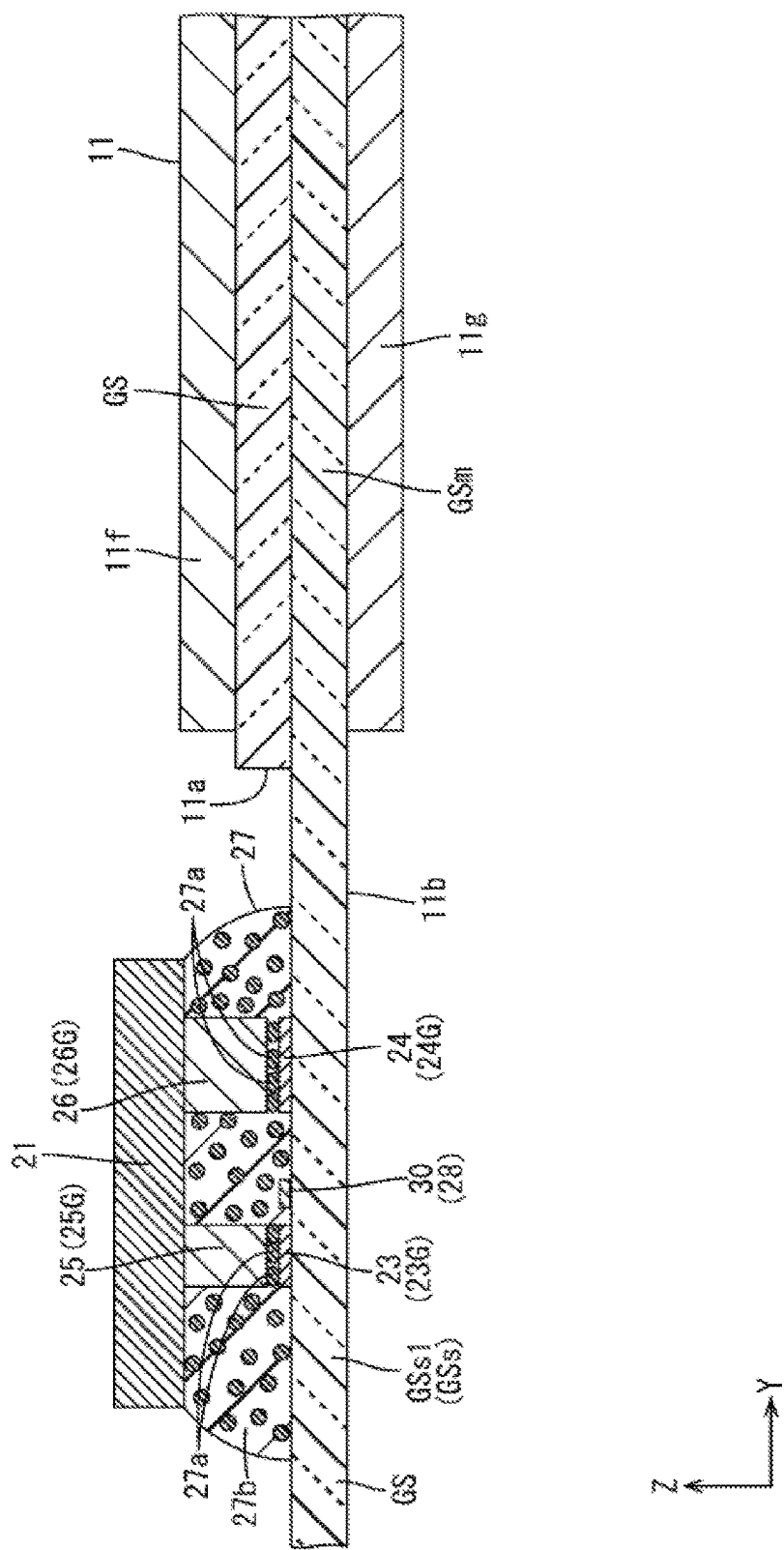
FIG. 5 is a cross-sectional view along the line A-A of FIG. 4.

As shown in FIG. 5, the panel-side input terminals 23 and panel-side output terminals 24 are made of the same metal material (titanium, copper, aluminum, etc.) as the gate wiring lines and source wiring lines. Accordingly, the panel-side input terminals 23 and the panel-side output terminals 24 are patterned by a known photolithography method on the array substrate 11b at the same time the gate wiring lines and source wiring lines are patterned in the manufacturing process of the array substrate 11b. A anisotropic conductive material (ACF) 27 is placed on the panel-side input terminals 23 and panel-side output terminals 24, and via the conductive particles 27a included in this anisotropic conductive material 27 the driver-side input terminals 25 of the driver 21 are electrically connected to the panel-side input terminals 23, and the driver-side output terminals 26 are connected to the panel-side output terminals 24. The anisotropic conductive material 27 is constituted by a large number of the conductive particles 27a and a binder 27b in which the large number of conductive particles 27a are dispersion compounded. The conductive particles 27a are constituted by a metal core (a core made of gold-coated nickel, for example) covered by an insulating film, and this insulating film is destroyed or dissolved by heat, pressure, or the like. The binder 27b is made of a thermosetting resin material and has a curing temperature of approximately 100° C. to 120° C., for example. The connections among the terminals 23 to 26 via this anisotropic conductive material 27 are performed by using the driver mounting device 40 to mount the driver 21 on the array substrate 11b, which is described in detail later. Although not shown, the external connection terminals 22 have a similar cross-sectional configuration to the panel-side input terminals 23 and the panel-side output terminals 24 described above and are electrically connected to the terminals of the flexible substrate 13 via the anisotropic conductive material.

Figure 6:
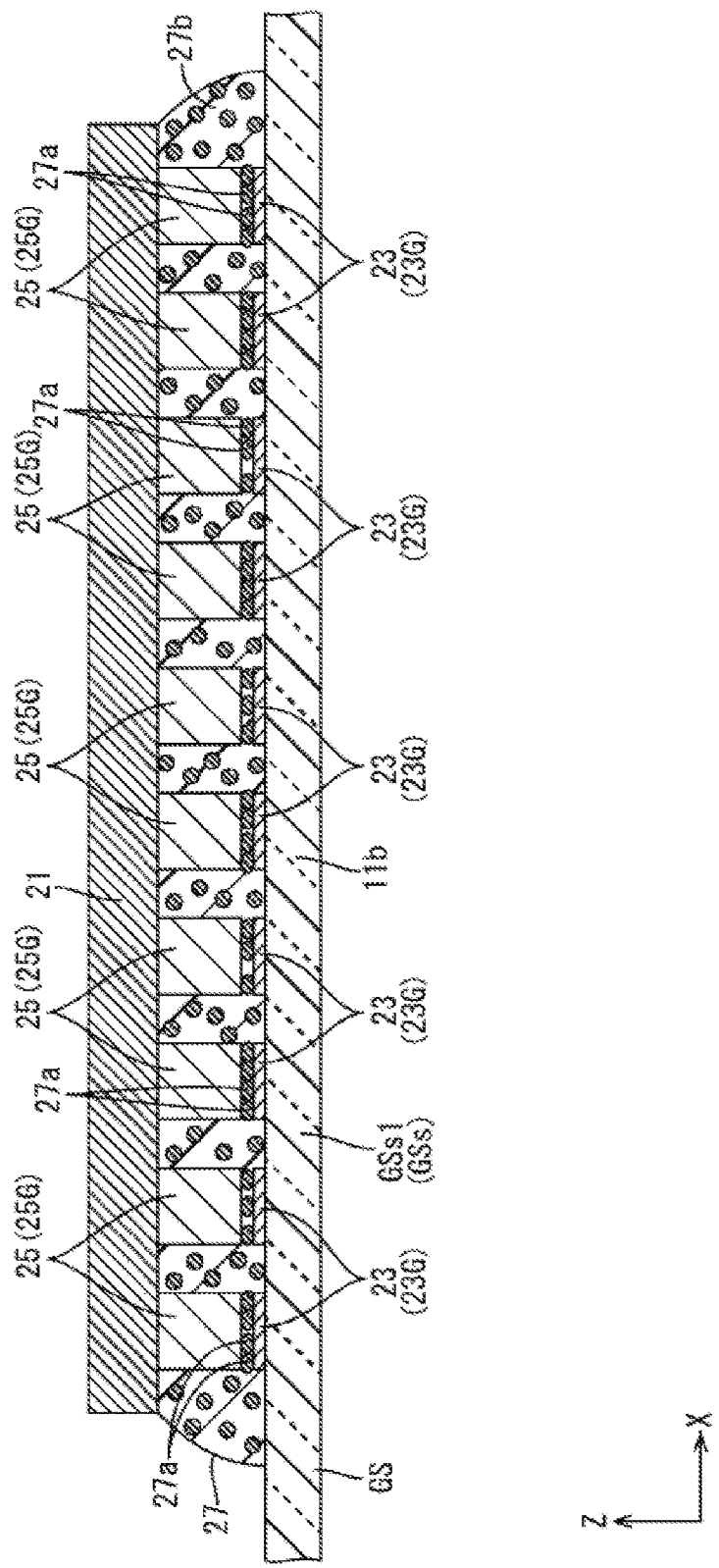
FIG. 6 is a cross-sectional view along the line B-B of FIG. 4.

As shown in FIGS. 4 and 5, the panel-side input terminals 23 and the panel-side output terminals 24 are arranged on the portion of the substrate side section GSs of the array substrate 11b overlapping the driver 21 in a plan view, or in other words, the mounting region of the driver 21. The portion of the substrate side section GSs overlapping the driver 21 in a plan view (the mounting region of the driver 21) is the driver mounting section (component mounting section) GSs1, whereas the portion of the substrate side section GSs not overlapping the driver 21 in a plan view is a driver non-overlapping section (component non-overlapping section) GSs2. The panel-side input terminals 23 and panel-side output terminals 24 are arranged next to each other with prescribed gaps therebetween in the Y-axis direction (the arrangement direction of the driver 21 and display area AA (flexible substrate 13). Of these, the panel-side input terminals 23 are arranged on the flexible substrate 13 side (the side opposite to the display area AA) of the driver mounting section GSs1 on the substrate side section GSs of the array substrate 11b, whereas the panel-side output terminals 24 are arranged on the display area AA side (the side opposite to the flexible substrate 13) on the driver mounting section GSs1. As shown in FIG. 6, a large number of the panel-side input terminals 23 are linearly arranged along the X-axis direction or rather lengthwise direction (long direction) of the driver 21 with prescribed gaps therebetween. The large number of panel-side input terminals 23 arranged along the X-axis direction form a panel-side input terminal group (input terminal group, first terminal group, substrate-side input terminal group) 23G. Meanwhile, the panel-side output terminals 24 constitute a first terminal column in which a large number of the terminals are linearly arranged next to one another along the X-axis direction with prescribed gaps therebetween, and a second terminal column that is arranged in a position adjacent in the Y-axis direction to the first terminal column and in which a large number of the terminals are linearly arranged next to one another along the X-axis direction with prescribed gaps therebetween. The panel-side output terminals 24 constituting the first terminal column and the panel-side output terminals 24 constituting the second terminal column are adjacent to each other in the X-axis direction. In other words, the large number of panel-side output terminals 24 constituting the first terminal column and second terminal column are arranged next to each other in a staggered manner along the X-axis direction. The large number of panel-side output terminals 24 constituting the first terminal column and second terminal column form a panel-side output terminal group (output terminal group, second terminal group, substrate-side output terminal group) 24G. The installation amount of the panel-side output terminals 24 constituting the panel-side output terminal group 24G is greater than the installation amount of the panel-side input terminals 23 constituting the panel-side input terminal group 23G, and is specifically approximately two times greater, for example. The total area of the panel-side output terminal group 24G (the value obtained by multiplying the surface area of the panel-side output terminals 24 with the installation amount) is greater than the total area of the panel-side input terminal group 23G (the value obtained by multiplying the surface area of the panel-side input terminals 23 with the installation amount). Accordingly, the panel-side output terminals 24 constituting the panel-side output terminal group 24G can output even more output signals to the display area AA, which is thus suitable for a high definition liquid crystal panel 11 having a larger amount of pixels arranged in the display area AA. FIG. 6 shows a cross-sectional configuration of the respective input terminals 23 and 25 as a representative example, but the cross-sectional configuration of the respective output terminals 24 and 26 is also the same as this.

As shown in FIG. 5, the driver-side input terminals 25 and the driver-side output terminals 26 are made of a metal material with excellent conductivity such as gold and have a bump shape (projection) that protrudes from the bottom of the driver 21 (from the surface facing the array substrate 11*b*). The driver-side input terminals 25 and the driver-side output terminals 26 are respectively connected to processing circuits inside the driver 21, and after the input signals received from the driver-side input terminals 25 are processed by the processing circuits, it is possible to output the signals to the driver-side output terminals 26. As shown in FIG. 6, a large number of the driver-side input terminals 25 are linearly arranged next to one another with prescribed gaps therebetween along the X-axis direction or rather lengthwise direction of the driver 21, in a similar manner to the panel-side input terminals 23. The large number of driver-side input terminals 25 arranged next to one another along the X-axis direction form a driver-side input terminal group (component-side input terminal group) 25G. A large number of the driver-side output terminals 26 are arranged next to one another in a staggered manner along the X-axis direction, in a similar manner to the panel-side output terminals 24. The large number of driver-side output terminals 26 arranged next to one another in a staggered manner along the X-axis direction form a driver-side output terminal group (component-side output terminal group) 26G. The detailed planar arrangement of the driver-side output terminals 26 is the same as the panel-side output terminals 24, and thus redundant explanations will be omitted.

When mounting the driver 21 on the array substrate 11*b* having the above-mentioned configuration, the anisotropic conductive material 27 is disposed on the driver mounting section GSs1 of the array substrate 11*b* and the driver 21 is arranged on the driver mounting section GSs1 with the anisotropic conductive material 27 interposed therebetween, and in this state the driver mounting device 40 applies pressure to the driver 21 and the like, as described later. Conventionally, during mounting of the driver, the pressurizing of the driver and heating were performed at the same time, which risked pressurizing force being applied to the conductive particles before the binder of the anisotropic conductive material had sufficiently hardened. If this happened, the connections by the conductive particles among the respective driver-side terminals and respective panel-side terminals could be defective. To avoid this situation, it is preferable to let the binder harden to a certain extent before pressurizing force is applied to the conductive particles, but this requires rapid heating of the binder, which raises concerns about degradation caused by overheating of the peripheral members of the liquid crystal panel around the driver (such as the polarizing plates).

As a countermeasure, as shown in FIG. 4, heat supply parts 28 (heat supply patterns) for supplying heat to the anisotropic conductive material 27 are provided in the driver mounting section GSs1 on the glass substrate GS that forms a portion of the array substrate 11*b* of the present embodiment. With this configuration, there is a higher degree of freedom regarding the timing at which heat is supplied to the anisotropic conductive material 27 as compared to if the supply of heat and pressurization of the driver were performed at the same time, as was done conventionally. Accordingly, when mounting the driver 21, it is possible to facilitate thermosetting of the binder 27*b* by the heat supply parts 28 supplying heat to the anisotropic conductive material 27 prior to pressure being applied to the driver 21, for example. This makes it possible, when pressure is to be applied to the driver 21, for the binder 27*b* to also receive the pressure being exerted on the conductive particles 27*a*, as the binder 27*b* has already been hardened to a certain extent; therefore, this avoids the pressure being concentrated only on the conductive particles 27*a*, and thus forms favorable connections between the driver 21 and driver mounting section GSs1 via the conductive particles 27*a*. Moreover, a higher degree of freedom regarding the timing at which heat is supplied to the anisotropic conductive material 27 makes it unnecessary to rapidly supply heat in order to harden the binder 27*b*, which makes the glass substrate GS less susceptible to being overheated and inhibits the occurrence of performance degradation caused by such heat.

The heat supply part 28 will be described in detail below. The heat supply part 28 is made of a metal material with excellent electrical and thermal conductivity. Accordingly, the heat supply part 28 has comparatively higher thermal conductivity than the glass substrate GS, which makes it possible to efficiently supply heat to the anisotropic conductive material 27 and thus allows more favorable facilitation of the thermosetting of the binder 27*b*. The metal material constituting the heat supply part 28 is the same metal material constituting the panel-side input terminals 23 and panel-side output terminals 24. Therefore, the heat supply part 28 is patterned on the array substrate 11*b* by a known photolithography method at the same time the panel-side input terminals 23 and panel-side output terminals 24 are patterned in the manufacturing process of the array substrate 11*b*. This enables a reduction in manufacturing costs related to the array substrate 11*b*.

Figure 7:
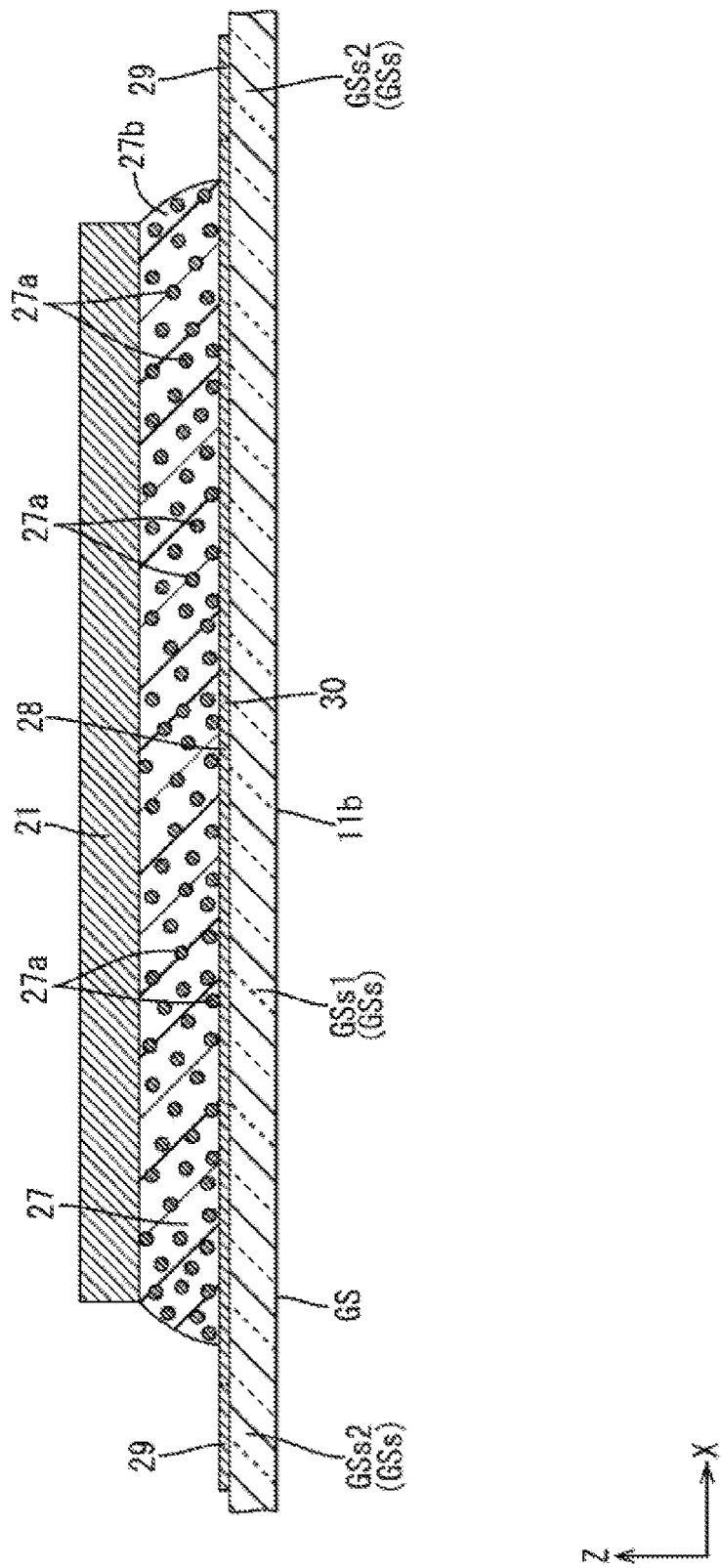
FIG. 7 is a cross-sectional view along the line C-C of FIG. 4.

As shown in FIGS. 4 and 7, the heat supply part 28 is constituted by a heated section (heated terminal) 29 that is heated by an external heat source (a heating unit 44, described later), and a heat transfer section 30 for transferring the heat from the heated section 29 to the anisotropic conductive material 27. The heated section 29 overlaps the driver non-overlapping section GSs2 on the substrate side section GSs of the array substrate 11*b*, and thus is not susceptible to being blocked by the driver 21 when heated by the external heat source. The heat transfer section 30 is arranged mostly on the driver mounting section GSs1 on the substrate side section GSs of the array substrate 11*b*, and thus can efficiently transfer heat from the heated section 29 to the anisotropic conductive material 27. The heat transfer section 30 extends across the entire length of the driver mounting section GSs1 along the lengthwise direction thereof, and both ends in the extension direction (X-axis direction) of the heat transfer section are arranged on the driver non-overlapping section GSs2, with each end being connected to the heated section 29. In other words, the heated section 29 is provided in a pair with each heated section continuing from one of the ends of the heat transfer section 30 in the extension direction thereof; therefore, heat can be transferred to the heat transfer section 30 from both sides in the extension direction of the heat transfer section, which helps prevent uneven heating of the anisotropic conductive material 27 in the X-axis direction. The heated section 29 has a horizontally-long rectangular shape in a plan view and the lengthwise direction of the heated section matches the extension direction of the heat transfer section 30. The widthwise dimensions of the heated section 30 are greater than the line width of the line-shaped transfer section 30.

As shown in FIG. 4, the heat transfer section 30 is disposed so as to pass between the panel-side input terminal group 23G and panel-side output terminal group 24G in the Y-axis direction on the driver mounting section GSs1. Due to this, heat from the transfer section 30 can be efficiently transferred to the anisotropic conductive material 27 interposed between the panel-side input terminals 23 constituting the panel-side input terminal group 23G and the driver 21, and the anisotropic conductive material 27 interposed between the panel-side output terminals 24 constituting the panel-side output terminal group 24G and the driver 21, and thus the panel-side input terminals 23 and panel-side output terminals 24 can all have favorable connections to the driver-side input terminals 25 and driver-side output terminals 26 of the driver 21. Furthermore, the heat transfer section 30 passes closer to the panel-side output terminal group 24G than the panel-side input terminal group 23G in the driver mounting section GSs1. Specifically, both ends of the portion of the heat transfer section 30 inside the driver mounting section GSs1 are curved, which places most of the center portion of the heat transfer section 30 adjacent to the panel-side output terminal group 24G in the Y-axis direction. The distance from most of the center portion of the heat transfer section 30 to the panel-side output terminal group 24G is shorter than the distance to the panel-side input terminal group 23G.

As described above, the panel-side output terminal group 24G has a greater total area than the panel-side input terminal group 23G; thus, as shown in FIGS. 4 and 7, the amount of binder 27b of the anisotropic conductive material 27 interposed between the panel-side output terminals 24 and the driver-side output terminals 26 of the driver 21 is relatively greater than the amount of binder 27b of the anisotropic conductive material 27 interposed between the panel-side input terminals 23 and the driver-side input terminals 25 of the driver 21. Therefore, the amount of heat required to harden the binder 27b interposed between the panel-side output terminals 24 and the driver-side output terminals 26 is relatively greater than the amount of heat required to harden the binder 27b interposed between the panel-side input terminals 23 and the driver-side input terminals 25. In this aspect, the heat transfer section 30 being disposed close to the panel-side input terminal group 24G as described above facilitates favorable hardening due to more heat from the heat transfer section 30 being supplied to the binder 27b interposed between the panel-side output terminals 24 and the driver-side output terminals 26, and this can thus form favorable connections among the panel-side output terminals 24 and the driver-side output terminals 26. Furthermore, while the driver-side input terminal group 23G is arranged further away from the heat transfer section 30 than the panel-side output terminal group 24G, it is nevertheless possible to sufficiently harden the binder 27b interposed between the driver-side input terminals 25 despite the heat supplied from the heat transfer section 30 being relatively less, because the amount of binder 27b interposed between the driver-side input terminals 25 is less, and thus requires less heat to harden; therefore, favorable connections can be formed among the panel-side input terminals 23 and the driver-side input terminals 25.

Figure 8:
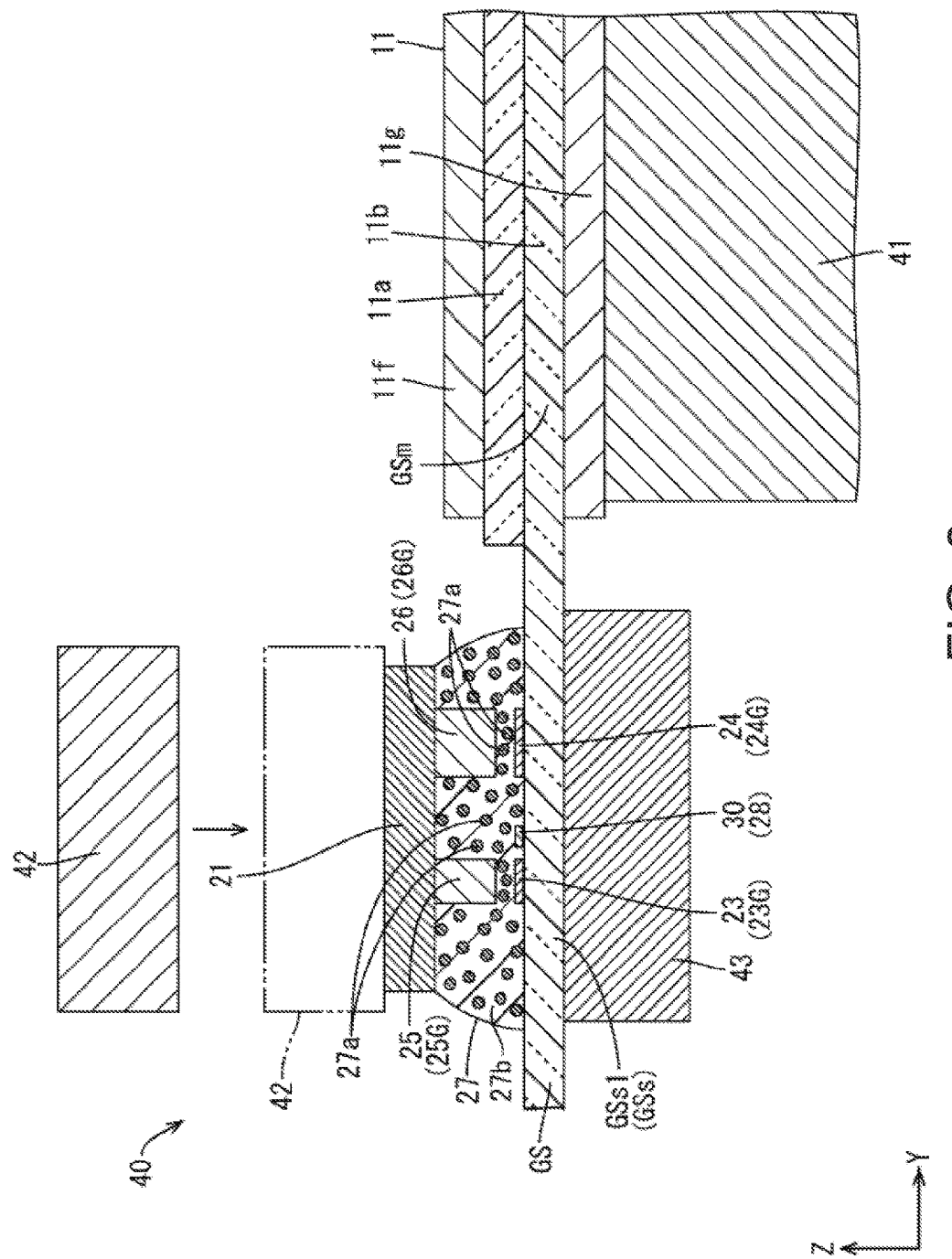
FIG. 8 is a cross-sectional view along the line A-A of FIG. 4 and shows a state in which a heat supply part has been heated by a heating unit in a stage prior to pressure being applied by a pressurizing unit of the driver mounting device.
Figure 9:
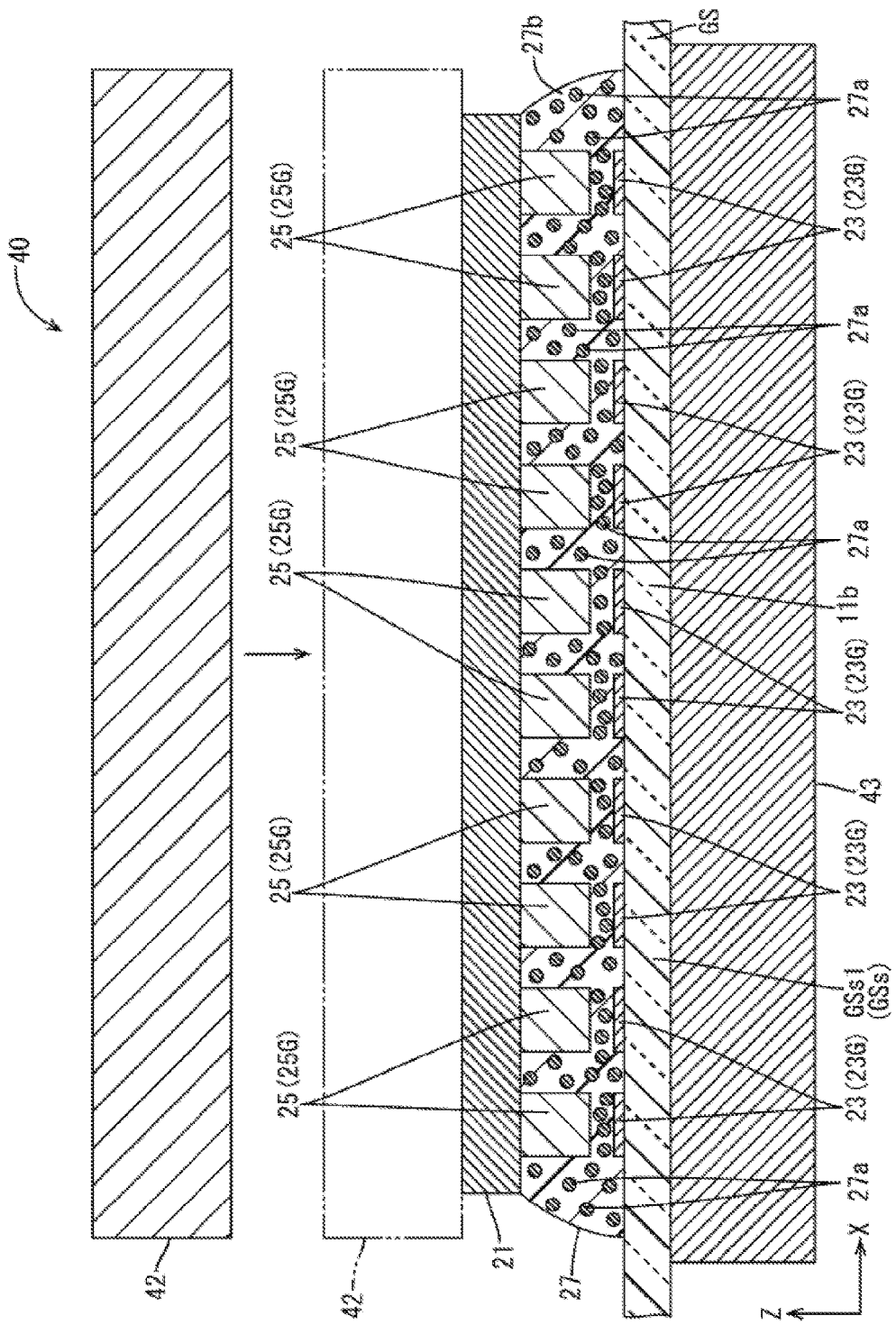
FIG. 9 is a cross-sectional view along the line B-B of FIG. 4 and shows a state in which a heat supply part has been heated by a heating unit in a stage prior to pressure being applied by a pressurizing unit of the driver mounting device.
Figure 10:
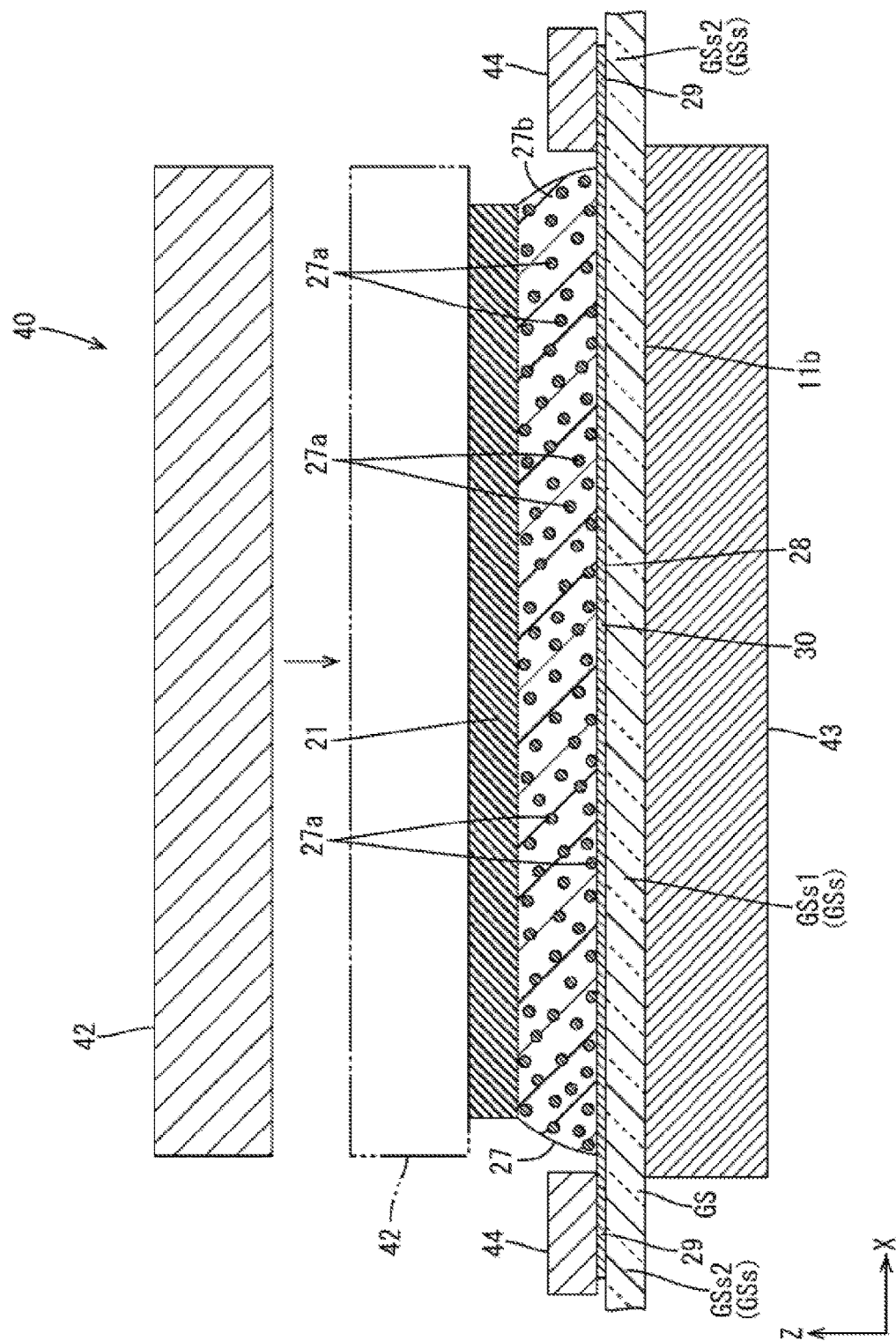
FIG. 10 is a cross-sectional view along the line C-C of FIG. 4 and shows a state in which a heat supply part has been heated by a heating unit in a stage prior to pressure being applied by a pressurizing unit of the driver mounting device.
Figure 11:
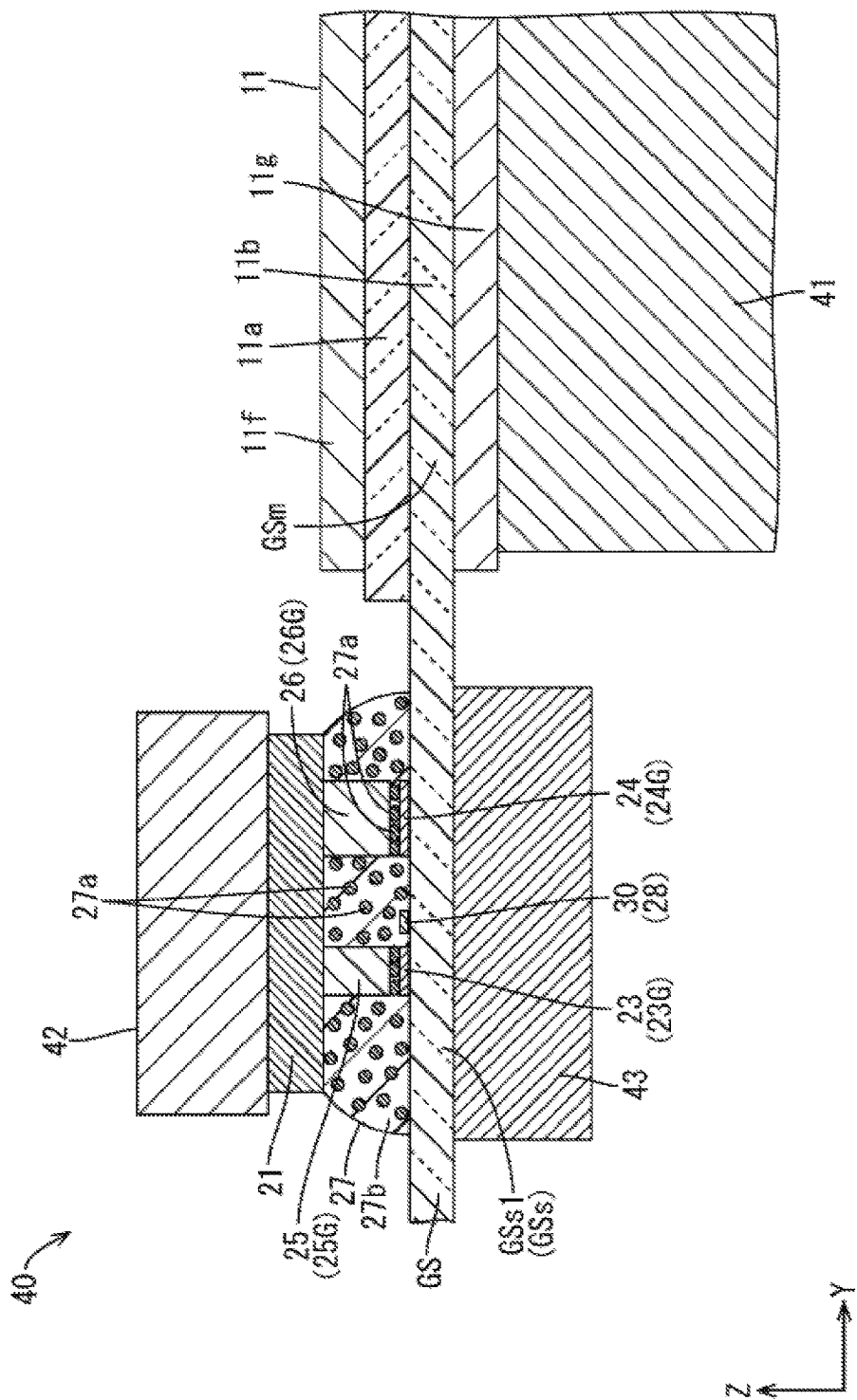
FIG. 11 is a cross-sectional view along the line A-A in FIG. 4 and shows a state in which a driver has been mounted by the pressurizing unit of the driver mounting device applying pressure to the driver.
Figure 12:
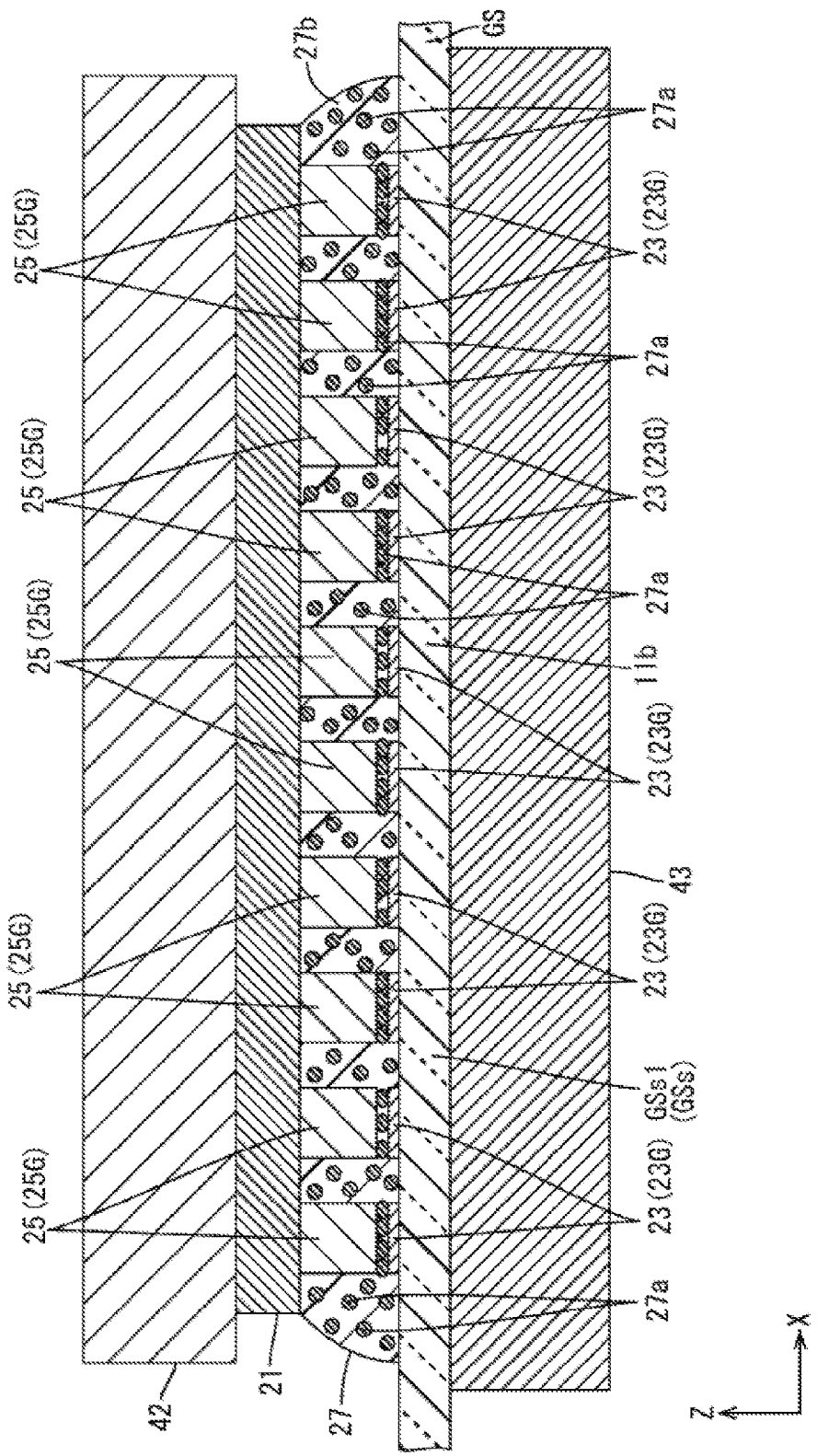
FIG. 12 is a cross-sectional view along the line B-B in FIG. 4 and shows a state in which a driver has been mounted by the pressurizing unit of the driver mounting device applying pressure to the driver.
Figure 13:
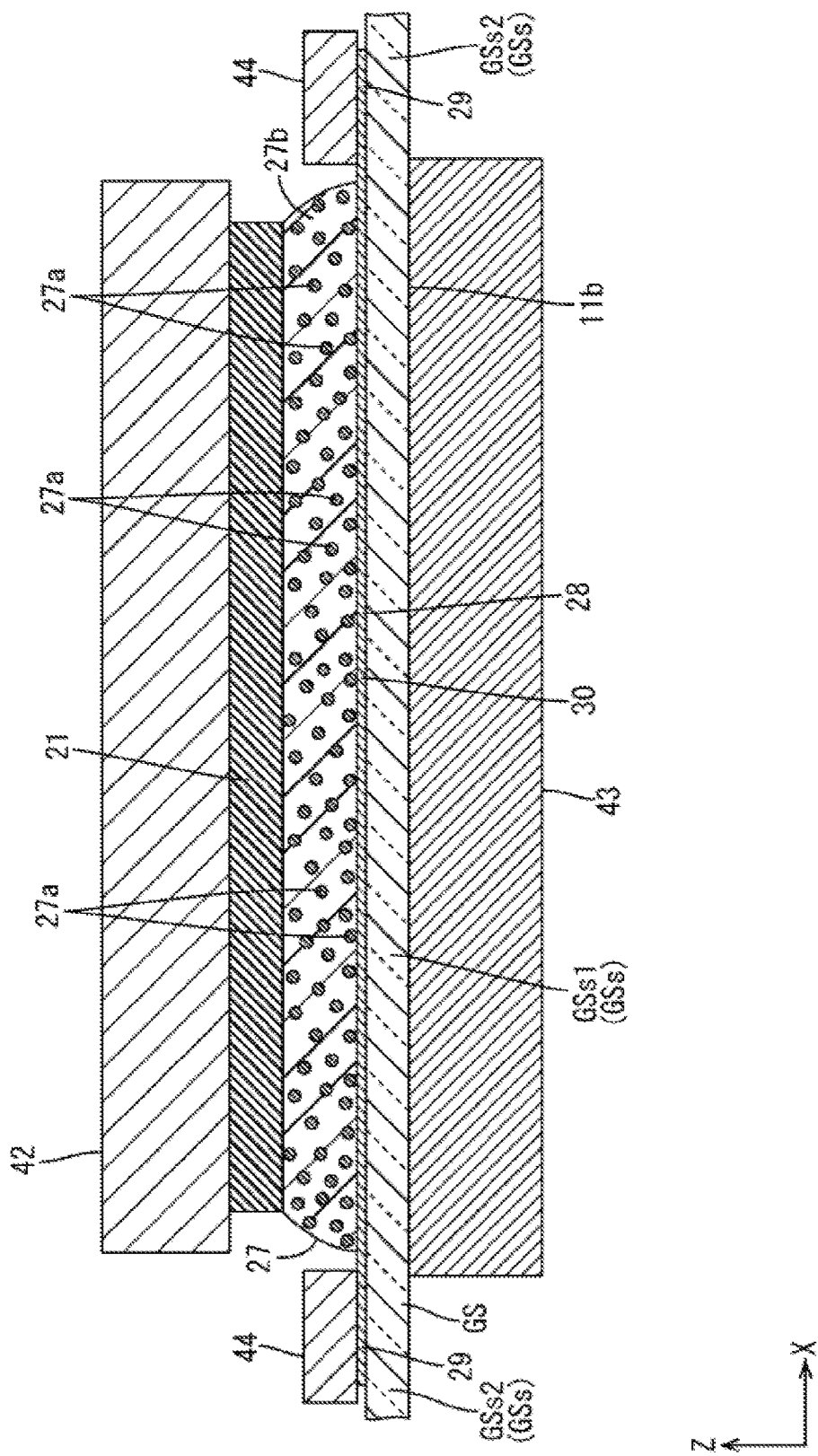
FIG. 13 is a cross-sectional view along the line C-C in FIG. 4 and shows a state in which a driver has been mounted by the pressurizing unit of the driver mounting device applying pressure to the driver.

Next, a configuration of the driver mounting device 40 used during manufacturing of the array substrate 11b having the above-mentioned configuration will be described. As shown in FIGS. 8 to 10, the driver mounting device 40 includes a substrate holding unit 41 that holds the substrate main section GSm of the glass substrate GS forming a portion of the array substrate 11b, a substrate support unit 43 that supports the substrate side section GSs of the glass substrate GS forming a portion of the array substrate 11b, a pressurizing unit 42 that applies pressure to the driver 21 from the side opposite to the substrate support unit 43, and a heating unit 44 (heating activation unit) that heats the heat supply part 28 disposed on the substrate side section GSs. Of these, the substrate support unit 43 is fixed in place in the Z-axis direction or namely the overlap direction of the glass substrate GS and driver 21, whereas the pressurizing unit 42 can be moved closer to the substrate support unit 43 in the Z-axis direction (overlap direction), which makes it possible for the pressurizing unit 42 In FIGS. 8 to 10, the solid line shows the pressurizing unit 42 in a pre-pressurization state, and the double-dashed line shows the pressurizing unit 42 contacting the driver 21 during pressurization.

As shown in FIGS. 8 and 9, the substrate holding unit 41 supports the substrate main section GSm of the glass substrate GS forming a portion of the array substrate 11b while being vacuum adhered thereto, thereby making it possible to hold the glass substrate GS. The size of the substrate holding unit 41 in a plan view is approximately the same as the substrate main section GSm of the glass substrate GS forming a portion of the array substrate 11b, and this makes it possible for approximately all of the substrate main section GSm to be held. Furthermore, the substrate holding unit 41 does not vacuum adhere directly to the glass substrate GS forming a portion of the array substrate 11b, but rather on the back polarizing plate 11g attached to the array substrate 11b, thereby indirectly holding the glass substrate GS.

As shown in FIGS. 8 and 9, the substrate support unit 43 is arranged on the back side of the glass substrate GS forming a portion of the array substrate 11b or namely the side opposite to the driver 21, and is arranged on the driver 21 with the substrate side section GSs (primarily the driver mounting section GSs1) of the glass substrate GS interposed (sandwiched) therebetween. The substrate support unit 43 supports the substrate side section GSs from the back side in the Z-axis direction, which makes it possible for the pressure applied by the pressurizing unit 42 to the driver 21 to be received via the substrate side section GSs. The size of the substrate support unit 43 in a plan view is greater than the driver 21, which makes it possible for the pressure to be applied to the driver 21 to be favorably received via the substrate side section GSs. The plan view shape of the substrate support unit 43 is a horizontally long quadrangular shape similar to that of the driver 21, and the lengthwise direction of the substrate support unit 43 matches the X-axis direction and the widthwise direction matches the Y-axis direction. The substrate support unit 43 is preferably made of metal in order to ensure sufficient mechanical strength. The substrate support unit 43 can receive the substrate side section GSs of the glass substrate GS by the support surface of the substrate support unit making surface-to-surface contact with the outer surface of the glass substrate GS.

As shown in FIGS. 8 and 9, the pressurizing unit 42 is disposed on the front side of the driver 21, which is placed on the array substrate 11b, in the Z-axis direction, or in other words on the side opposite to the glass substrate GS, and is arranged on the substrate support unit 43 with the substrate side section GSs (primarily the driver mounting section GSs1) of the glass substrate GS and the driver 21 interposed (sandwiched) therebetween. The pressurizing unit 42 is supported by a lifting/lowering device (not shown) so as to be capable of being lifted/lowered along the Z-axis direction (the overlap direction of the glass substrate GS and driver 21; the direction normal to the surface of the glass substrate GS), and thus the pressurizing unit 42 can be displaced along the Z-axis direction relative to the driver 21, substrate side section GSs, and substrate support unit 43 so as to be close to or separated from these. The pressurizing unit 42 can apply a prescribed pressure to the substrate side section GSs and driver 21 sandwiched between the pressurizing unit and the substrate support unit 43. The pressurizing force applied to the driver 21 by the pressurizing unit 42 crushes and flattens the conductive particles 27a included in the anisotropic conductive material 27 between the terminals 25 and 26 on the driver 21 side and the terminals 23 and 24 on the array substrate 11b side, thereby electrically connecting the terminals 23 to 26. The plan view shape of the pressurizing unit 42 is a horizontally long quadrangular shape similar to that of the driver 21, and the lengthwise direction of the pressurizing unit 42 matches the X-axis direction and the widthwise direction matches the Y-axis direction. The size of the pressurizing unit 42 in a plan view is greater than the driver 21 and is approximately the same size as the substrate support unit 43, which allows for pressure to be efficiently applied to the driver 21. The pressurizing unit 42 is made entirely of metal, and thus has excellent mechanical strength, allowing for efficient transferal of pressure to the driver 21. Furthermore, due to the pressurizing unit 42 being made of metal, the pressurizing surface of the pressurizing unit 42 that applies pressure to the driver 21 is processed with high precision and is sufficiently flat. This allows the pressurizing surface of the pressurizing unit 42 to have closely adhered surface-to-surface contact with the outer surface of the driver 21, which more efficiently transfers pressure.

As shown in FIGS. 4 and 10, the heating unit 44 is disposed in the Z-axis direction on the front side of the heat supply part 28, which itself is disposed on the driver non-overlapping section GSs2 of the substrate side section GSs on the glass substrate GS of the array substrate 11b, or in other words, the heating unit 44 is disposed on the same side as the pressurizing unit 42 (the side opposite to the substrate support unit 43). This heating unit 44, in a similar manner to the pressurizing unit 42, is supported by a lifting/lowering device (not shown) so as to be capable of being lifted/lowered along the Z-axis direction, and thus the heating unit 44 can be displaced in the Z-axis direction relative to the heat supply part 28, driver non-overlapping section GSs2, and substrate support unit 43 so as to be close to or separated from these. The heating unit 44 has a heater embedded therein as a heating means; thus, the heated section 29 can be heated by being contacted by the heat supply part 28. The plan view shape of the heating unit 44 is a horizontally long quadrangular shape similar to that of the heated section 29, and the lengthwise direction of the heating unit 44 matches the X-axis direction and the widthwise direction matches the Y-axis direction. The size of the heating unit 44 in a plan view is greater than the heated section 29, and thus it is possible to have efficient heat transfer by heating the entire heated section 29. The installation amount of the heating unit 44 is two, which is the same as the heated section 29, and this allows the two heated sections 29 to be respectively heated, thus enabling transfer of heat to the heat transfer section 30 from both sides in the extension direction thereof. At least the portion of the heating unit 44 contacting the heated section 29 is made of metal, which gives the heating unit 44 excellent thermal conductivity and enables efficient supply of heat to the heated section 29. In FIG. 4, the plan view shape of the heating unit 44 is shown by the double-dashed line.

Next, a method of manufacturing a liquid crystal panel (array substrate 11b) using the driver mounting device 40 with the above-mentioned configuration will be explained. The method of manufacturing the liquid crystal panel 11 includes at least: a structure formation step including forming, on the inner surface of the corresponding glass substrates GS respectively forming the CF substrate 11a and array substrate 11b, various types of structures by stacking various types of metal films and insulating films via a known photolithography method or the like; a substrate bonding step including bonding the glass substrate GS constituting the CF substrate 11a and the glass substrate GS constituting the array substrate 11b; a polarizing plate attachment step including attaching the respective polarizing plates 11f and 11g to the outer surface of the corresponding glass substrates GS; and a driver mounting step (mounting step) including using the driver mounting device 40 to mount the driver 21 on the driver mounting section GSs1 of the glass substrate GS constituting the array substrate 11b. Among these steps, the structure formation step includes at least a heat supply part installation step including providing the heat supply part 28 on the substrate side section GSs of the glass substrate GS constituting the array substrate 11b. The driver mounting step includes at least: an anisotropic conductive material arrangement step including arranging the anisotropic conductive material 27 on the driver mounting section GSs1 of the glass substrate GS constituting the array substrate 11b; a driver arrangement step (component arrangement step) including arranging the driver 21 on the anisotropic conductive material 27 that is on the driver mounting section GSs1; a heat supply step including supplying heat to the heat supply part 28; and a pressurizing step including applying pressure towards the glass substrate GS to the driver 21. Furthermore, in addition to the steps described above, the method of manufacturing the liquid crystal panel 11 also includes a flexible substrate mounting step for mounting the flexible substrate 13 on the liquid crystal panel 11, and the like. Hereinafter, the heat supply part installation step and driver mounting step related to the array substrate 11 will be described in detail.

In the heat supply part installation step included in the structure formation step, the heat supply part 28 made of a metal material is patterned by photolithography on the inner surface of the glass substrate GS constituting the array substrate 11b. This heat supply part 28 is made of the same material as the gate wiring lines and source wiring lines and the same material as the panel-side input terminals 23 and panel-side output terminals 24; thus, in the step of installing the gate wiring lines or source wiring lines having the same material as the heat supply part, the heat supply part can be patterned at the same time as the panel-side input terminals 23 and panel-side output terminals 24. In other words, the heat supply part installation step includes simultaneously performing the step of installing the gate wiring lines or source wiring lines having the same material as the heat supply part and the step of installing the panel-side input terminals 23 and panel-side output terminals 24. This reduces manufacturing costs by shortening takt time related to manufacturing and the like.

As shown in FIGS. 8 and 9, while the driver mounting step is being performed, the substrate main section GSm of the glass substrate GS constituting the array substrate 11b is held by the substrate holding unit 41 forming a portion of the driver mounting device 40, whereas the substrate side section GSs is supported from behind by the substrate support unit 43. In the anisotropic conductive material arrangement step included in the driver mounting step, the anisotropic conductive material 27 is arranged on the driver mounting section GSs1 of the glass substrate GS constituting the array substrate 11b. In the driver arrangement step, which is performed next, the driver 21 is arranged on top of the anisotropic conductive material 27 that is on the driver mounting section GSs1. Thereafter, the heating step is performed ahead of pressurizing step. In the heating step, the pair of heating units 44 included in the driver mounting device 40 are lowered along the Z-axis direction so as to be close to the pair of heated sections 29 of the heat supply part 28. As shown in FIG. 10, the pair of heating units 44 contact the pair of heated sections 29 from the front, and in this state the respective heating units 44 heat the corresponding heated sections 29. The heat supplied to the respective heated sections 29 is transferred to the center of the heat transfer section 30 from both sides of the heat transfer section in the extension direction thereof, thereby evenly supplying heat to the anisotropic conductive material 27 in the lengthwise direction thereof. This facilitates thermosetting of the binder 27b constituting the anisotropic conductive material 27. At such time, the heat transferred from the heat transfer section 30 is preferentially supplied to the binder 27b interposed between the relatively closely arranged output terminals 24 and 26, and thus accelerating hardening of the binder 27b due to the larger amount of heat. The amount of the binder 27b interposed between the output terminals 24 and 26 is greater than the amount interposed between the input terminals 23 and 25; therefore, the amount of heat required for hardening is high, and thus the hardening progresses favorably.

The pressurizing step starts after a prescribed amount of time has passed since the start of the heating step. Accordingly, when the pressurizing step has started, the binder 27b of the anisotropic conductive material 27 has already hardened to a certain extent. In the pressurizing step, the pressurizing unit 42 is lowered from the state shown in FIGS. 8 and 9 along the Z-axis direction so as to approach the driver 21. Then, as shown by the double-dashed line in FIGS. 8 and 9, the pressurizing unit 42 is moved down even more from the state of contact with the driver 21, thereby exerting pressure on the driver 21, which in turn exerts pressure on the anisotropic conductive material 27 interposed between the driver 21 and the driver mounting section GSs1. At such time, the binder 27b has already hardened to a certain extent, and the anisotropic conductive material 27 can thus receive the pressure exerted by the pressurizing unit 42 along with the conductive particles 27a. If the hardening of the binder were to be insufficient, the pressure from the pressurizing unit 42 would be concentrated on the conductive particles, which poses a risk that the conductive particles would eat into the driver 21 side terminals 25 and 26 made of soft metal and not become flat, thus leading to a worsening of conductive reliability among the array substrate 11b side terminals 23 and 24. In this regard, the pressure from the pressurizing unit 42 being received by the sufficiently hardened binder 27b as described above can avoid pressure being concentrated on the conductive particles 27a and can transform the conductive particles 27a into a flat shape via the pressure. Accordingly, the terminals 25 and 26 on the driver 21 side and the terminals 23 and 24 on the array substrate 11b side can have favorable conductive connections via the flat-shaped conductive particles 27a, thus providing excellent conductive reliability. The application of pressure by the pressurizer 42 is performed for a prescribed period of time to mount the driver 21 on the driver mounting section GSs1 and to electrically connect the terminals 23 to 26. The heating by the heating unit 44 is set to end before or at the same time that the application of pressure by the pressurizing unit 42 ends.

Figure 14:
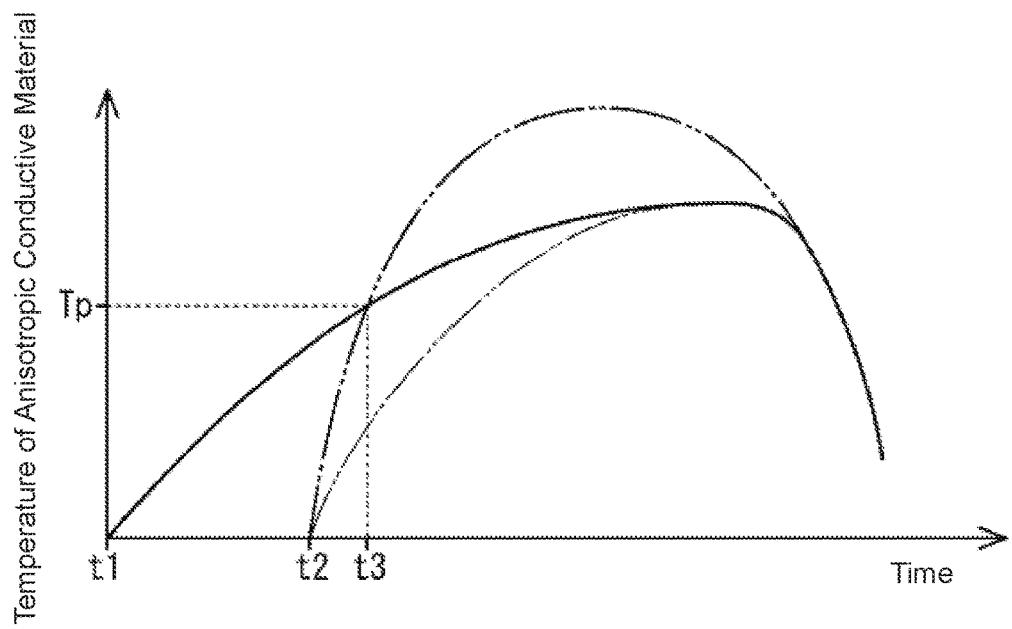
FIG. 14 is a graph showing temperature changes of an anisotropic conductive material over time since the start of heating.

During the heating step and pressurization step of the driver mounting step described above, the time that passed since the start of heating by the heating unit 44, and the temperature of the anisotropic conductive material 27 are each measured, with the results shown in FIG. 14. In FIG. 14, the horizontal axis represents the time that has passed since the start of heating by the heating unit 44, and the vertical axis represents the temperature of the anisotropic conductive material 27. According to FIG. 14, the timing t1 at which the heating unit 44 starts heating the heat supply part 28 is before the timing t2 at which the pressurizing unit 42 starts applying pressure to the driver 21; thus, even if the temperature of the anisotropic conductive material 27 is gradually increasing up until the timing t2 at which pressurization of the driver 21 starts, the anisotropic conductive material 27 can reach a prescribed temperature (hereinafter, "pressurizable temperature Tp") with the binder 27b having already been hardened to a certain extent by the time that pressurization of the driver 21 starts and pressure is exerted on the conductive particles 27a (hereinafter, "timing t3 at which pressurization of the conductive particles starts"). In other words, ensuring sufficient time between the timing t1 at which heating starts and the timing t2 at which pressurization of the driver 21 starts makes it unnecessary to rapidly heat the anisotropic conductive material 27. "Pressurizable temperature Tp" means a temperature at which the thermosetting of the binder 27b has progressed to a level where the pressure exerted by the pressurizing unit 42 can be received by both the conductive particles 27a and the binder 27b and the pressure exerted on the conductive particles 27a can be dispersed.

In contrast, conventionally the pressurizing unit or support substrate unit has the heating function, and thus the start of pressurization of the driver and start of heating are performed at the same time, resulting in the anisotropic conductive material needing to reach pressurizable temperature Tp immediately after the start of pressurizing of the driver, which requires rapid heating. At such time, if rapid heating is performed to cause the anisotropic conductive material to reach pressurizable temperature Tp, then as shown by the bold double-dash line in FIG. 14, the amount of heat supplied becomes excessive, and at timing t3 when pressurization of the conductive particles start the anisotropic conductive material reaches a temperature that exceeds the pressurizable temperature Tp. If this happens, the excessive amount of heat will be exerted on the polarizing plate 11g attached to the glass substrate GS or other members, which could cause degradation of the optical performance etc. thereof. On the other hand, if rapid heating is not performed in order to avoid the above, then as shown by the thin double-dash line in FIG. 14, the temperature of the anisotropic conductive material no longer reaches the pressurizable temperature Tp at timing t3 when pressurization of the conductive particles begins, and thus there is a risk that pressure will be concentrated on the conductive particles and conductive reliability will be worsened. In this regard, as described above, having the heating unit 44 heat the heat supply part 28 provided on the array substrate 11b before the pressurization unit 42 applies pressure to the driver 21 can make the temperature of the anisotropic conductive material 27 reach the pressurizable temperature Tp at timing t3 when pressurization of the conductive particles begins without having to rapidly heat the anisotropic conductive material 27, thus ensuring a high connective reliability among the terminals 23 to 26 of the driver 21 and driver mounting section GSs1 via the conductive particles 27a and thereby inhibiting performance degradation of members such as the polarizing plate 11g.

As described above, the array substrate (mounting substrate) 11b of the present embodiment includes a driver (component) 21, the glass substrate (substrate) GS including the driver mounting section (component mounting section) GSs1 where the driver 21 is mounted, the anisotropic conductive material 27 that is interposed between the driver 21 and driver mounting section GSs1 so as to electrically connect both and that at least includes the binder 27b made of a thermosetting resin and the conductive particles 27a in the binder 27b, and the heat supply part 28 provided on at least the driver mounting section GSs1 of the glass substrate GS for supplying heat to the anisotropic conductive material 27.

With this configuration, when the driver 21 is to be mounted on the driver mounting section GSs1 of the glass substrate GS, the driver 21 is arranged while the anisotropic conductive member 27 is interposed between the driver mounting section GSs1 and the driver, and in this state the binder 27b of the anisotropic conductive materially 27 is thermoset and pressure is applied to the driver 21. This mounts the driver 21 relative to the driver mounting section GSs1 such that both are electrically connected to each other by the anisotropic conductive material 27.

The driver mounting section GSs1 has provided thereon the heat supply part 28 for supplying heat to the anisotropic conductive material 27, and thus there is a higher degree of freedom regarding the timing at which heat is supplied to the anisotropic conductive material 27 as compared to conventional cases in which heat is supplied to the anisotropic conductive material and pressure is applied to the driver at the same time. Accordingly, when mounting the driver 21, it is possible to facilitate hardening of the binder 27b by the heat supply parts 28 supplying heat to the anisotropic conductive material 27 prior to pressure being applied to the driver 21, for example. This makes it possible, when pressure is to be applied to the driver 21, for the binder 27b to also receive the pressure being exerted on the conductive particles 27a, as the binder 27b has already been hardened to a certain extent; therefore, this avoids the pressure being concentrated only on the conductive particles 27a, and thus forms favorable connections between the driver 21 and driver mounting section GSs1 via the conductive particles 27a. Moreover, a higher degree of freedom regarding the timing at which heat is supplied to the anisotropic conductive material 27 makes it unnecessary to rapidly supply heat in order to harden the binder 27b, which makes the glass substrate GS less susceptible to being overheated and inhibits the occurrence of performance degradation caused by heat.

Furthermore, the heat supply part 28 is constituted by the heated section 29 that is heated from outside and disposed on the driver non-overlapping section (component non-overlapping section) GSs2 of the glass substrate GS that does not overlap the driver 21 in a plan view, and the heat transfer section 30 that is disposed on at least the driver mounting section GSs1 of the glass substrate GS, which is an area overlapping the driver 21 in a plan view, and that transfers heat from the heated section 29 to the anisotropic conductive material 27. With this configuration, when the heated section 29 is heated from outside, the heat is transferred to the anisotropic conductive material 27 via the heat transfer section 30, thereby promoting thermosetting of the binder 27b. The heated section 29 being disposed on the driver non-overlapping section GSs2 of the glass substrate GS that does not overlap the driver 21 in a plan view makes the reception of heat from outside unsusceptible to being hindered by the driver 21. The heat transfer section 30 being disposed on the driver overlapping section GSs1 of the glass substrate GS, which is an area overlapping the driver 21 in a plan view, makes it possible to efficiently supply heat to the anisotropic conductive material 27.

Moreover, the heat supply part 28 is constituted by the heat transfer section 30 being provided so as to extend across the driver mounting section GSs1 and the heated section 29 being provided in a pair so as to continue from both ends of the heat transfer section 30 in the extension direction thereof. With this configuration, by heating the respective pair of heated sections 29 continuing from both ends of the heat transfer section 30 that goes across the driver mounting section GSs1, heat is transferred towards the center of the heat transfer section 30 from both ends of the heat transfer section in the extension direction thereof. This makes the supply of heat to the anisotropic conductive material 27 less susceptible to being uneven in the extension direction of the heat transfer section 30, which in turn makes connection defects less susceptible to occurring between the driver 21 and the driver mounting section GSs1.

Furthermore, the driver mounting section GSs1 includes the panel-side input terminal group (first input terminal group) 23G constituted by the plurality of panel-side input terminals (first input terminals) 23 arranged next to one another, and the panel-side output terminal group (second output terminal group) 24G arranged next to one another parallel to the arrangement direction of the plurality of panel-side input terminals 23 and having a total area that is greater than the total area of the panel-side input terminal group 23G, and the heat supply part 28 includes at least the units arranged closer to the panel-side output terminal group 24G than the panel-side input terminal group 23G. In the panel-side output terminal group 24G, which has a larger total area than the panel-side input terminal group 23G, there is a large amount of the binder 27b of the anisotropic conductive material 27 interposed between the plurality of panel-side output terminals 24 and driver 21, and thus there tends to be a greater amount of heat required to harden the binder 27b as compared to the panel-side input terminal group 23G. In this regard, as described above, the heat supply part 28 includes at least the units closer to the panel-side output terminal group 24G than the panel-side input terminal group 23G, which further facilitates favorable thermosetting of the binder 27b of the anisotropic conductive material 27 near the panel-side output terminal group 24G. This allows favorable thermosetting of the binder 27b interposed between the plurality of panel-side output terminals 24 and the driver 21, which makes it possible to have a good connection between the panel-side output terminal group 24G and the driver 21.

Furthermore, the panel-side input terminal group 23G receives the input signals for the driver 21, whereas the panel-side output terminal group 24G receives the output signals from the driver 21. With this configuration, the total area of the panel-side output terminal group 24G is greater than the total area of the panel-side input terminal group 23G, which is suitable for outputting more output signals. If the array substrate 11b described above is used in the liquid crystal display device (display device) 10, for example, this configuration is suitable for making the liquid crystal display device 10 a high-definition device.

Furthermore, the driver mounting section GSs1 includes the panel-side input terminals (input terminals) 23 that receive input signals for the driver 21, and the panel-side output terminals (output terminals) 24 that are disposed with gaps therebetween between the panel-side input terminals 23 and that receive output signals from the driver 21, and the heat supply part 28 is provided so as to pass between at least the panel-side input terminals 23 and panel-side output terminals 24 in the driver mounting section GSs1. With this configuration, the binder 27b of the anisotropic conductive material 27 interposed between the panel-side input terminals 23 and driver 21 and the binder 27b interposed between the panel-side output terminals 24 and driver 21 can be suitably thermoset by the heat supplied from the heat supply part 28. This enables a favorable connection of both the panel-side input terminals 23 and panel-side output terminals 24 to the driver 21.

Moreover, the heat supply part 28 is made of a material having a higher thermal conductivity than that of the glass substrate GS. With this configuration, it is possible for the heat supply part 28 made of the material having a higher thermal conductivity than that of the glass substrate GS to efficiently supply heat to the anisotropic conductive material 27, which allows for more favorable facilitation of the thermosetting of the binder 27b.

Furthermore, the driver mounting section GSs1 includes the panel-side input terminals 23 that receive input signals for the driver 21, and the panel-side output terminals 24 that receive output signals from the driver 21, and the heat supply part 28 is made of the same material as the panel-side input terminals 23 and panel-side output terminals 24. With this configuration, during manufacturing of the array substrate 11b, the heat supply part 28 can be provided in the step of providing the panel-side input terminals 23 and panel-side output terminals 24 on the glass substrate GS. There are no special steps required to provide the heat supply part 28, and thus it is possible to reduce manufacturing costs.

Moreover, a method of manufacturing the array substrate 11b of the present embodiment includes a heat supply part installation step of providing the heat supply part 28 on at least the driver mounting section GSs1 of the glass substrate GS where the driver 21 is mounted, an anisotropic conductive material arrangement step of arranging the anisotropic conductive material 27 constituted by at least the binder 27b made of a thermosetting resin and the conductive particles 27a in the binder 27b, a driver arrangement step (component arrangement step) of arranging the driver 21 on the driver mounting section GSs1, a heat supply step of supplying heat to the heat supply part 28, and a pressurizing step of applying pressure to the driver 21 via the glass substrate GS.

With this method of manufacturing the array substrate 11b, the heat supply part installation step provides the heat supply part 28 on at least the driver mounting section GSs1 of the glass substrate GS where the driver 21 is mounted, and the anisotropic conductive material arrangement step provides the anisotropic conductive material 27 on the driver mounting section GSs1. Then, when the driver 21 has been arranged on the driver mounting section GSs1 via the driver arrangement step, heat is supplied to the heating unit 28 in the heat supply step. The heat supply step is independent of the pressurizing step for applying pressure to the driver 21 via the glass substrate GS, and thus there is a high degree of freedom regarding the timing at which heat is supplied to the anisotropic conductive material 27. Accordingly, it is possible to facilitate thermosetting of the binder 27b such as by performing the heat supply step before the pressurizing step, for example. Due to this, during the pressurizing step, the binder 27b has already been hardened to a certain extent, and the pressure exerted on the conductive particles 27a can also be received by the binder 27b, thus preventing the pressure from being concentrated only on the conductive particles 27a, and thereby forming a favorable connection between the driver 21 and the driver mounting section GSs1 via the conductive particles 27a. Moreover, a higher degree of freedom regarding the timing at which heat is supplied to the anisotropic conductive material 27 makes it unnecessary to rapidly supply heat in order to harden the binder 27b, which makes the glass substrate GS less susceptible to being overheated and inhibits the occurrence of performance degradation caused by heat.

Furthermore, the driver mounting device (manufacturing device) 40 used for the manufacturing of the array substrate 11b of the present embodiment includes: the substrate support unit 43 that supports the driver mounting section GSs1 of the glass substrate GS where the driver 21 is mounted; the pressurizing unit 42 that is disposed on the side of the glass substrate GS opposite to the substrate support section 43 and that applies pressure to the driver 21 interposed between the pressurizing unit 42 and the anisotropic conductive material 27, which is between the driver mounting section GSs1 and the pressurizing unit 42 and constituted by the binder 27b made of the thermosetting resin and the conductive particles 27a in the binder 27b; and the heating unit 44 that is provided on at least the driver mounting section GSs1 of the glass substrate GS and that heats the heat supply part 28 that supplies heat to the anisotropic conductive material 27.

With this manufacturing device for the array substrate 11b, when the driver 21 is to be mounted on the driver mounting section GSs1 of the glass substrate GS, the substrate support unit 43 supports the driver mounting section GSs1 of the glass substrate GS where the driver 21 is mounted, and in this state the heating unit 44 heats the heat supply part 28 in order to thermoset the binder 27b of the anisotropic conductive material 27 and the pressurizing unit 42 applies pressure to the driver 21 interposed between the driver mounting section GSs1 and the pressurizing unit 42. This mounts the driver 21 relative to the driver mounting section GSs1 such that both are electrically connected to each other by the anisotropic conductive material 27.

The heating unit 44 that heats the heat supply part 28 is provided separately from the substrate support unit 43 and the pressurizing unit 42, and thus there is a greater degree of freedom regarding the timing at which heat is supplied to the anisotropic conductive material 27 as compared to conventional cases where heat is supplied to the anisotropic conductive material and pressure is applied to the driver at the same time. Accordingly, during mounting of the driver 21, it is possible to facilitate thermosetting of the binder 27b by the heating unit 44 heating the heat supply part 28 to supply heat to the anisotropic conductive material 27 before pressure is applied to the driver 21 by the pressurizing unit 42, for example. Due to this, during the application of pressure to the driver 21 by the pressurizing unit 42, the binder 27b has already been hardened to a certain extent, and the pressure exerted on the conductive particles 27a can also be received by the binder 27b, thus preventing the pressure from being concentrated only on the conductive particles 27a, and thereby forming a favorable connection between the driver 21 and the driver mounting section GSs1 via the conductive particles 27a. Moreover, a higher degree of freedom regarding the timing at which heat is supplied to the anisotropic conductive material 27 makes it unnecessary to rapidly supply heat in order to harden the binder 27b, which makes the glass substrate GS less susceptible to being overheated and inhibits the occurrence of performance degradation caused by heat.

Embodiment 2

Embodiment 2 of the present invention will be described with reference to FIGS. 15 to 17. In Embodiment 2, the installation amount of a heat supply part 128 has been changed. Descriptions of structures, operations, and effects similar to those of Embodiment 1 will be omitted.

Figure 15:
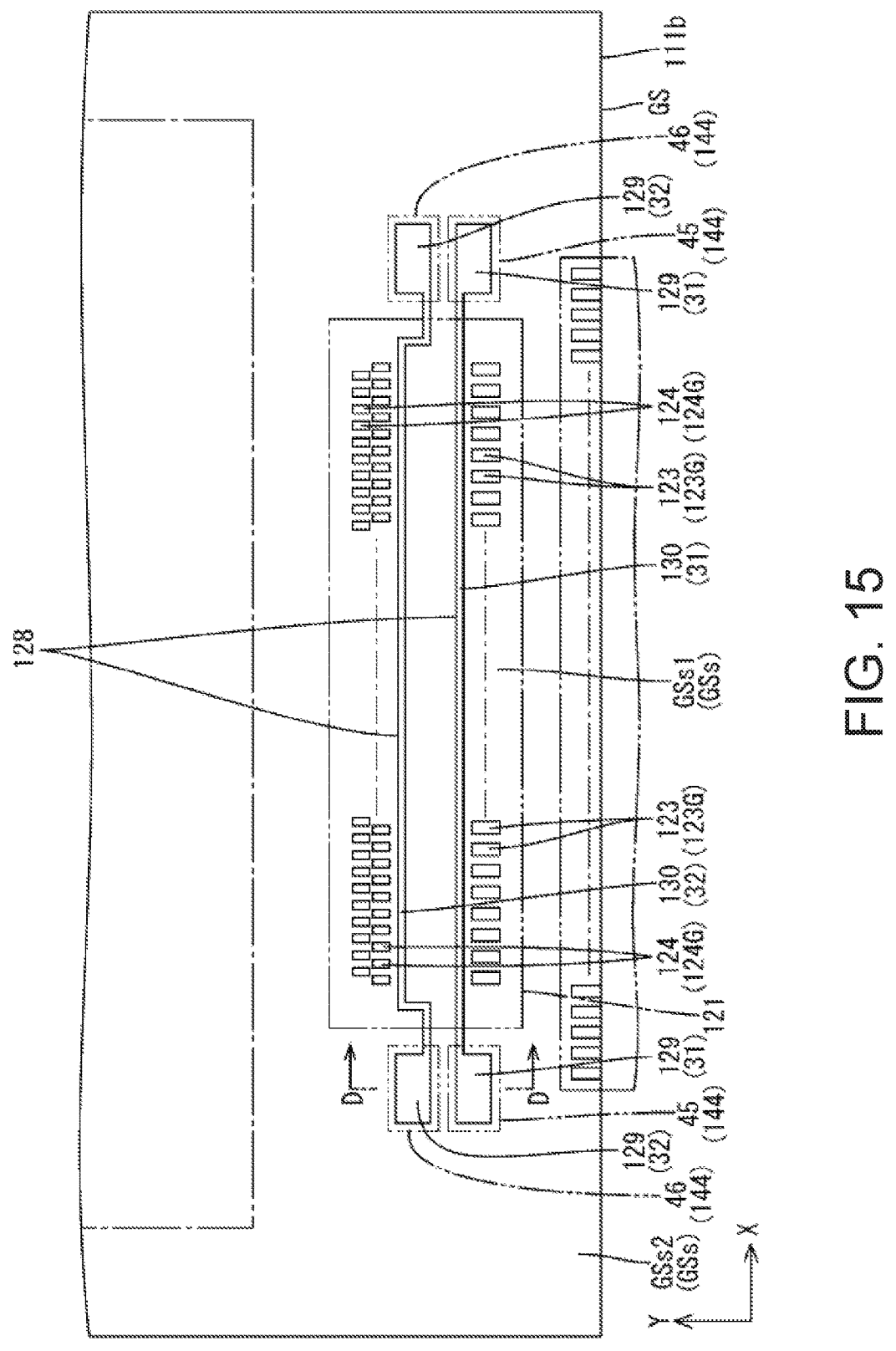

As shown in FIG. 15, two of the heat supply parts 128 of the present embodiment are provided on the substrate side section GSs on the glass substrate GS of an array substrate 111b. The heat supply parts 128 each include an input terminal-side heat supply part 31 disposed relatively close to panel-side input terminals 123, and an output terminal-side heat supply part 32 disposed relatively close to panel-side output terminals 124. Among these, the output terminal-side heat supply part 32 has a similar configuration to the heat supply part 28 described in Embodiment 1. The input terminal-side heat supply part 31 is disposed such that a heat transfer section 130 extending along the X-axis direction on the driver mounting section GSs1 passes nearer to the panel-side input terminals 123 in the Y-axis direction than the panel-side output terminals 124. The heat transfer section 130 of the input terminal-side heat supply part 31 is sandwiched in the Y-axis direction between the heat transfer section 130 of the output terminal-side heat supply part 32 and the panel-side input terminals 123 and disposed closer to the panel-side input units 123 than the heat transfer section 130 of the output terminal-side heat supply part 32. A heated section 129 of the input terminal-side heat supply part 31 is provided in a pair so as to respectively continue from both ends of the heat transfer section 130 in the extension direction thereof, and the heated sections 129 of the input terminal-side heat supply part 31 are arranged on the driver non-overlapping section GSs2 next to the heated sections 129 of the output terminal-side heat supply parts 32 in the Y-axis direction with prescribed gaps therebetween. With this configuration, the input terminal-side heat supply part 31 can preferentially supply heat to an anisotropic conductive material (not shown) interposed between the panel-side input terminals 123 and the driver 121, whereas the output terminal-side heat supply part 32 can preferentially supply heat to the isotropic conductive material interposed between the panel-side output terminals 124 and driver 121.

Figure 16:
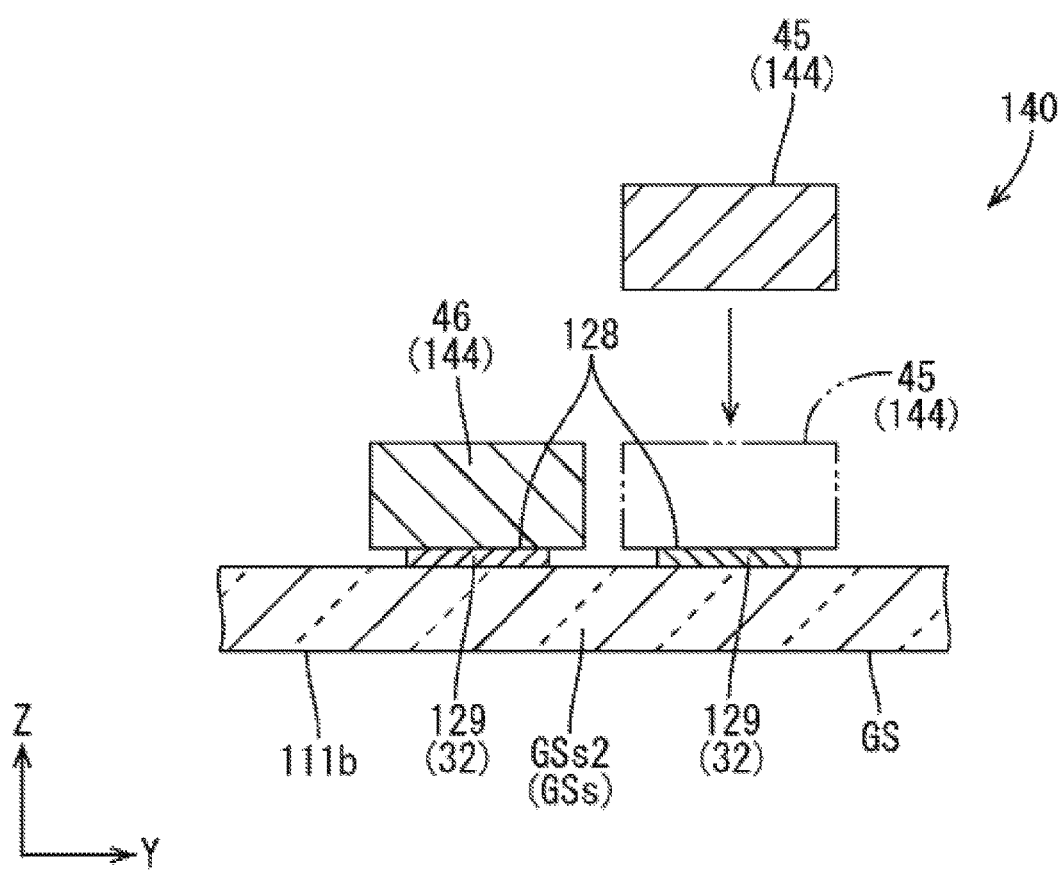
FIG. 16 is a cross-sectional view along the line D-D in FIG. 15 and explains the timing of heating by an input terminal side heating unit and output terminal side heating unit of the driver mounting device.

Meanwhile, as shown in FIGS. 15 and 16, a heating unit 144 of a driver mounting device 140 includes an input terminal-side heating unit 45 for heating the heated section 129 of the input terminal-side heat supply part 31, and an output terminal-side heating unit 46 for heating the heated section 129 of the output terminal-side heat supply part 32. The input terminal-side heating unit 45 and the output terminal-side heating unit 46 are provided in a pair so each respectively matches the heated section 129 of the corresponding input terminal-side heat supply part 31 and output terminal-side heat supply part 32. This configuration makes it possible to freely set the timing at which the input terminal-side heating unit 45 heats the heated section 129 of the input terminal-side heat supply part 31 and the timing at which the output terminal-side heating unit 46 heats the heated section 129 of the output terminal-side heat supply part 32. This allows the panel-side input terminals 123 constituting a panel-side input terminal group 123G having a relatively small total area and the panel-side output terminals 124 constituting a panel-side output terminal group 124G having a relatively large total area to more favorably connect with the respective terminals (not shown) on the driver 121 side. In FIG. 15, the input terminal-side heating units 45 and output terminal-side heating units 46 are shown by thin double-dash lines. In FIG. 16, the input terminal-side heating unit 45 in a pre-connection state with the heated section 129 of the input terminal-side heat supply part 31 is shown by the bold line, and the input terminal-side heating unit 45 in a connected state with the heated section 129 of the input terminal-side heat supply part 31 is shown by the double-dash line.

Figure 17:
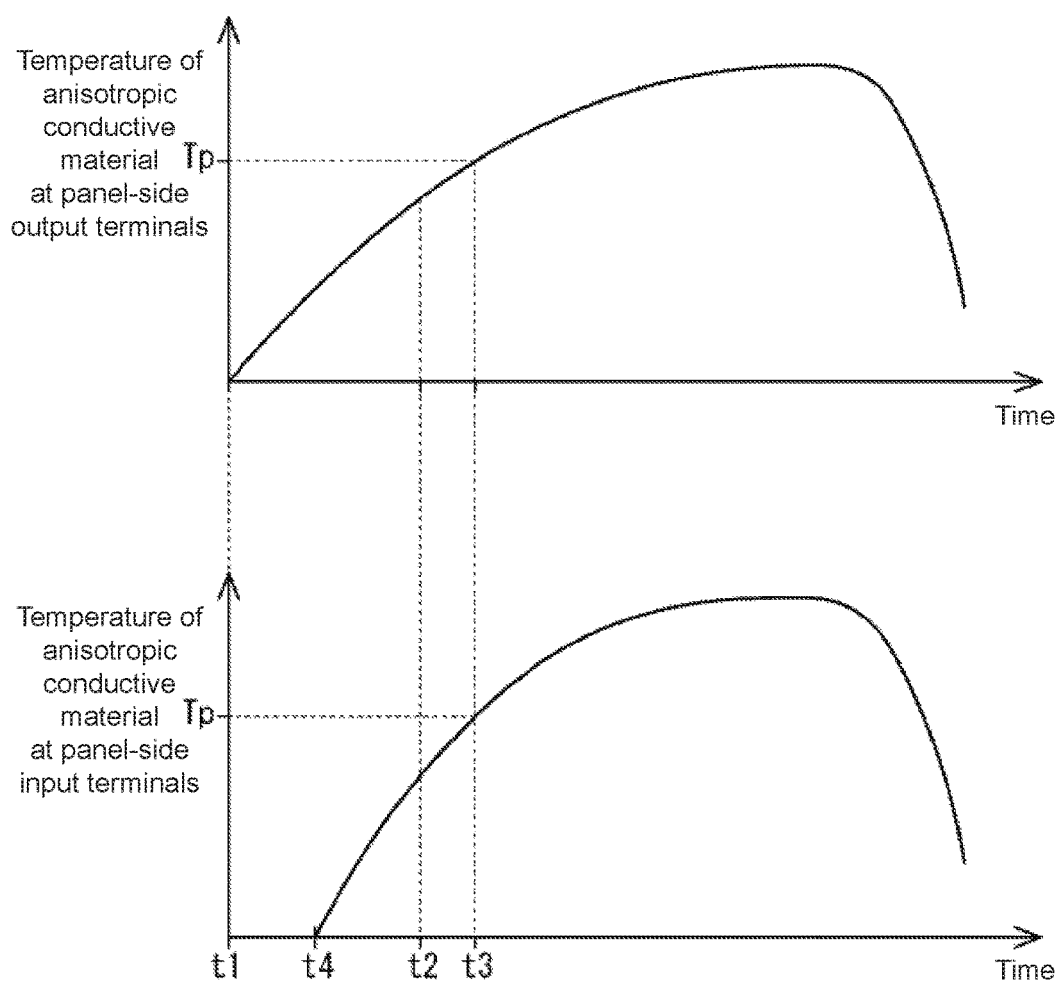
FIG. 17 is a graph showing temperature changes of an anisotropic conductive material over time since the start of heating.

During usage of the driver mounting device 140 to mount the driver 121 on the driver mounting section GSs1 of the array substrate 111b, the time that passed since the start of heating by the heating unit 144, and the temperature of the anisotropic conductive material were both measured, with the results shown in FIG. 17. FIG. 17 shows two graphs, the top of which represents change in temperature of the anisotropic conductive material on the panel-side output terminals 124 side, and the bottom of which represents change in temperature of the anisotropic conductive material on the panel-side input terminals 123 side. Specifically, the "anisotropic conductive material on the panel-side output terminals 124 side" refers to the anisotropic conductive material interposed between the panel-side output terminals 124 and the driver-side output terminals of the driver 121, for example, and the "anisotropic conductive material on the panel-side input terminals 123 side" refers to the anisotropic conductive material interposed between the panel-side input terminals 123 and the driver-side input terminals of the driver 121, for example. In FIG. 17, "t1" represents the timing at which the output terminal-side heating unit 46 has started to heat the heated section 129 of the output terminal-side heat supply part 32, whereas "t4" represents the timing at which the input terminal-side heating unit 45 has started to heat the heated section 129 of the input terminal-side heat supply part 31. In the graphs in FIG. 17, the horizontal axis represents the time that has passed since the start of heating by the heating unit 144, and the vertical axis represents the temperature of the anisotropic conductive material.

According to FIG. 17, the output terminal-side heating unit 46 contacting the heated section 129 of the output terminal-side heat supply part 32 before the input terminal-side heating unit 45 makes it so that heat is mainly supplied to the anisotropic conductive material interposed between the panel-side output terminals 124 and the driver-side output terminals of the driver 121 (see FIG. 16). As explained above in Embodiment 1, the panel-side output terminal group 124G has a relatively larger surface area than the panel-side input terminal group 123G, and thus there is a relatively larger amount of anisotropic conductive material interposed between the respective panel-side output terminals 124 and respective driver-side output terminals of the driver 121. Therefore, even if the output terminal-side heat supply part 32 supplies heat to the binder of the anisotropic conductive material interposed between the respective panel-side output terminals 124 and respective driver-side output terminals of the driver 121, the increase in temperature tends to be gradual. Accordingly, after the output terminal-side heat supply part 32 has started to supply heat, a relatively large amount of time is required for the anisotropic conductive material interposed between the respective panel-side output terminals 124 and respective driver-side output terminals of the driver 121 to reach pressurizable temperature Tp. Due to this, the supplying of heat by the output terminal-side heat supply part 32 is performed before the supplying of heat by the input terminal-side heat supply part 31. When a prescribed amount of time has passed since the supplying of heat by the output terminal-side heat supply part 32 has started, the input terminal-side heating unit 45 is made to contact the heated section 129 of the input terminal-side heat supply part 31, thereby supplying heat primarily to the anisotropic conductive material interposed between the panel-side input terminals 123 and the driver-side input terminals of the driver 121. The panel-side input terminal group 123G has a relatively small total area and a relatively small amount of anisotropic conductive material interposed between the respective panel-side input terminals 123 and respective driver-side input terminals of the driver 123, and thus the increase in temperature of the anisotropic conductive material due to heating is relatively rapid. Accordingly, the timing t4 at which the input terminal-side heating unit 45 starts to heat the input terminal-side heat supply part 31 is slower than the timing t1 at which the output terminal-side heating unit 46 starts to heat the output terminal-side heat supply part 32, but even so the anisotropic conductive material can reach pressurizable temperature Tp within a relatively short amount of time.

Upon reaching timing t3 at which pressurizing of the conductive particles starts after the pressurizing unit starts applying pressure to the driver 121 (t2), the anisotropic conductive material interposed between the panel-side output terminals 124 and driver-side output terminals of the driver 121 and the anisotropic conductive material interposed between the panel-side input terminals 123 and the driver-side input terminals of the driver 121 are both heated to pressurizable temperature Tp, and thus thermosetting of the binder progresses to such an extent that both the conductive particles and the binder can receive the pressure exerted by the pressurizing unit and disperse the pressure exerted on the conductive particles, thereby making it harder for pressure to be concentrated on the conductive particles. Due to this, the conductive particles can be flattened by the pressure, thus enabling a favorable conductive connection among the respective terminals 123 and 124 on the array substrate 111b side and the respective terminals on the driver 121 side.

As described above, in the present embodiment, the driver mounting section GSs1 includes the panel-side input terminals 123 that receive input signals for the driver 121, and the panel-side output terminals 124 that are disposed between the panel-side input terminals 123 with prescribed gaps therebetween and that receive output signals from the driver 121, and the heat supply part 128 includes at least the input terminal-side heat supply part 31 disposed relatively close to the panel-side input terminals 123, and the output terminal-side heat supply part 32 disposed relatively close to the panel-side output terminals 124. This configuration makes it possible for the input terminal-side heat supply part 31 and the output terminal-side heat supply part 32 at least included in the heat supply part 128 to supply heat to the anisotropic conductive material near the panel-side input terminals 123 and the anisotropic conductive material near the panel-side output terminals 124 at different timings. This, in turn, allows the binder of the anisotropic conductive material interposed between the panel-side input terminals 123 and driver 121 and the binder interposed between the panel-side output terminals 124 and driver 121 to be respectively thermoset at the appropriate times, which can enable favorable connections of the panel-side input terminals 123 and panel-side output terminals 124 to the driver 121.

Embodiment 3

Embodiment 3 of the present invention will be described using FIGS. 18 and 19. In Embodiment 3, the arrangement of a heated section 229 has been changed from Embodiment 2 described above. Descriptions of structures, operations, and effects similar to those of Embodiment 2 will be omitted.

Figure 18:
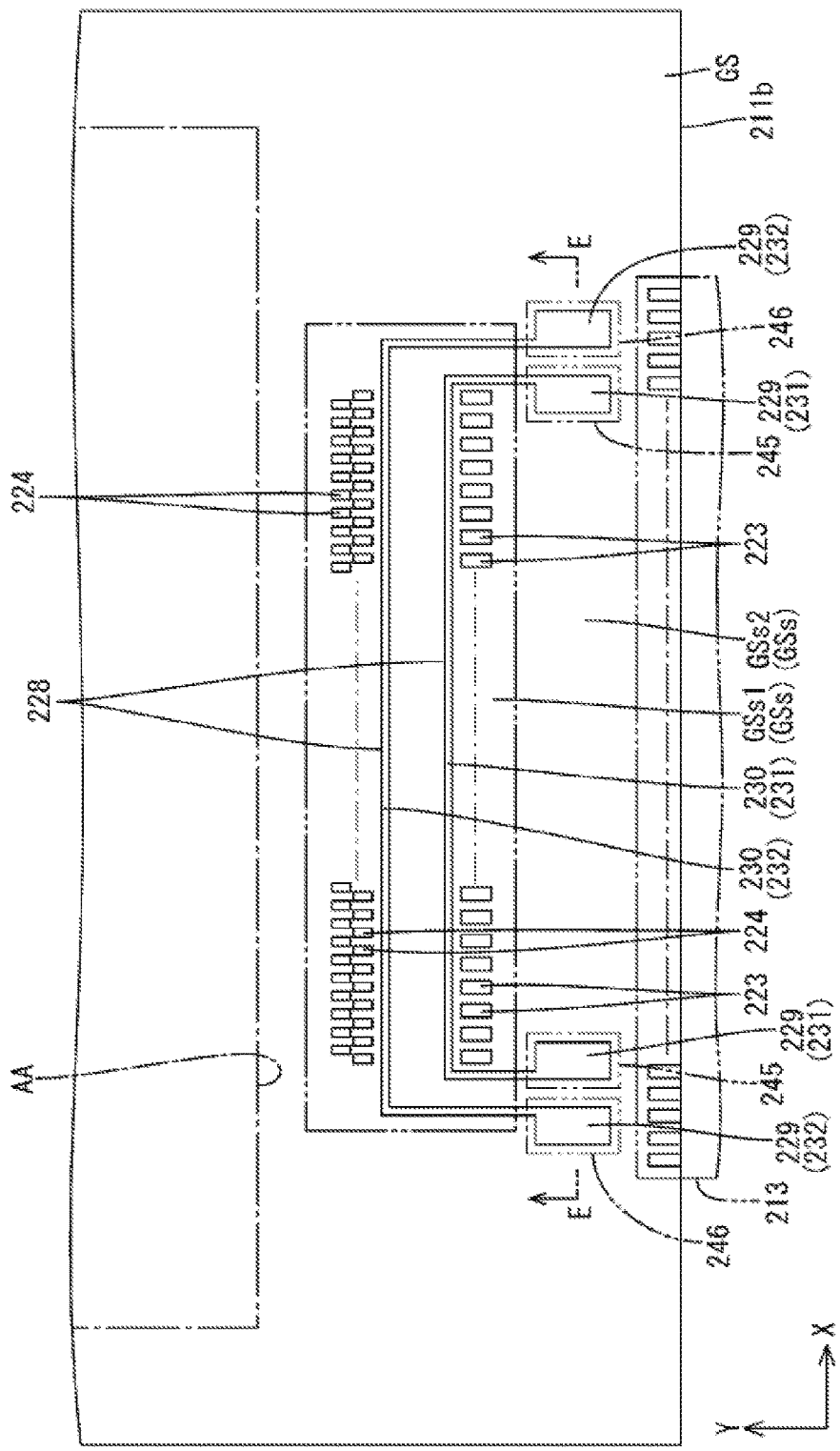
FIG. 18 is a plan view of a mounting region of a driver and a flexible substrate on an array substrate according to Embodiment 3 of the present invention.

As shown in FIG. 18, the heated section 229 constituting a heat supply part 228 of the present embodiment is arranged on the driver non-overlapping area GSs2 of an array substrate 211 on a side of the driver mounting section GSs1 opposite to the display area AA in the Y-axis direction (the direction orthogonal to the extension direction of a heat transfer section 230). Specifically, the heat transfer section 230 constituting a portion of the heat supply part 228 extends along the X-axis direction on the driver mounting section GSs1 with both ends disposed further away than respective terminals 223 and 224 being curved and drawn out towards the side opposite to the display area AA in the Y-axis direction so as to reach the driver non-overlapping section GSs2. The heated section 229 continues from the drawn-out end of the heat transfer section 230 drawn out to the driver non-overlapping section GSs2. The heated section 229 is arranged on the driver non-overlapping section GSs2 and interposed in the Y-axis direction between a driver 221 and a flexible substrate 213. The arrangement of the display area AA in the Y-axis direction relative to the driver mounting section GSs1 on the array substrate 211b is similar to the arrangement in the Y-axis direction of the polarizing plate (optical member) (not shown) relative to the driver mounting section GSs1 (see FIG. 5). Accordingly, the heated member 229 is arranged on a side of the driver mounting section GSs1 opposite to the polarizing plate in the Y-axis direction. With this arrangement, the distance from the heated section 229 to the polarizing plate is relatively longer than the configuration described in Embodiment 2 above, and thus the heat of the heated section 229 is not susceptible to being transferred via the glass substrate GS to the polarizing plate, which makes degradation of the optical performance of the polarizing plate caused by heat less likely to occur.

Figure 19:
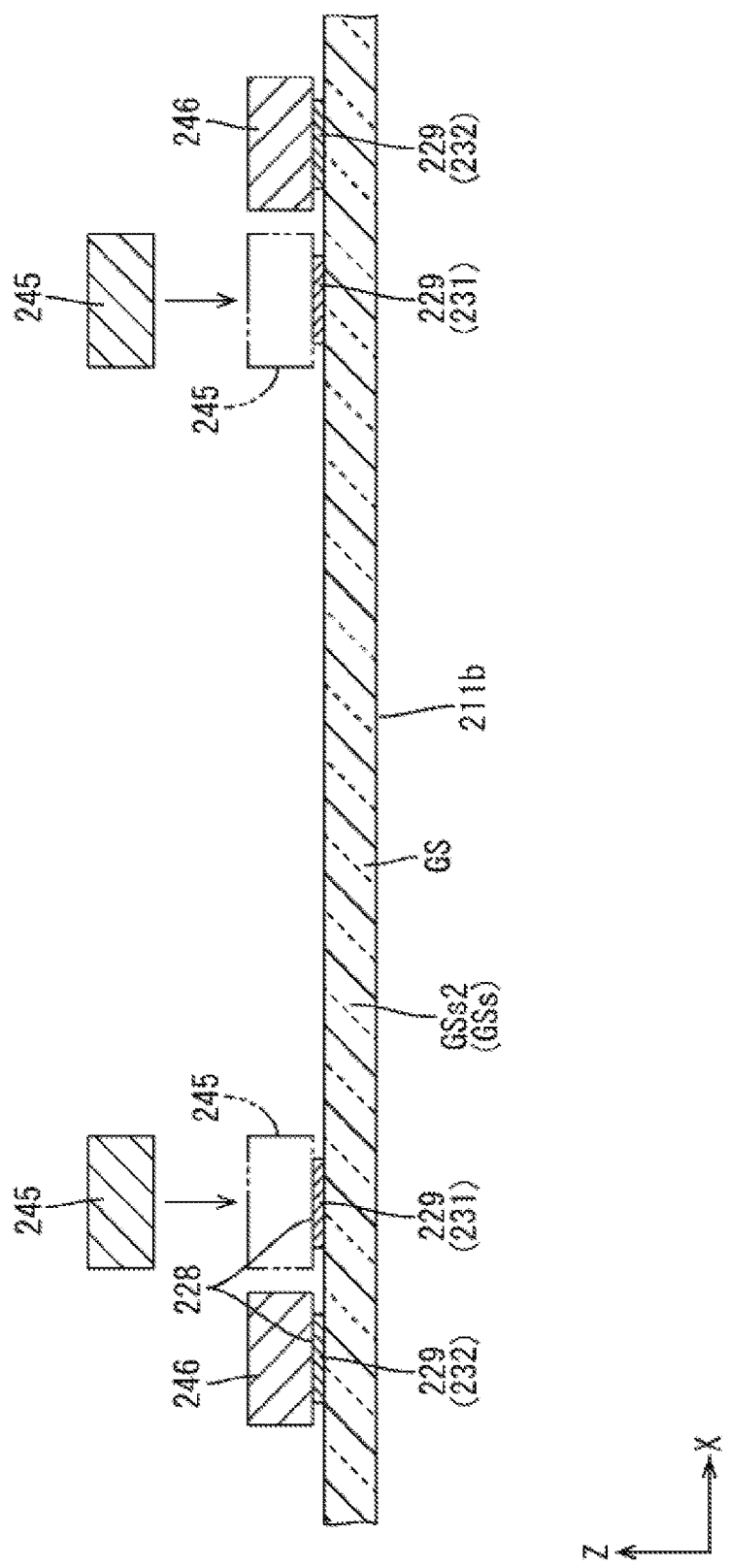
FIG. 19 is a cross-sectional view along the line E-E in FIG. 18 and explains the timing of heating by an input terminal side heating unit and output terminal side heating unit of the driver mounting device.

More specifically, as shown in FIGS. 18 and 19, the heated section 229 of the input terminal-side heat supply part 231 included in the heat supply part 228 is arranged relatively closer to the center of the driver non-overlapping section GSs2 in the X-axis direction, whereas the heated section 229 of the output terminal-side heat supply part 232 included in the heat supply part 228 is arranged relatively closer to the end of the driver non-overlapping section GSs2 in the X-axis direction. The pair of heated sections 229 of the output terminal-side heat supply part 232 sandwich the pair of heated sections 229 of the input terminal-side heat supply part 231 from both sides in the X-axis direction. Accordingly, in a similar manner, the input terminal-side heating unit 245 that heats the heated section 229 of the input terminal-side heat supply part 231, and the output terminal-side heating unit 246 that heats the heated section 229 of the output terminal-side heat supply part 232 also have the pair of output terminal-side heating units 246 sandwiching the pair of input terminal-side heating units 245 from both sides in the X-axis direction.

As described above, in the present embodiment, the polarizing plate (optical member) is attached adjacent to the driver mounting section GSs1 in a direction orthogonal to the extension direction of the heat transfer section 230 that goes along the surface of the glass substrate GS and across the driver mounting section GSs1, and the heat transfer section 230 of the heat supply part 228 is drawn out from the driver mounting section GSs1 towards the driver non-overlapping section GSs2 opposite to the polarizing plate in the direction orthogonal to the extension direction of the heat transfer section 230, whereas the heated section 229 of the heat supply part 228 continues from the drawn-out end of the heat transfer section 230 and is arranged on a side on the driver non-overlapping section GSs2 opposite to the polarizing plate with respect to the driver mounting section GSs1 in the direction orthogonal to the extension direction. With this configuration, the heated section 229 continues from the drawn-out end of the heat transfer section 230 that is drawn out from the driver mounting section GSs1 and is arranged on the driver non-overlapping section GSs2 on a side of the driver mounting section GSs1 opposite to the polarizing plate in the direction orthogonal to the extension direction of the heat transfer section 230 that goes across the surface of the glass substrate GS and across the driver mounting section GSs1; thus, there can be a sufficient distance ensured between the heated section 229 and the polarizing plate, and this makes heat from the heated section 229 that has been heated less susceptible to being transferred to the polarizing plate via the glass substrate GS. Accordingly, the optical performance of the polarizing plate is not susceptible to degradation caused by the heat for thermosetting the binder of the anisotropic conductive material.

Embodiment 4

Embodiment 4 of the present invention will be described with reference to FIG. 20. In Embodiment 4, the arrangement of two heat supply parts 328 has been changed from Embodiment 3 described above. Descriptions of structures, operations, and effects similar to those of Embodiment 3 will be omitted.

Figure 20:
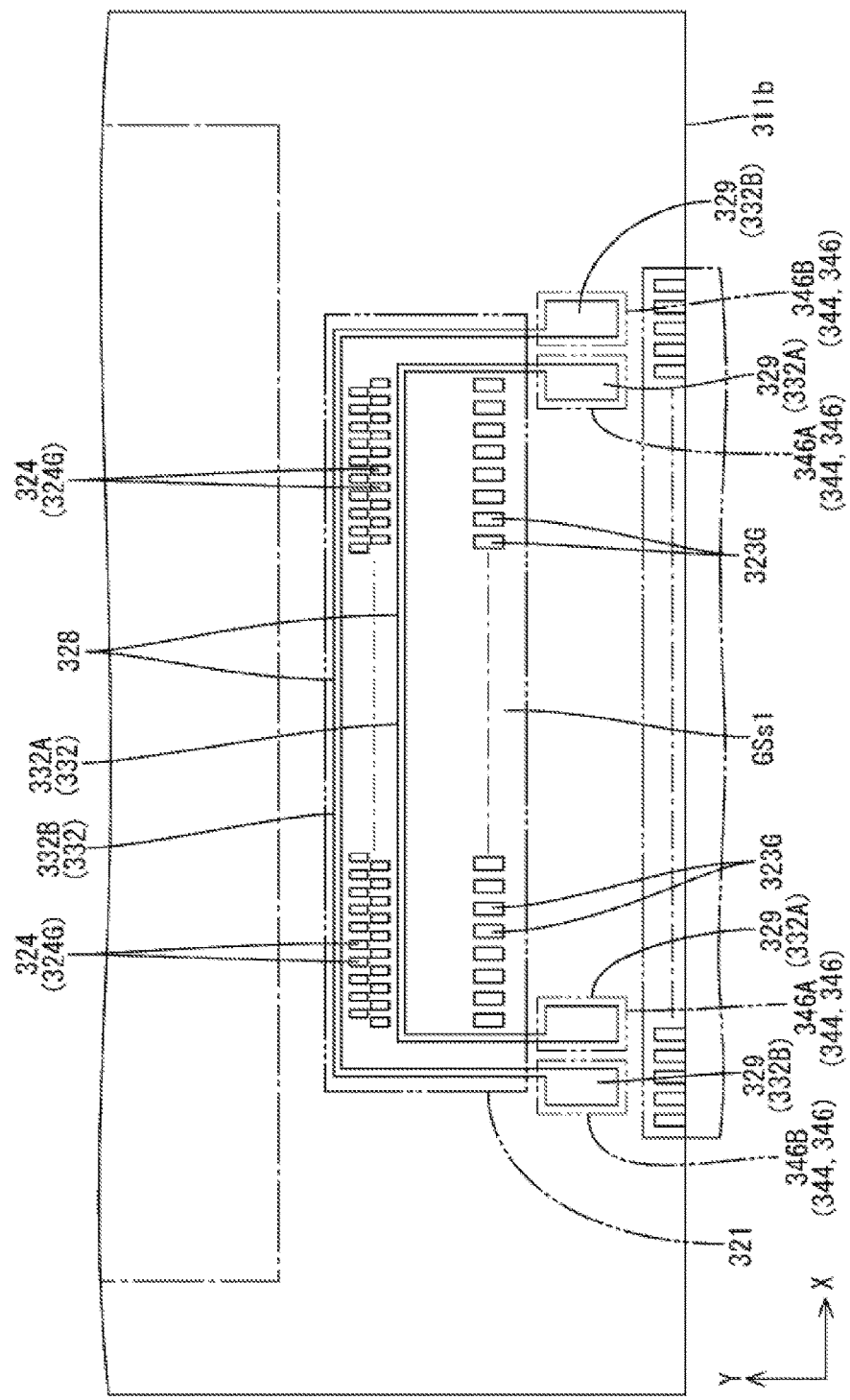
FIG. 20 is a plan view of a mounting region of a driver and a flexible substrate on an array substrate according to Embodiment 4 of the present invention.

As shown in FIG. 20, the two heat supply parts 328 of the present embodiment both pass close to panel-side output terminals 324. In other words, in the present embodiment, the heat supply part 328 is constituted by two output terminal-side heat supply parts 332, and the input terminal-side heat supply part described in Embodiment 3 above is omitted. The two output terminal-side heat supply parts 332 include, on the driver mounting section GSs1 of an array substrate 311b, a first output terminal-side heat supply part (inner heat supply part) 332A that passes between a panel-side input terminal group 323G and a panel-side output terminal group 324G, and a second output terminal-side heat supply part (outer heat supply part) 332B that passes on a side of the panel-side output terminal group 324G opposite to the panel-side input terminal group 323G in the Y-axis direction. The first output terminal-side heat supply part 332A passes inside of the panel-side output terminal group 324G on the driver mounting section GSs1, whereas the second output terminal-side heat supply part 332B passes outside of the panel-side output terminal group 324G on the driver mounting section GSs1. Thus, the panel-side output terminal group 324G is sandwiched in the Y-axis direction by the first output terminal-side heat supply part 332A and the second output terminal-side heat supply part 332B.

A heating unit 344 for heating a heated section 329 of the two output terminal-side heat supply parts 332 is constituted by four output terminal-side heating units 346, and the input terminal-side heating unit described in Embodiment 3 above is omitted. The output terminal-side heating unit 346 includes a pair of first output terminal-side heating units (inner heating units) 346A that heat the respective heated sections 329 of the first output terminal-side heat supply part 332A, and a pair of second output terminal-side heating units (outer heating units) 346B that heat the respective heated sections 329 of the second output terminal-side heat supply part 332B. With this configuration, the first output terminal-side heating unit 346A heats the heated section 329 of the first output terminal-side heat supply part 332A, and the second output terminal-side heating unit 346B heats the heated section 329 of the second output terminal-side heat supply part 332B, thereby making it possible to more efficiently supply heat to the anisotropic conductive material interposed between panel-side output terminals 324 and driver-side output terminals (not shown) of the driver 321. This allows a relatively large amount of the binder of the anisotropic conductive material to be interposed between the panel-side output terminals 324 that constitute the panel-side output terminal group 324G, which has a relatively large total area, and the driver-side output terminals of the driver 321, and makes it possible for this binder to be hardened even more efficiently. Accordingly, this is suitable for the array substrate 311b, which has a larger total area of the panel-side output terminal group 324G.

As described above, in the present embodiment, the heat supply part 328 includes at least the first output terminal-side heat supply part (inner heat supply part) 332A arranged on the inner side of the panel-side output terminal group 324G so as to pass between the panel-side output terminal group 324G and panel-side input terminal group 323G, and the second output terminal-side heat supply part (outer heat supply part) 332B arranged on the outer side of the panel-side outer terminal group 324G so as to sandwich the panel-side output terminal group 324G between the first output terminal-side heat supply part 332A and the second output terminal-side heat supply part itself. With this configuration, the panel-side output terminal group 324G is sandwiched between the first output terminal-side heat supply part 332A on the inside and the second output terminal-side heat supply part 332B on the outside, and thus thermosetting of the binder of the anisotropic conductive material can be even more suitably facilitated near the panel-side output terminal group 324G. This allows the binder interposed between the plurality of panel-side output terminals 324 and the driver 321 to be more suitably thermoset, which enables a more favorable connection between the panel-side output terminal group 324G and the driver 321.

Embodiment 5

Embodiment 5 of the present invention will be described with reference to FIG. 21. Embodiment 5 differs from Embodiment 1 in that voltage is applied to a heat supply part 428 in order to heat the anisotropic conductive material. Descriptions of structures, operations, and effects similar to those of Embodiment 1 will be omitted.

Figure 21:
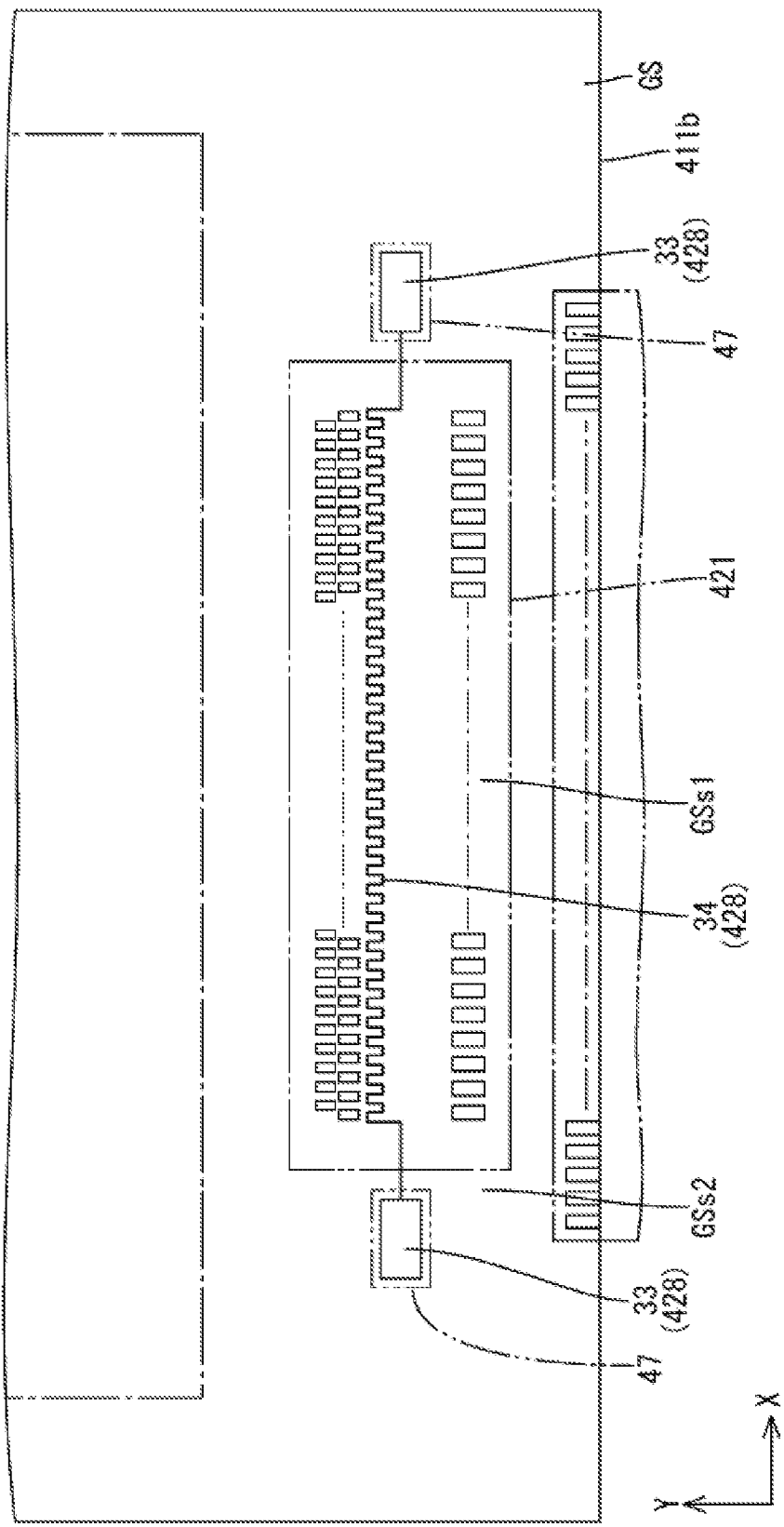
FIG. 21 is a plan view of a mounting region of a driver and a flexible substrate on an array substrate according to Embodiment 5 of the present invention.

As shown in FIG. 21, the heat supply part 428 of the present embodiment is constituted by a voltage receiving part 33 (voltage receiving pattern) that is arranged on the driver-non overlapping section GSs2 of an array substrate 411b and that receives voltage from outside, and a heat generating part 34 (heat generating pattern) that is arranged primarily on the driver mounting section GSs1 and that generates heat based on the voltage received by the voltage receiving part 33. The voltage receiving part 33 is made of a metal material having excellent conductivity and has a planar shape similar to that of the heated section 29 described in Embodiment 1 above. The heat generating part 34 is made of a metal material having excellent conductivity, has a narrower line shape than the heat transfer section 30 described in Embodiment 1 above, and has a planar shape extending along the X-axis direction in a repeated winding manner. Due to this, the heat generating part 34 has a high wiring resistance, and thus generates heat based on the voltage received by the voltage receiving part 33. The voltage receiving part 33 is provided in a pair so as to continue from both ends of the heat generating part 34 in the extension direction thereof.

The driver mounting device (not shown in its entirety) includes a voltage input unit 47 that inputs voltage to the voltage receiving part 33 of the heat supply part 428 described above. The voltage input unit 47 is provided in a pair so as to correspond to the pair of voltage receiving parts 33, with one of the pair of the voltage input units 47 being the positive side and the other being the negative side, thereby making it possible to input voltage between the voltage receiving parts 33. When the pair of positive/negative voltage input units 47 input voltage between the voltage receiving parts 33, the high wiring resistance of the heat generating part 34 causes heat to be generated, and this heat can be supplied to the anisotropic conductive material to facilitate thermosetting of the binder.

As described above, on the array substrate 411b of the present embodiment, the heat supply part 428 is constituted by the voltage receiving part 33 that is disposed on the driver non-overlapping section GSs2 of the glass substrate GS not overlapping the driver 421 in a plan view and that receives voltage from outside, and the heat generating part 34 that is disposed on at least the driver mounting section GSs1 of the glass substrate GS, which is a portion that overlaps the driver 421 in a plan view, and that generates heat based on the voltage received by the voltage receiving part 33. With this configuration, when the voltage receiving part 33 receives a voltage, heat is generated by the heat generating part 34, and thus this heat can be used for thermosetting of the binder of the anisotropic conductive material.

Furthermore, the driver mounting device for mounting the driver 421 on the array substrate 411b of the present embodiment includes: a substrate support unit that supports the driver mounting section GSs1 of the glass substrate GS where the driver 421 is mounted; a pressurizing unit (not shown) that is disposed on the side of the glass substrate GS opposite to the substrate support section and that applies pressure to the driver 421 interposed between the pressurizing unit and the anisotropic conductive material (not shown), which is between the driver mounting section GSs1 and the pressurizing unit and constituted by the binder made of the thermosetting resin and the conductive particles in the binder; and the voltage input unit 47 that is provided on at least the driver mounting section GSs1 of the glass substrate GS and that inputs voltage to the heat supply part 428 that supplies heat to the anisotropic conductive material.

With this manufacturing device, when the driver 421 is to be mounted on the driver mounting section GSs1 of the glass substrate GS, the substrate support unit supports the driver mounting section GSs1 of the glass substrate GS where the driver 421 is mounted, and in this state the voltage input unit 47 inputs voltage to the heat supply part 428 in order to cause heat to be transferred from the heat supply part 428 to the binder of the anisotropic conductive material so as to facilitate thermosetting of the binder, and the pressurizing unit applies pressure to the driver 421 interposed between the driver mounting section GSs1 and the pressurizing unit. This mounts the driver 421 relative to the driver mounting section GSs1 such that both are electrically connected to each other by the anisotropic conductive material.

The voltage input unit 47 that inputs voltage to the heat supply part 428 is provided separately from the substrate support unit and the pressurizing unit, and thus there is a greater degree of freedom regarding the timing at which heat is supplied to the anisotropic conductive material as compared to conventional cases where heat is supplied to the anisotropic conductive material and pressure is applied to the driver at the same time. Accordingly, when mounting the driver 421, it is possible to facilitate thermosetting of the binder by the voltage input unit 47 inputting voltage to the heat supply part 428 and supplying heat to the anisotropic conductive material prior to pressure being applied to the driver 421 by the pressurizing unit, for example. Due to this, during pressurizing of the driver 421 by the pressurizing unit, the binder has already been hardened to a certain extent, and the pressure exerted on the conductive particles can also be received by the binder, thus preventing the pressure from being concentrated only on the conductive particles, and thereby forming a favorable connection between the driver 421 and the driver mounting section GSs1 via the conductive particles. Moreover, a higher degree of freedom regarding the timing at which heat is supplied to the anisotropic conductive material makes it unnecessary to rapidly supply heat in order to harden the binder, which makes the substrate less susceptible to being overheated and inhibits the occurrence of performance degradation caused by such heat.

Embodiment 6

Embodiment 6 of the present invention will be described with reference to FIG. 22. Embodiment 6 shows a case in which the configuration of an output terminal-side heat supply part 528 differs from that of Embodiment 2 described above. Descriptions of structures, operations, and effects similar to those of Embodiment 2 will be omitted.

Figure 22:
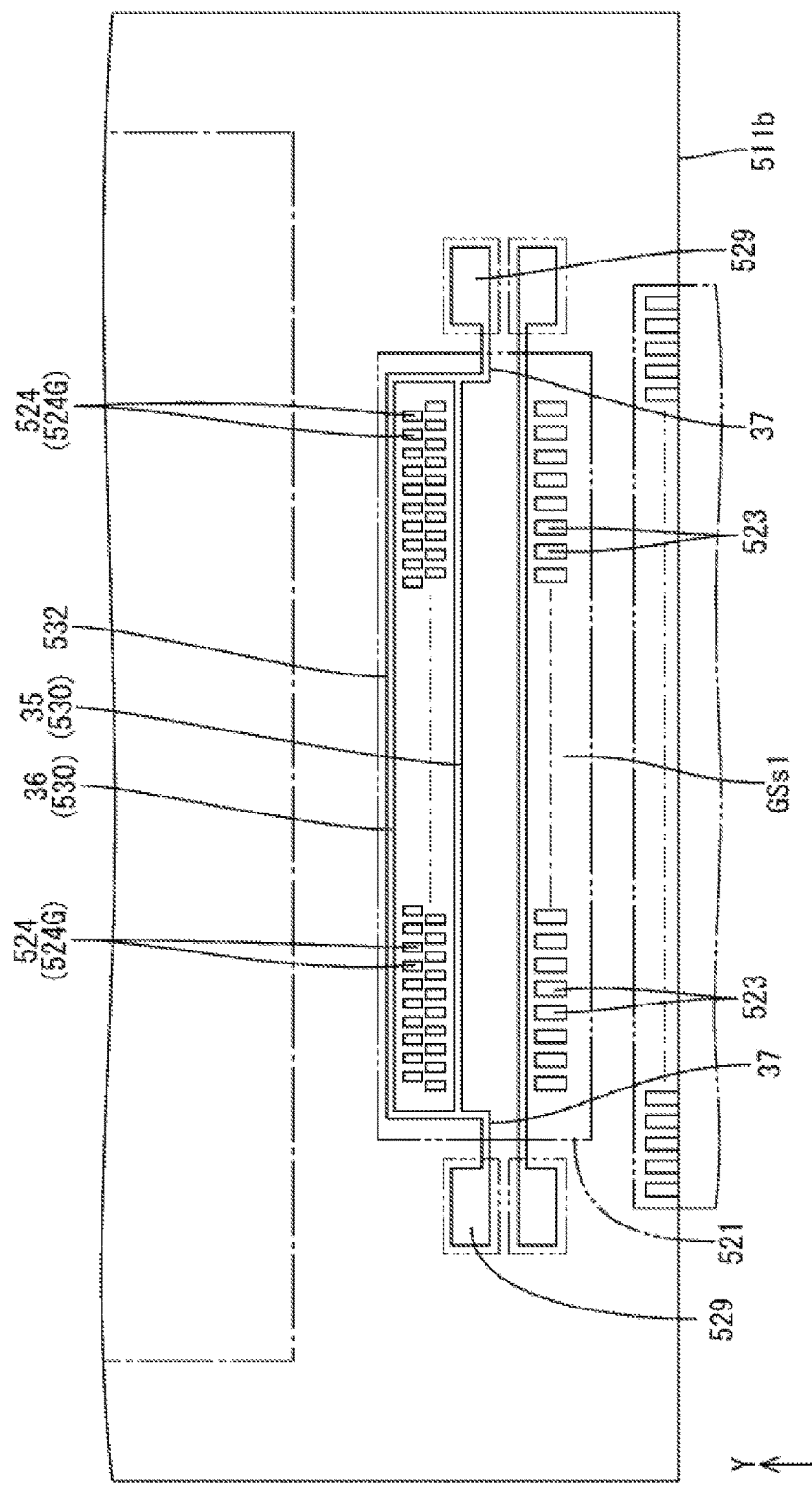
FIG. 22 is a plan view of a mounting region of a driver and a flexible substrate on an array substrate according to Embodiment 6 of the present invention.

As shown in FIG. 22, the output terminal-side heat supply part 532 has a heat transfer section 530 that branches in two. Specifically, the heat transfer section 530 of the output terminal-side heat supply part 532 includes, on the driver mounting section GSs1 of an array substrate 511b, a first heat transfer section (inner heat transfer section) 35 that passes between panel-side output terminals 524 and panel-side input terminals 523, and a second heat transfer section (outer heat transfer section) 36 that passes on a side of the panel-side output terminals 524 opposite to the panel-side input terminals 523 in the Y-axis direction. The first heat transfer section 35 passes inside of the panel-side output terminals 524 on the driver mounting section GSs1, whereas the second heat transfer section 36 passes outside of the panel-side output terminals on the driver mounting section GSs1. Thus, the panel-side output terminals 524 are sandwiched in the Y-axis direction between the first heat transfer section 35 and the second heat transfer section 36. The first heat transfer section 35 and second heat transfer section 36 each extend along the Y-axis direction on the driver mounting section GSs1 and both ends of each in the extension direction connect with one another. The heat transfer section 530 has a drawn-out section 37 that is drawn out from the connection location of the first heat transfer section 35 and second heat transfer section 36, and this drawn-out section 37 is connected to a heated section 529. With this configuration, even more heat can be supplied to the panel-side output terminals 524 by the output terminal-side heat supply part 532, and thus it is possible to more efficiently thermoset the binder of the anisotropic conductive material interposed between the respective panel-side output terminals 524 constituting a panel-side output terminal group 524G, which has a large total area, and the respective driver-side output terminals of a driver 521.

Embodiment 7

Embodiment 7 of the present invention will be described with reference to FIG. 23. In Embodiment 7, the installation amount of a heated section 629 and connection target has been changed from Embodiment 6 described above. Descriptions of structures, operations, and effects similar to those of Embodiment 6 will be omitted.

Figure 23:
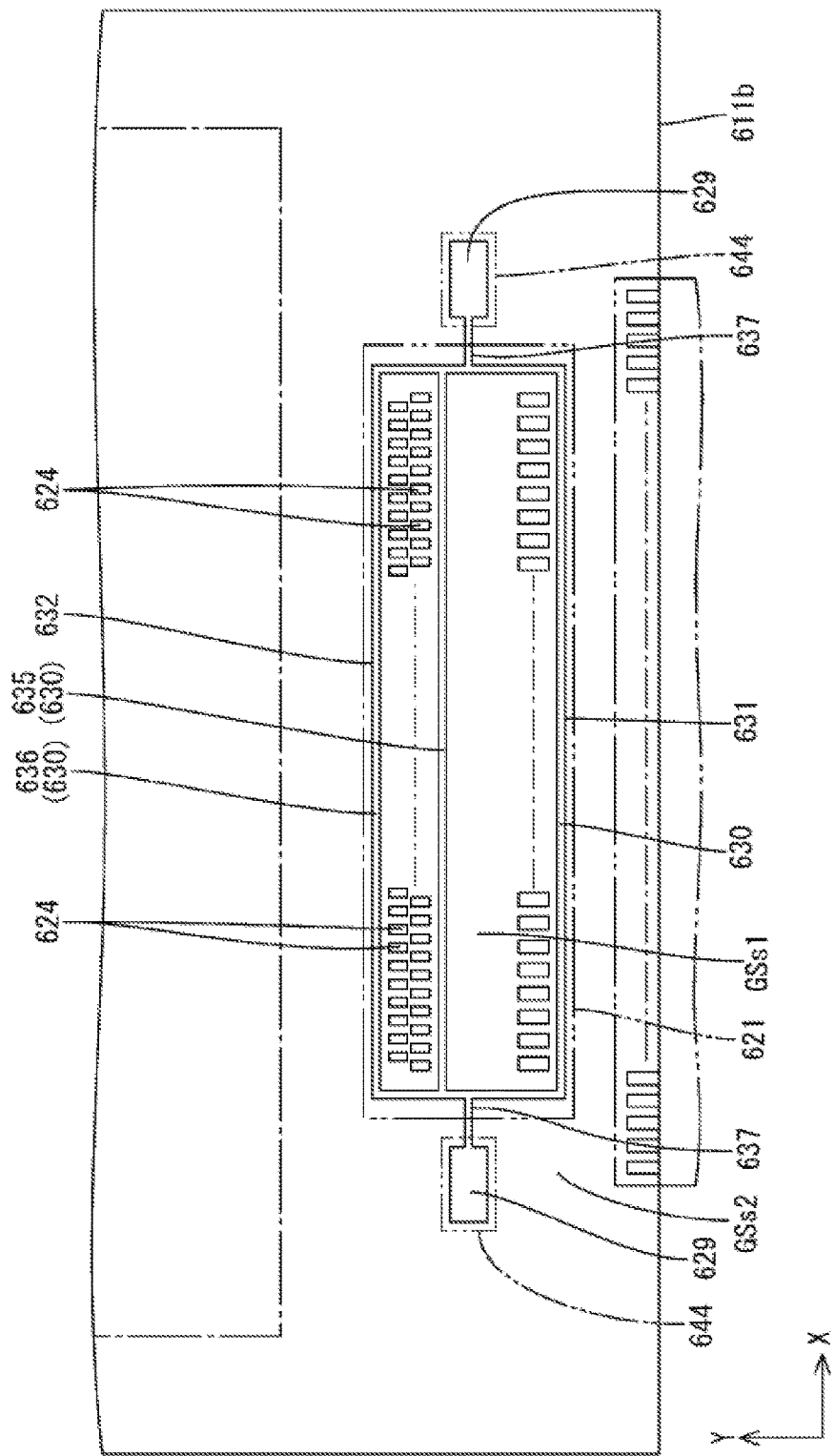
FIG. 23 is a plan view of a mounting region of a driver and a flexible substrate on an array substrate according to Embodiment 7 of the present invention.

As shown in FIG. 23, the heated section 629 of the present embodiment is provided as only a pair on the driver non-overlapping section GSs2 of an array substrate 611b and connects to both a heat transfer section 630 of an input terminal-side heat supply part 631 and the heat transfer section 630 of an output terminal-side heat supply part 632. The heat transfer section 630 of the input terminal-side heat supply part 631 and the heat transfer section 630 of the output terminal-side heat supply part 632 have the ends thereof in the extension direction on the driver mounting section GSs1 connecting to one another, and a drawn-out section 637 that is drawn out from these connection locations is connected to the heated section 629. With this configuration, when a heating unit 644 of the driver mounting device heats the heated section 629, the heat from the heated section 629 is transferred to the heat transfer section 630 of the input terminal-side heat supply part 631 and the heat transfer section 630 of the output terminal-side heat supply part 632. The heat transfer section 630 of the output terminal-side heat supply part 632 branches out and includes the first heat transfer section 635 and the second heat transfer section 636, and thus even more heat can be transferred as compared to the input terminal-side heat supply part 631. Accordingly, it is possible to more efficiently thermoset the binder of the anisotropic conductive material interposed between panel-side output terminals 624 and respective driver-side output terminals of a driver 621.

Embodiment 8

Embodiment 8 of the present invention will be described with reference to FIG. 24. Embodiment 8 shows a case in which the configuration of an output terminal-side heat supply part 732 differs from that of Embodiment 2 described above. Descriptions of structures, operations, and effects similar to those of Embodiment 2 will be omitted.

Figure 24:
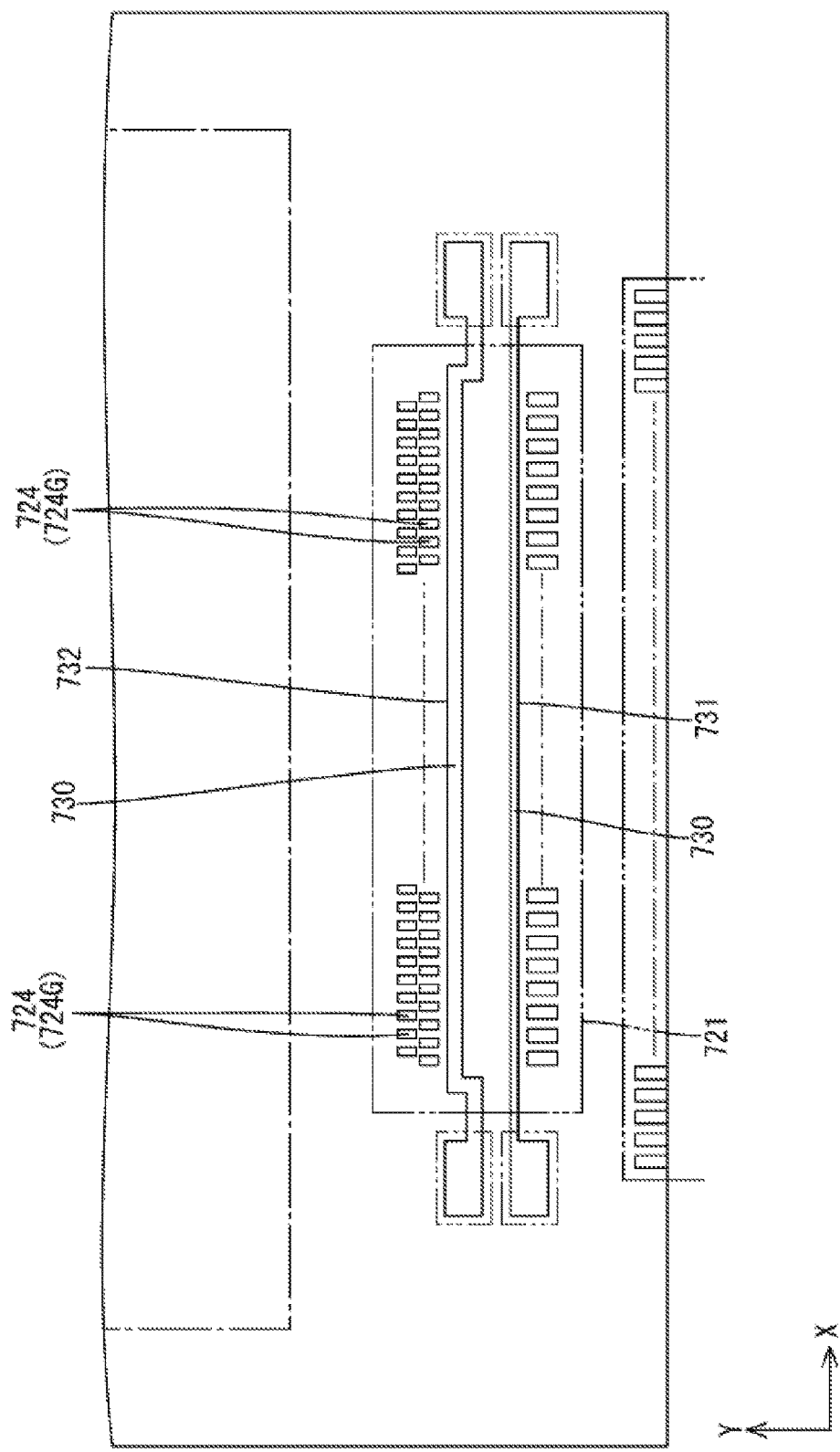
FIG. 24 is a plan view of a mounting region of a driver and a flexible substrate on an array substrate according to Embodiment 8 of the present invention.

As shown in FIG. 24, in regard to the output terminal-side heat supply part 732 of the present embodiment, the line width of a heat transfer section 730 thereof is greater than a line width of a heat transfer section 730 of an input terminal-side heat supply part 731. With this configuration, even more heat can be supplied to panel-side output terminals 724 by the output terminal-side heat supply part 732 having a large line width, and thus it is possible to more effectively thermoset the binder of the anisotropic conductive material interposed between the respective panel-side output terminals 724 constituting a panel-side output terminal group 724G, which has a large total area, and respective driver-side output terminals of a driver 721.

Embodiment 9

Embodiment 9 of the present invention will be described with reference to FIG. 25. In Embodiment 9, the installation amount of a heated section 829 and connection target has been changed from Embodiment 8 described above. Descriptions of structures, operations, and effects similar to those of Embodiment 8 will be omitted.

Figure 25:
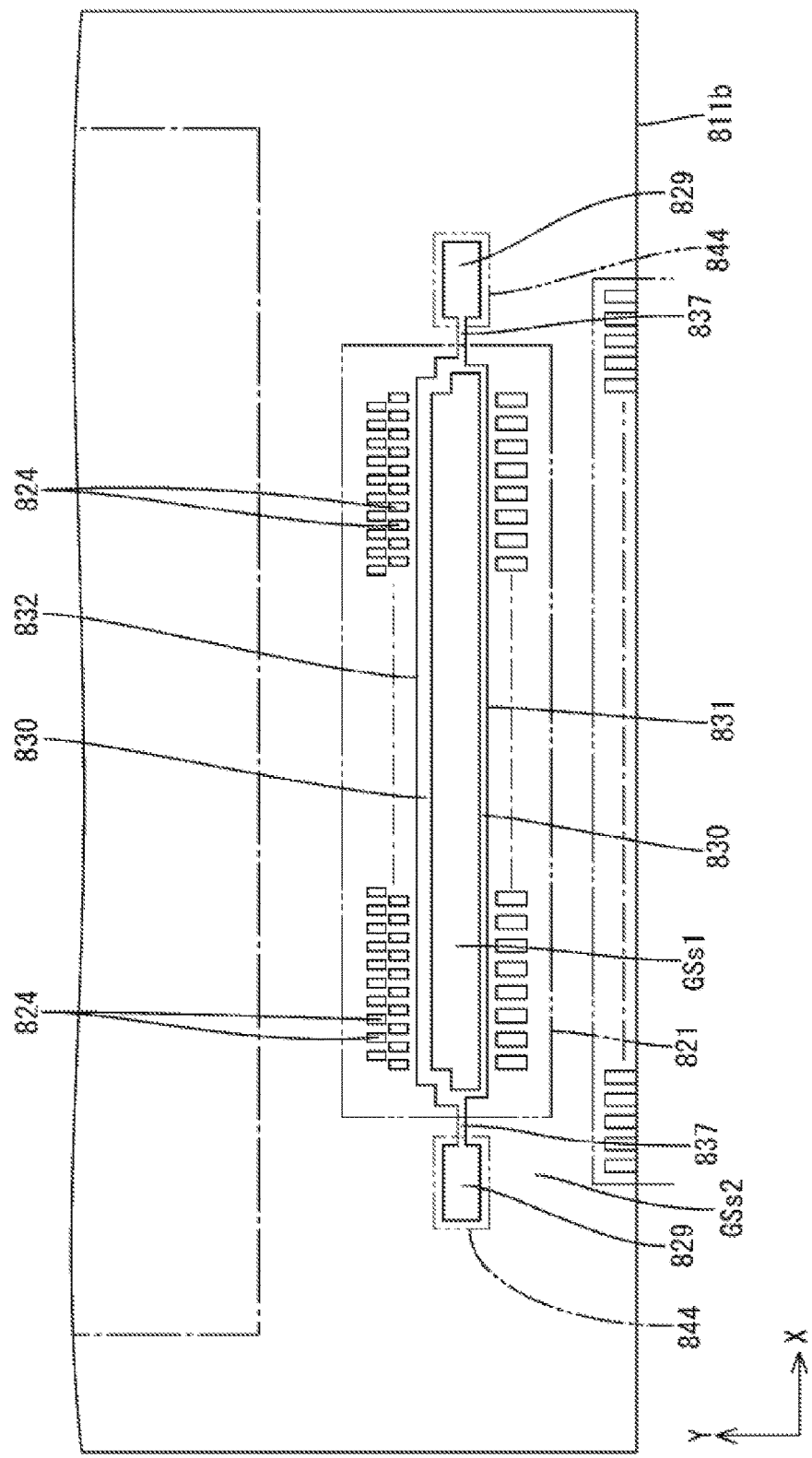
FIG. 25 is a plan view of a mounting region of a driver and a flexible substrate on an array substrate according to Embodiment 9 of the present invention.

As shown in FIG. 25, the heated section 829 of the present embodiment is provided as only a pair on the driver non-overlapping section GSs2 of an array substrate 811b and connects to both a heat transfer section 830 of an input terminal-side heat supply part 831 and the heat transfer section 830 of an output terminal-side heat supply part 832. The heat transfer section 830 of the input terminal-side heat supply part 831 and the heat transfer section 830 of the output terminal-side heat supply part 832 have the ends thereof in the extension direction on the driver mounting section GSs1 connecting to one another, and a drawn-out section 837 that is drawn out from these connection locations is connected to the heated section 829. With this configuration, when a heating unit 844 of the driver mounting device heats the heated section 829, the heat from the heated section 829 is transferred to the heat transfer section 830 of the input terminal-side heat supply part 831 and the heat transfer section 830 of the output terminal-side heat supply part 832. The heat transfer section 830 of the output terminal-side heat supply part 832 has a greater line width than the heat transfer section 830 of the input terminal-side heat supply part 831, and thus can transfer more heat than the input terminal-side heat supply part 831. Accordingly, it is possible to more efficiently thermoset the binder of the anisotropic conductive material interposed between panel-side output terminals 824 and respective driver-side output terminals of a driver 821.

Embodiment 10

Embodiment 10 of the present invention will be described with reference to FIG. 26. In Embodiment 10, the configuration of panel-side output terminals 924 and the arrangement of a heat supply part 928 have been changed from Embodiment 1. Descriptions of structures, operations, and effects similar to those of Embodiment 1 will be omitted.

Figure 26:
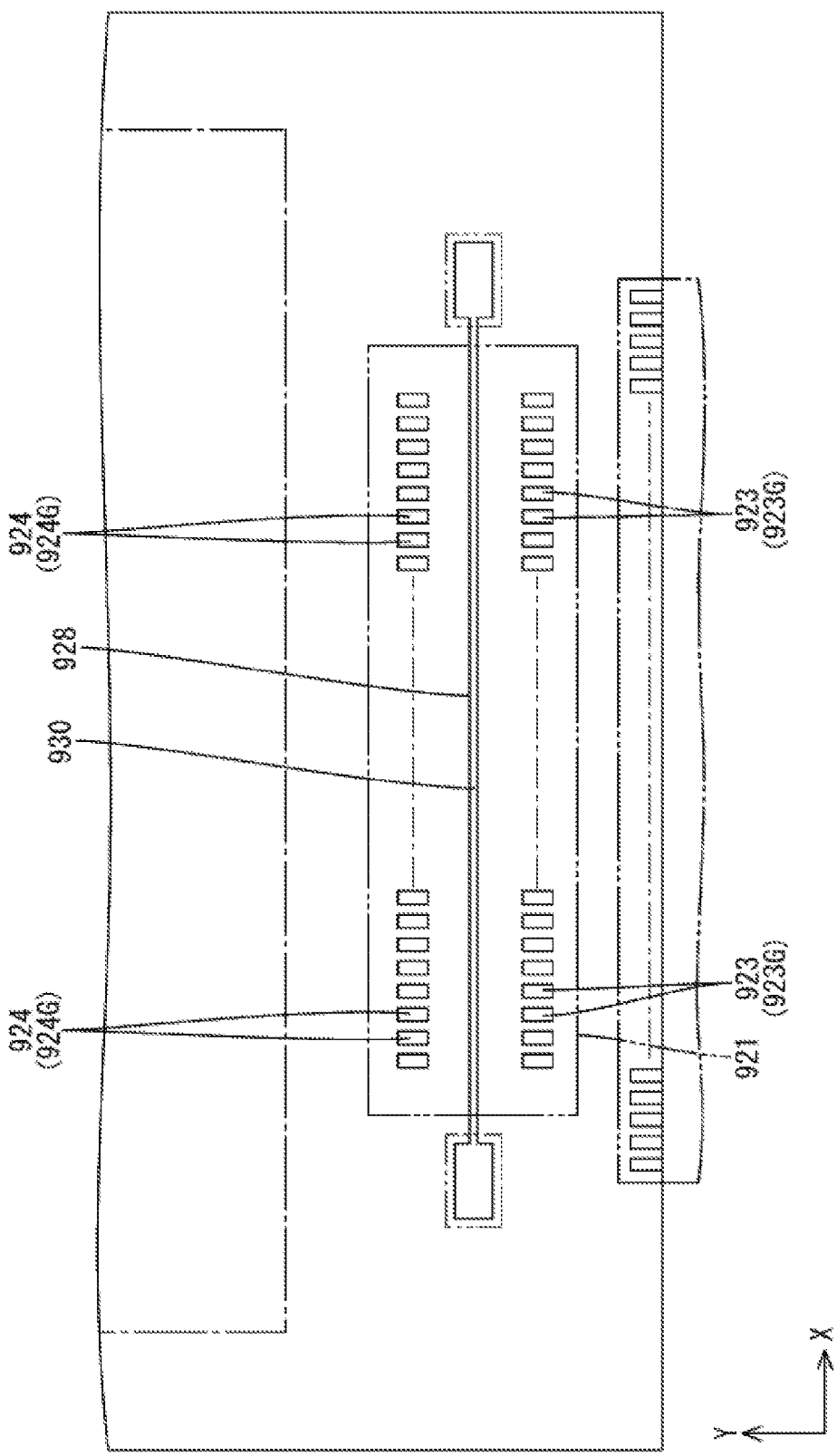
FIG. 26 is a plan view of a mounting region of a driver and a flexible substrate on an array substrate according to Embodiment 10 of the present invention.

As shown in FIG. 26, a large number of the panel-side output terminals 924 of the present embodiment are arranged next to one another in a straight line along the X-axis direction, in a similar manner to panel-side input terminals 923. A panel-side output terminal group 924G constituted by the large number of panel-side output terminals 924 has a total area that is approximately the same as the total area of a panel-side input terminal group 923G. Accordingly, the amount of anisotropic conductive material interposed between the panel-side input terminals 923 and the driver-side input terminals of a driver 921 is approximately equal to the amount of anisotropic conductive material interposed between the panel-side output terminals 924 and the driver-side output terminals of the driver 921. In contrast, a heat transfer section 930 of the heat supply part 928 extends to pass between the panel-side input terminals 923 and panel-side output terminals 924, and the distance between the heat transfer section 930 and the panel-side input terminals 923 is approximately equal to the distance between the heat transfer section 930 and the panel-side output terminals 924. With this configuration, the heat supplied by the heat transfer section 930 is approximately evenly transferred to the anisotropic conductive material interposed between the panel-side input terminals 923 and driver-side input terminals of the driver 921 and the anisotropic conductive material interposed between the panel-side output terminals 924 and driver-side output terminals of the driver 921, which facilitates favorable thermosetting of both of the binders of the anisotropic conductive materials.

Other Embodiments

The present invention is not limited to the embodiments shown in the drawings and described above, and the following embodiments are also included in the technical scope of the present invention, for example.

(1) In the respective embodiments described above, an example is shown in which the total area of the panel-side output terminal group is greater than the total area of the panel-side input terminal group, or in which the total area of the panel-side output terminal group is equal to the total area of the panel-side input terminal group, but the present invention is also applicable to configurations in which the total area of the panel-side input terminal group is greater than the total area of the panel-side output terminal group. In such a case, it is preferable that the heat supply part include a unit arranged near the panel-side input terminal group.

(2) In Embodiment 1 described above, an example is shown in which the heat transfer section of the heat supply part passes between the panel-side input terminals and the panel-side output terminals, but the present invention also includes configurations in which the heat transfer section of the heat supply part passes the side of the panel-side output terminals opposite to the panel-side input terminals (the outer side).

(3) In Embodiments 2 and 3 described above, an example is shown in which the heat transfer section of the output terminal-side heat supply part passes between the panel-side input terminals and the panel-side output terminals, but the present invention also includes configurations in which the heat transfer section of the output terminal-side heat supply part passes the side of the panel-side output terminals opposite to the panel-side input terminals (the outer side). In a similar manner, the present invention also includes configurations in which the heat transfer section of the input terminal-side heat supply part passes the side of the panel-side input terminals opposite to the panel-side output terminals (the outer side).

(4) In Embodiments 2, 3, 6, and 8 described above, an example is shown in which the heated section of the input terminal-side heat supply part and the heated section of the output terminal-side heat supply part are heated by different heating units, but it is also possible to adopt a configuration in which the heated section of the input terminal-side heat supply part and the heated section of the output terminal-side heat supply part are heated by a shared (single) heating unit.

(5) In Embodiment 4 described above, an example is shown in which the respective heated sections of the two output terminal-side heat supply parts are heated by different heating units, but it is also possible to adopt a configuration in which the respective heated sections of the two output terminal-side heat supply parts are heated by a shared (single) heating unit.

(6) The configurations described in Embodiments 2 and 3 may be combined with the configurations described in Embodiments 7 and 9, such that the heat transfer section of the input terminal-side heat supply part and the heat transfer section of the output terminal-side heat supply part connect to a shared heated section.

(7) The configuration described in Embodiment 4 may be combined with the configurations described in Embodiments 7 and 9, such that the respective heat transfer sections of the two output terminal-side heat supply parts connect to a shared heated section.

(8) As a modification example of Embodiments 3 and 4 described above, the heated section may be disposed outside of the flexible substrate in the X-axis direction in a position overlapping with the flexible substrate in the Y-axis direction.

(9) The configurations (arrangement of heated section) described in Embodiments 3 and 4 can also be combined as appropriate with the configurations described in Embodiments 1 and 6 to 10.

(10) In Embodiment 5 described above, an example is shown in which the heat generating part of the heat supply part passes between the panel-side input terminals and the panel-side output terminals, but the present invention also includes configurations in which the heat generating part of the heat supply part passes the side of the panel-side output terminals opposite to the panel-side input terminals (the outer side).

(11) The configuration described in Embodiment 5 (the heat supply part constituted by the voltage receiving part and the heat generating part) can also be combined as appropriate with the configurations described in Embodiments 2 to 4 and 6 to 10.

(12) In the respective embodiments described above, an example is shown in which the heated sections (voltage receiving parts) of the heat supply part are provided in at least a pair so as to sandwich the driver mounting section from both sides in the lengthwise direction thereof, but a configuration is also possible in which a pair of heated sections (voltage receiving parts) are concentrated on a single side in the lengthwise direction of the driver mounting section and the heat transfer sections (heat generating parts) connected to the pair of heated sections (voltage receiving parts) are provided on the driver mounting section in a cuff-like manner, for example.

(13) In the respective embodiments described above, an example is shown in which the heated sections (voltage receiving parts) are arranged on the driver non-overlapping section of the array substrate, but it is also possible to arranged the heated sections (voltage receiving parts) on the driver mounting section. In such a case, it is preferable to arrange the heated sections (voltage receiving parts) on the surface of the driver mounting section opposite to the mounting surface of the driver. To connect the heat transfer section (heat generating part) to the heated section (voltage receiving part), through-holes can be formed in the glass substrate and the heat transfer section (heat generating part) can pass through the through-holes, or alternatively the heat transfer section (heat generating part) can be formed so as to pass along the periphery of the glass substrate, for example.

(14) The anisotropic conductive material, in addition to the film-shaped anisotropic conductive material, can be a paste-like anisotropic conductive material.

(15) In the respective embodiments described above, an example is shown in which the conductive particles included in the anisotropic conductive material include a core made of a metal material, but it also of course possible to use an anisotropic conductive material in which gold or the like is coated around a compound resin core and then conductive particles coated with an insulating membrane are included around this, for example.

(16) In the respective embodiments described above, an example is shown in which the curing temperature of the binder of the anisotropic conductive material is 100° C. to 120° C., but the curing temperature of the binder of the anisotropic conductive material may be a value that exceeds 120° C., or may be a value under 100° C.

(17) In the respective embodiments described above, an example is shown in which the array substrate is made of glass, but the array substrate can be made of a compound resin instead. In such a case, the binder of the anisotropic conductive material preferably has a relatively low temperature range for the curing temperature, such as 100° C. to 120° C.

(18) In the respective embodiments described above, an example is shown in which the component is a lengthwise driver, but the component can alternatively be a driver that is square-shaped in a plan view, for example.

(19) In the respective embodiments described above, examples are shown of an array substrate included in a transmissive liquid crystal display device having a backlight device as an external light source, a method of manufacturing this array substrate, and a driver mounting device for mounting a driver on this array substrate, but the present invention is also applicable to an array substrate included in a reflective liquid crystal display device that uses ambient light for display, a method of manufacturing this array substrate, and a driver mounting device for mounting a driver on this array substrate.

(20) In the respective embodiments described above, TFTs were used as the switching devices of the liquid crystal display device, but the present invention is also applicable to an array substrate included in a liquid crystal display device that uses switching devices other than TFTs (such as thin film diodes (TFDs), a method of manufacturing this array substrate, and a driver mounting device for mounting a driver on this array substrate, and in addition to liquid crystal display devices that display color, the present invention is also applicable to an array substrate included in a liquid crystal display device that performs black/white display, a method of manufacturing this array substrate, and a driver mounting device for mounting a driver on this array substrate.

(21) In the respective embodiments described above, examples are shown of an array substrate included in a liquid crystal display device that uses a liquid crystal panel as the display device, a method of manufacturing this array substrate, and a driver mounting device for mounting a driver on this array substrate, but the present invention is also applicable to an array substrate included in a display device that uses a different type of display panel (such as PDP or organic EL panels), a method of manufacturing this array substrate, and a driver mounting device for mounting a driver on this array substrate.

DESCRIPTION OF REFERENCE CHARACTERS

11*b*, 111*b*, 211*b*, 311*b*, 411*b*, 511*b*, 611*b*, 811*b* array substrate (mounting substrate)
11*g* polarizing plate (optical member)
21, 121, 321, 421, 521, 621, 721, 821, 921 driver (component)
23, 123, 223, 523, 923 panel-side input terminal (input terminal, first terminal)
23G, 123G, 323G, 923G panel-side input terminal group (input terminal group, first terminal group)
24, 124, 224, 324, 524, 624, 724, 824, 924 panel-side output terminal (output terminal, second terminal)
24G, 124G, 324G, 524G, 724G, 924G panel-side output terminal group (output terminal group, second terminal group)
27 anisotropic conductive material
27*a* conductive particle
27*b* binder
28, 128, 228, 328, 428, 928 heat supply part
29, 129, 229, 329, 529, 629, 829 heated section
30, 130, 230, 530, 630, 730, 830, 930 heat transfer section
31, 231, 631, 731, 831 input terminal-side heat supply part
32, 232, 332, 532, 732, 832 output terminal-side heat supply part
33 voltage receiving part
34 heat-generating unit
40 driver mounting device (manufacturing device)
42 pressurizing unit
43 substrate support section
44, 144, 344, 644, 844 heating unit
45, 245 input terminal-side heating unit (heating unit)
46, 246, 346 output terminal side heating unit (heating unit)
47 voltage receiving part
332A first output terminal-side heat supply part (inner heat supply part)
332B second output terminal-side heat supply part (outer heat supply part)
346A first output terminal-side heating unit (heating unit)
346B second output terminal-side heating unit (heating unit)
GS glass substrate (substrate)
GSs1 driver mounting section (component mounting section)
GSs2 driver non-overlapping section (component non-overlapping section)

What is claimed is:

1. A mounting substrate, comprising:
   a component having a plurality of component-side output and input terminals thereon;
   a substrate having a component mounting section where the component is mounted;
   an anisotropic conductive material interposed between and electrically connecting the component and the component mounting section of the substrate, the anisotropic conductive material including at least a binder made of a thermosetting resin and conductive particles contained in the binder;
   a heat supply pattern made of a heat conductive material and provided on the substrate in at least the component mounting section of the substrate, said heat supply pattern supplying heat to the anisotropic conductive material; and
   a plurality of substrate-side input and output terminals in the component mounting section on the substrate, respectively connected to the plurality of component-side output and input terminals on the component,
   wherein said heat supply pattern is not electrically connected to any of the plurality of substrate-side input and output terminals.

2. The mounting substrate according to claim 1, wherein the heat supply pattern comprises:
   a heated section heated from outside and provided on a component non-overlapping section of the substrate not overlapping the component in a plan view; and
   a heat transfer section transferring heat from the heated section to the anisotropic conductive material and provided on at least the component mounting section of the substrate, which is a portion of the substrate overlapping the component in a plan view.

3. The mounting substrate according to claim 2, wherein the heat transfer section of the heat supply pattern extends across the component mounting section, whereas the heated section of the heat supply pattern is provided in a pair respectively continuing from both ends of the heat transfer section in an extension direction of the heat transfer section.

4. The mounting substrate according to claim 2,
wherein an optical member is attached to the substrate along a surface of the substrate and adjacent to the component mounting section in a direction orthogonal to an extension direction of the heat transfer section extending across the component mounting section of the substrate, and
wherein the heat transfer section of the heat supply pattern is drawn out from the component mounting section towards the component non-overlapping section opposite to the optical member in the direction orthogonal to the extension direction of the heat transfer section, whereas the heated section of the heat supply pattern continues from a drawn-out end of the heat transfer section and is arranged on a side on the component non-overlapping section opposite to the optical member with respect to the component mounting section in the direction orthogonal to the extension direction.

5. The mounting substrate according to claim 1, wherein the heat supply pattern comprises:
a voltage receiving pattern receiving a voltage from outside and provided on a component non-overlapping section of the substrate not overlapping the component in a plan view; and
a heat generating pattern generating heat based on the voltage received by the voltage receiving pattern and provided on at least the component mounting section of the substrate, which is a portion of the substrate overlapping the component in a plan view.

6. The mounting substrate according to claim 1,
wherein the component mounting section includes a first terminal group comprising a plurality of first terminals arranged side-by-side, and a second terminal group comprising a plurality of second terminals arranged side-by-side parallel to an arrangement direction of the plurality of first terminals and having a total area greater than a total area of the first terminal group, and
wherein the heat supply pattern includes at least a pattern closer to the second terminal group than the first terminal group.

7. The mounting substrate according to claim 6, wherein the heated supply pattern at least includes an inner heat supply pattern that passes between the second terminal group and the first terminal group on an inner side of the second terminal group, and an outer heat supply pattern that sandwiches the second terminal group on an outer side of the second terminal group with the inner heat supply pattern.

8. The mounting substrate according to claim 6, wherein the first terminal group is an input terminal group receiving input signals for the component, whereas the second terminal group is an output terminal group receiving output signals from the component.

9. The mounting substrate according to claim 1,
wherein the component mounting section includes input terminals receiving input signals for the component, and output terminals separated from the input terminals and receiving output signals from the component, and
wherein the heat supply pattern passes between at least the input terminals and the output terminals on the component mounting section.

10. The mounting substrate according to claim 1,
wherein the component mounting section includes input terminals receiving input signals for the component, and output terminals separated from the input terminals and receiving output signals from the component, and
wherein the heat supply pattern at least includes an input terminal-side heat supply pattern disposed relatively near the input terminals, and an output terminal-side heat supply pattern disposed relatively near the output terminals.

11. The mounting substrate according to claim 1, wherein the heat supply pattern is made of a material having a higher thermal conductivity than a thermal conductivity of the substrate.

12. The mounting substrate according to claim 1, wherein the component mounting section includes input terminals receiving input signals for the component, and output terminals receiving output signals from the component, and
wherein the heat supply pattern is made of a same material as the input terminals and the output terminals.

* * * * *